United States Patent
Lee et al.

(10) Patent No.: US 12,356,664 B2
(45) Date of Patent: Jul. 8, 2025

(54) DEVICE AND METHOD OF FABRICATING MULTIGATE DEVICES HAVING DIFFERENT CHANNEL CONFIGURATIONS

(71) Applicant: Taiwan Semiconductor Manufacturing Co., Ltd., Hsinchu (TW)

(72) Inventors: Tsung-Lin Lee, Hsinchu (TW); Choh Fei Yeap, Hsinchu (TW); Da-Wen Lin, Taipei (TW); Chih Yeh, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 763 days.

(21) Appl. No.: 17/465,300

(22) Filed: Sep. 2, 2021

(65) Prior Publication Data

US 2022/0238678 A1    Jul. 28, 2022

Related U.S. Application Data

(60) Provisional application No. 63/199,841, filed on Jan. 28, 2021.

(51) Int. Cl.
*H10D 30/67* (2025.01)
*H10D 30/01* (2025.01)
*H10D 62/10* (2025.01)
*H10D 84/01* (2025.01)
*H10D 84/03* (2025.01)

(52) U.S. Cl.
CPC ....... *H10D 30/6735* (2025.01); *H10D 30/031* (2025.01); *H10D 30/6713* (2025.01); *H10D 30/6757* (2025.01); *H10D 62/118* (2025.01); *H10D 84/0128* (2025.01); *H10D 84/013* (2025.01); *H10D 84/038* (2025.01)

(58) Field of Classification Search
CPC .. H01L 29/42392; H01L 29/0665–068; H10D 30/6735; H10D 62/118–123
See application file for complete search history.

(56) References Cited

U.S. PATENT DOCUMENTS

| | | | |
|---|---|---|---|
| 7,612,638 B2 | 11/2009 | Chung et al. | |
| 10,236,362 B2 * | 3/2019 | Seo | H01L 21/30604 |
| 2007/0274654 A1 | 11/2007 | Choudhury et al. | |
| 2015/0235940 A1 | 8/2015 | Chen et al. | |
| 2016/0077293 A1 | 3/2016 | Jou et al. | |
| 2016/0087059 A1 | 3/2016 | Hsieh | |
| 2016/0190312 A1 | 6/2016 | Zhang et al. | |

(Continued)

FOREIGN PATENT DOCUMENTS

TW    202020993 A    6/2020
TW    202036917 A    10/2020

*Primary Examiner* — Amar Movva
(74) *Attorney, Agent, or Firm* — Haynes and Boone, LLP

(57) ABSTRACT

Methods include providing a first fin structure and a second fin structure each extending from a substrate. A first gate-all-around (GAA) transistor is formed on the first fin structure; the first GAA transistor has a channel region within a first plurality of nanostructures. A second GAA transistor is formed on the second fin structure; the second GAA transistor has a second channel region configuration. The second GAA transistor has a channel region within a second plurality of nanostructures. The second plurality of nanostructures is less than the first plurality of nanostructures.

20 Claims, 56 Drawing Sheets

(56) References Cited

U.S. PATENT DOCUMENTS

2018/0358435 A1* 12/2018 Mochizuki .......... H01L 29/0673
2020/0066839 A1*  2/2020 Zhang ................ H01L 29/0847
2020/0312658 A1  10/2020 Miura

* cited by examiner

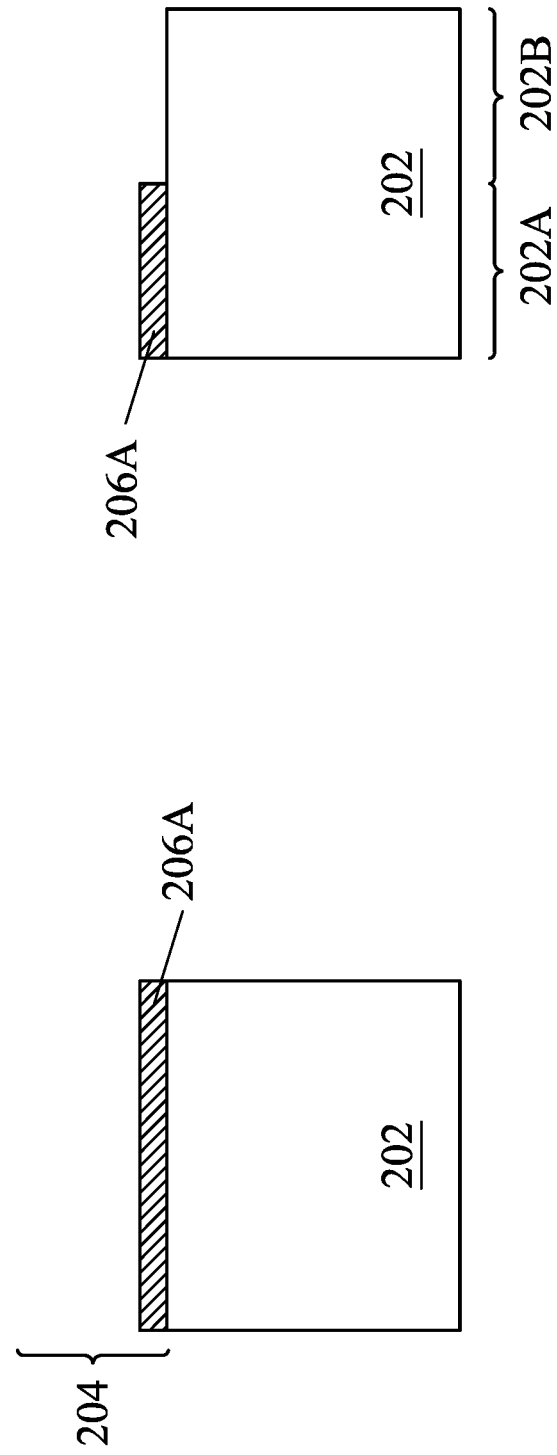

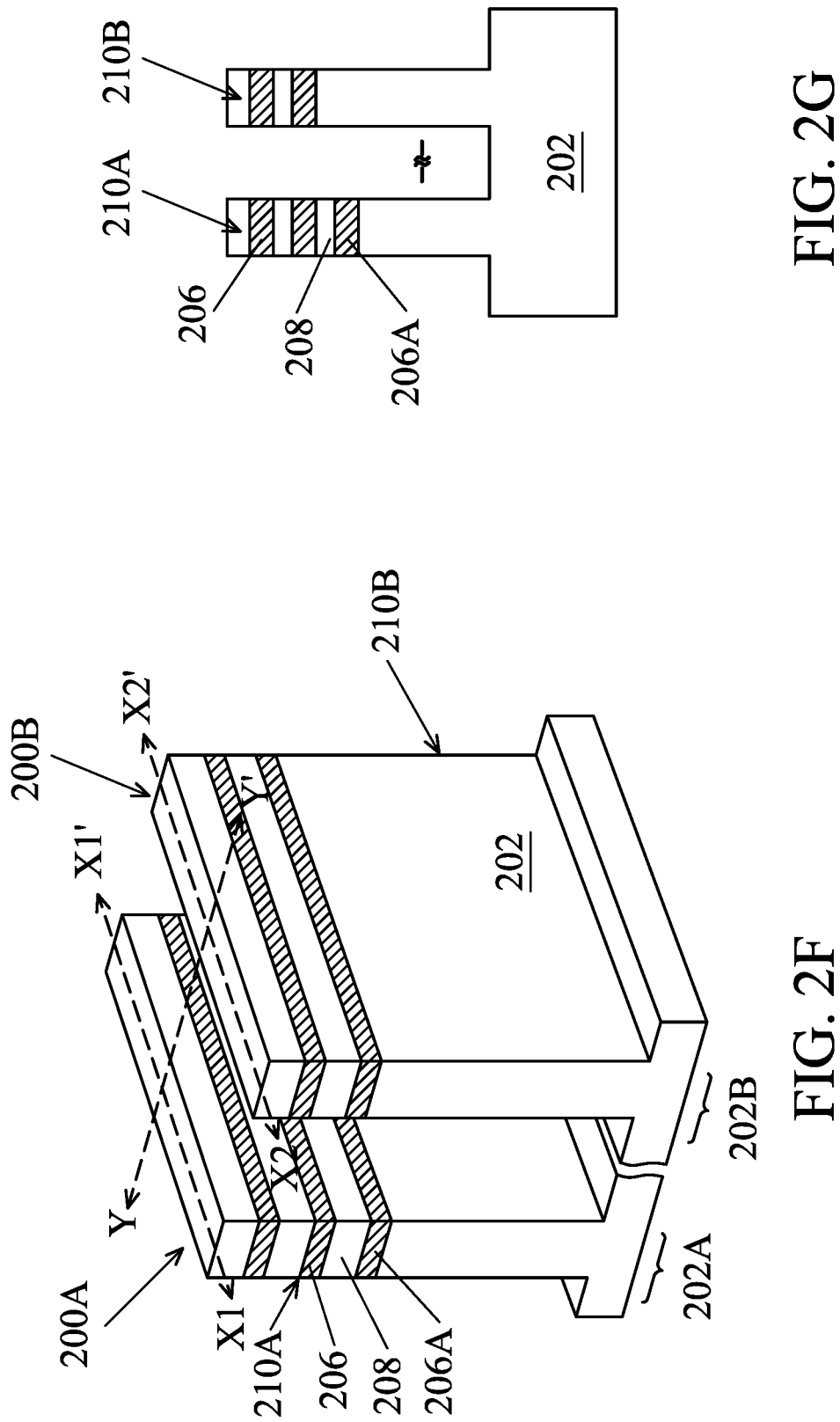

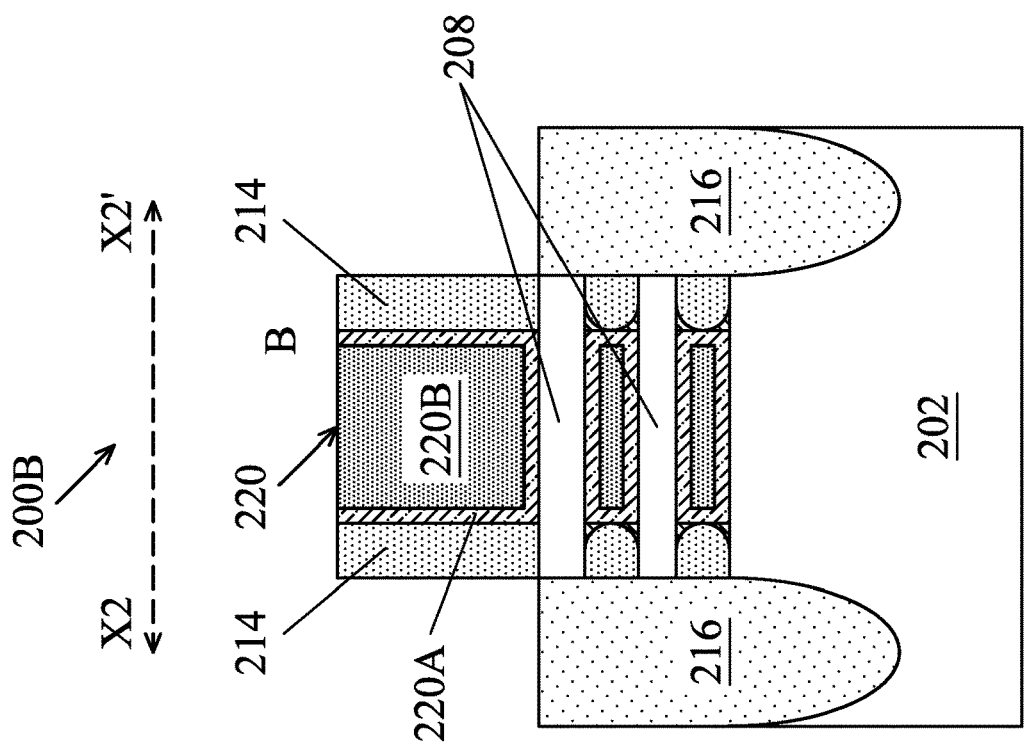
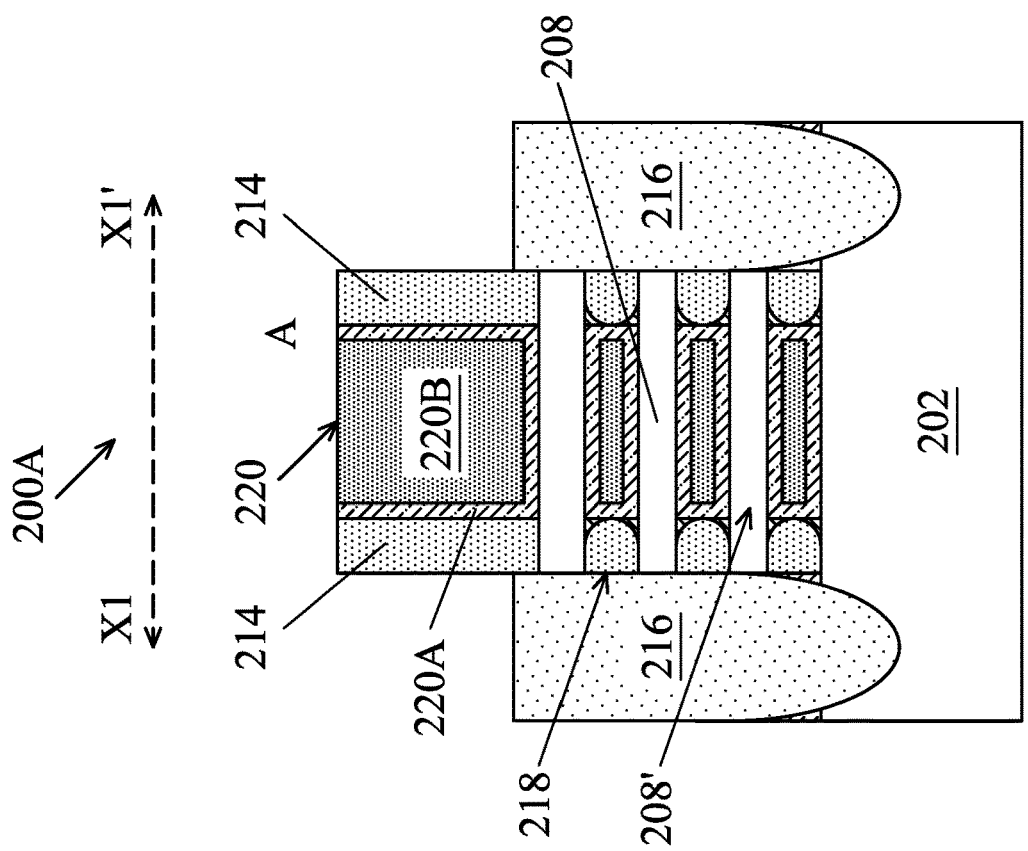
FIG. 2K
FIG. 2J

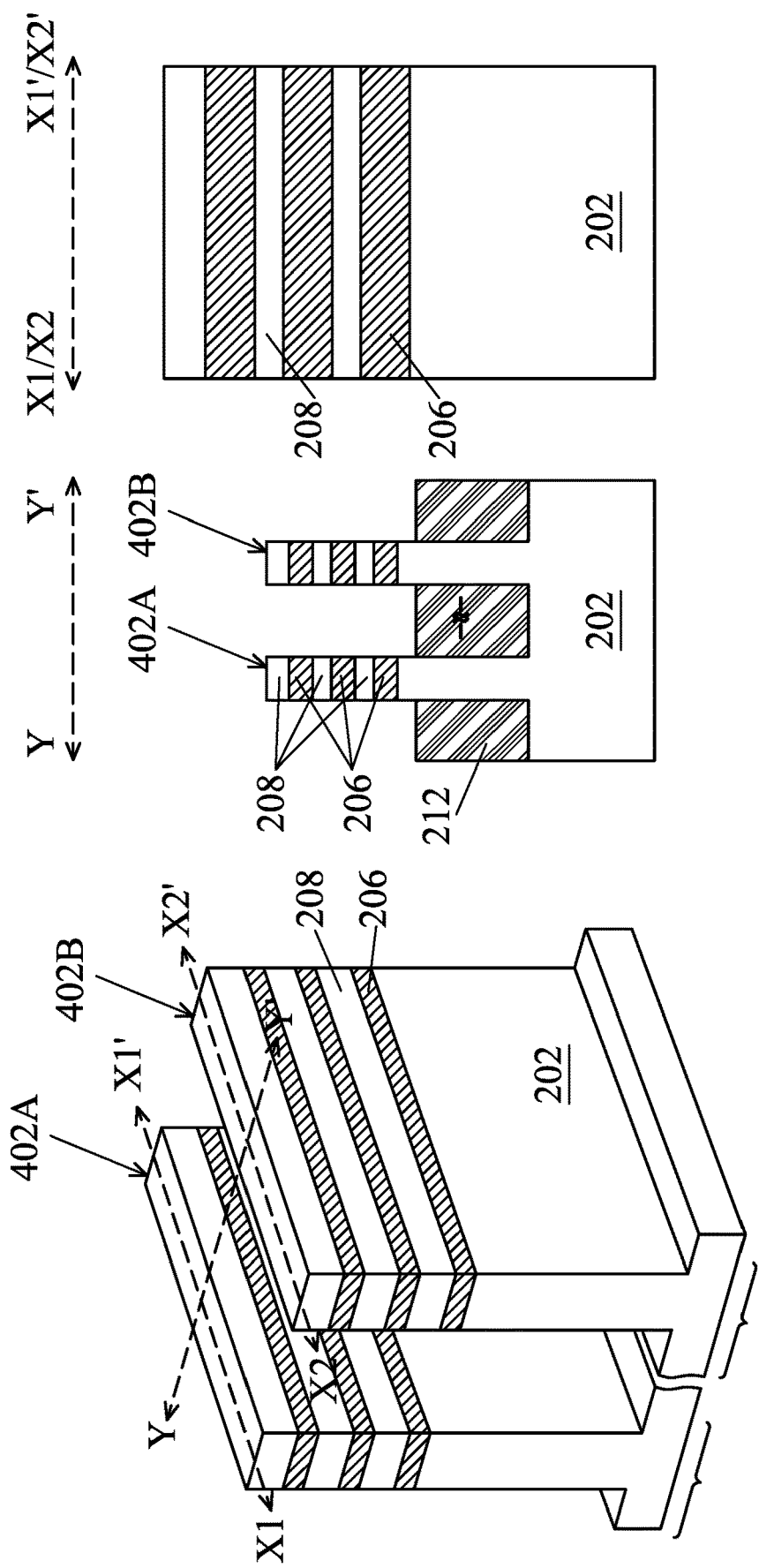

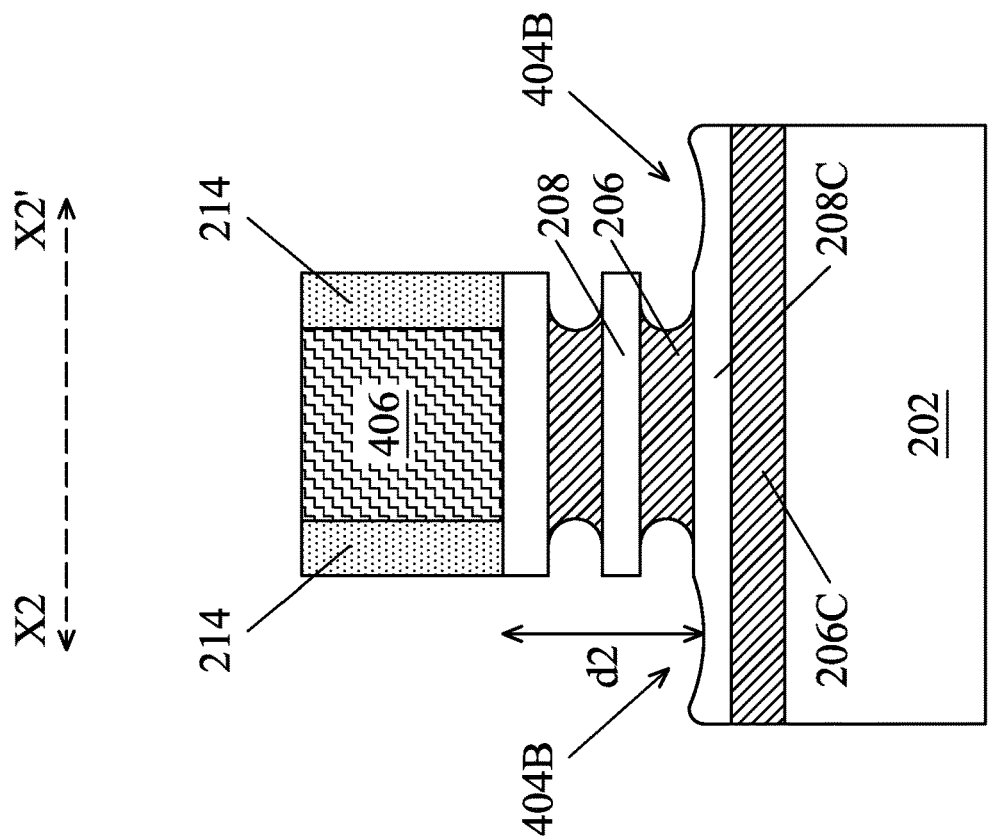
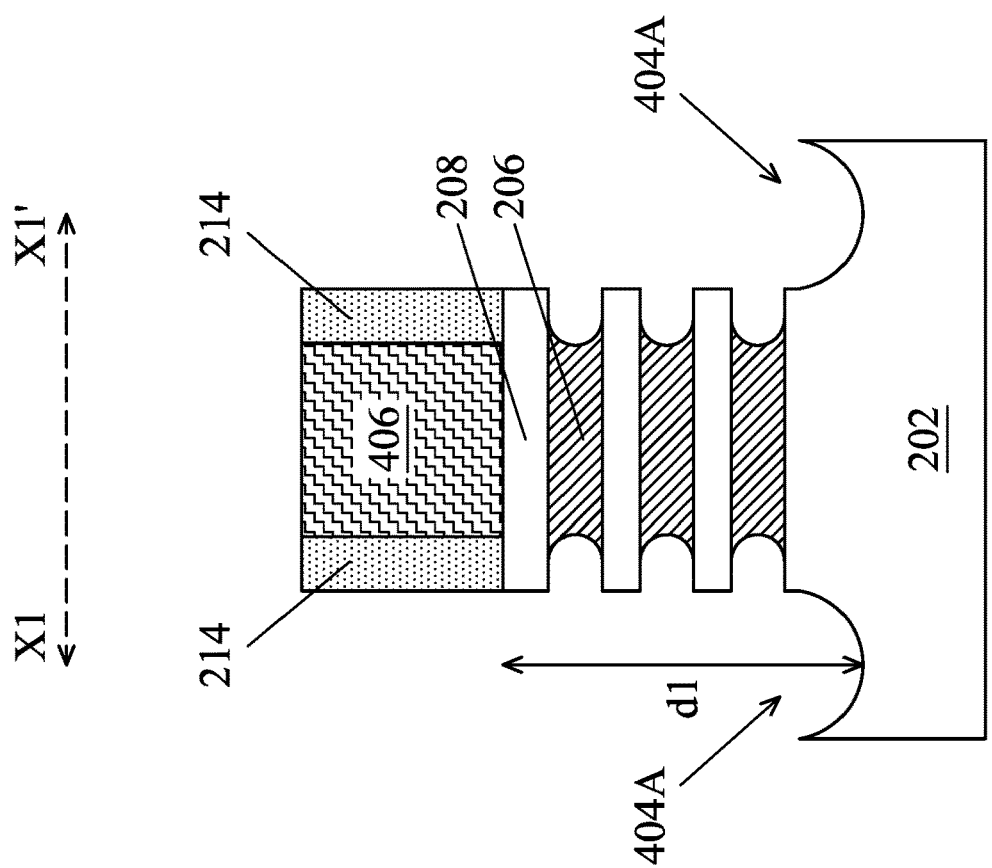
FIG. 4E
FIG. 4D

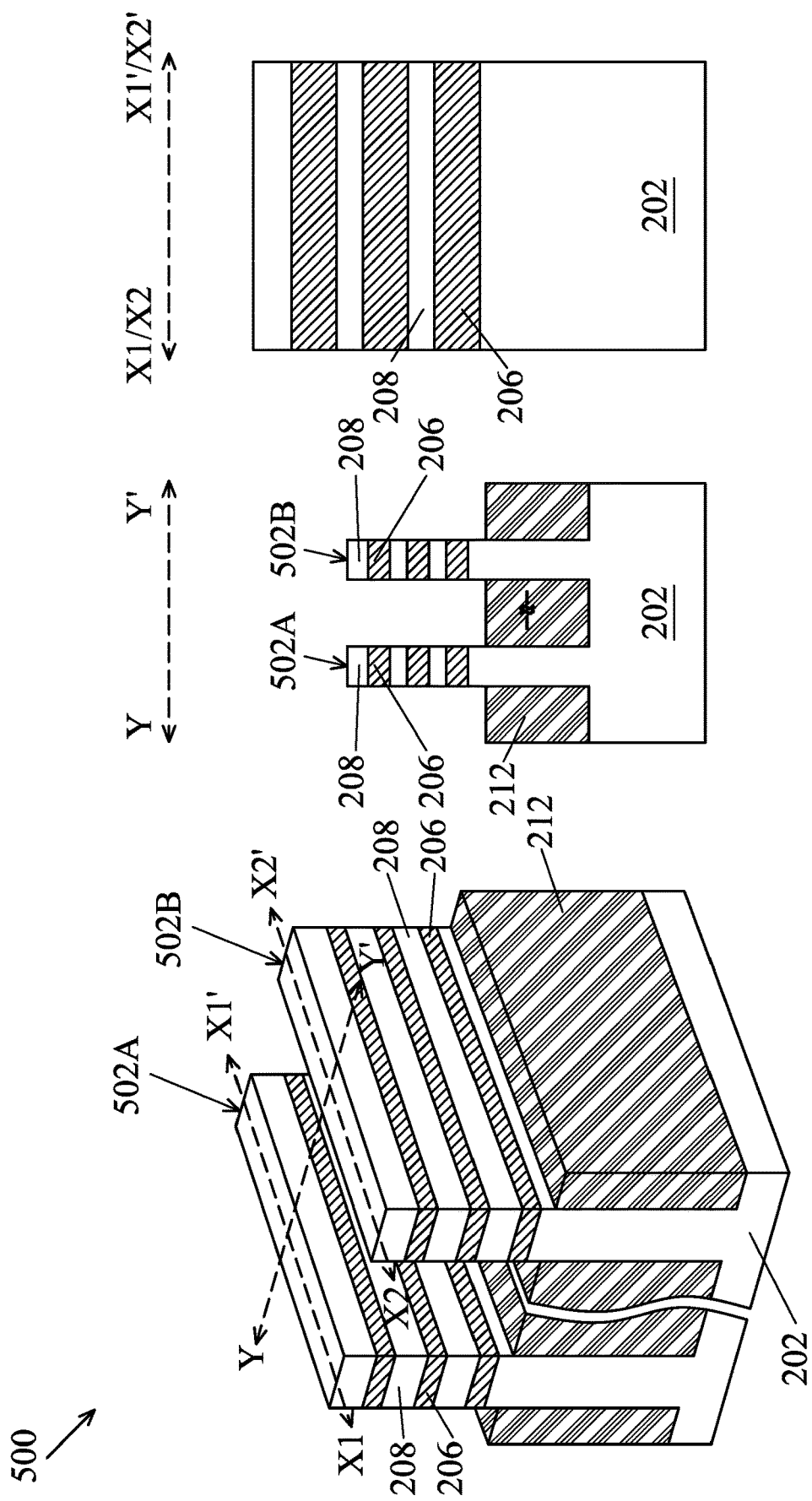

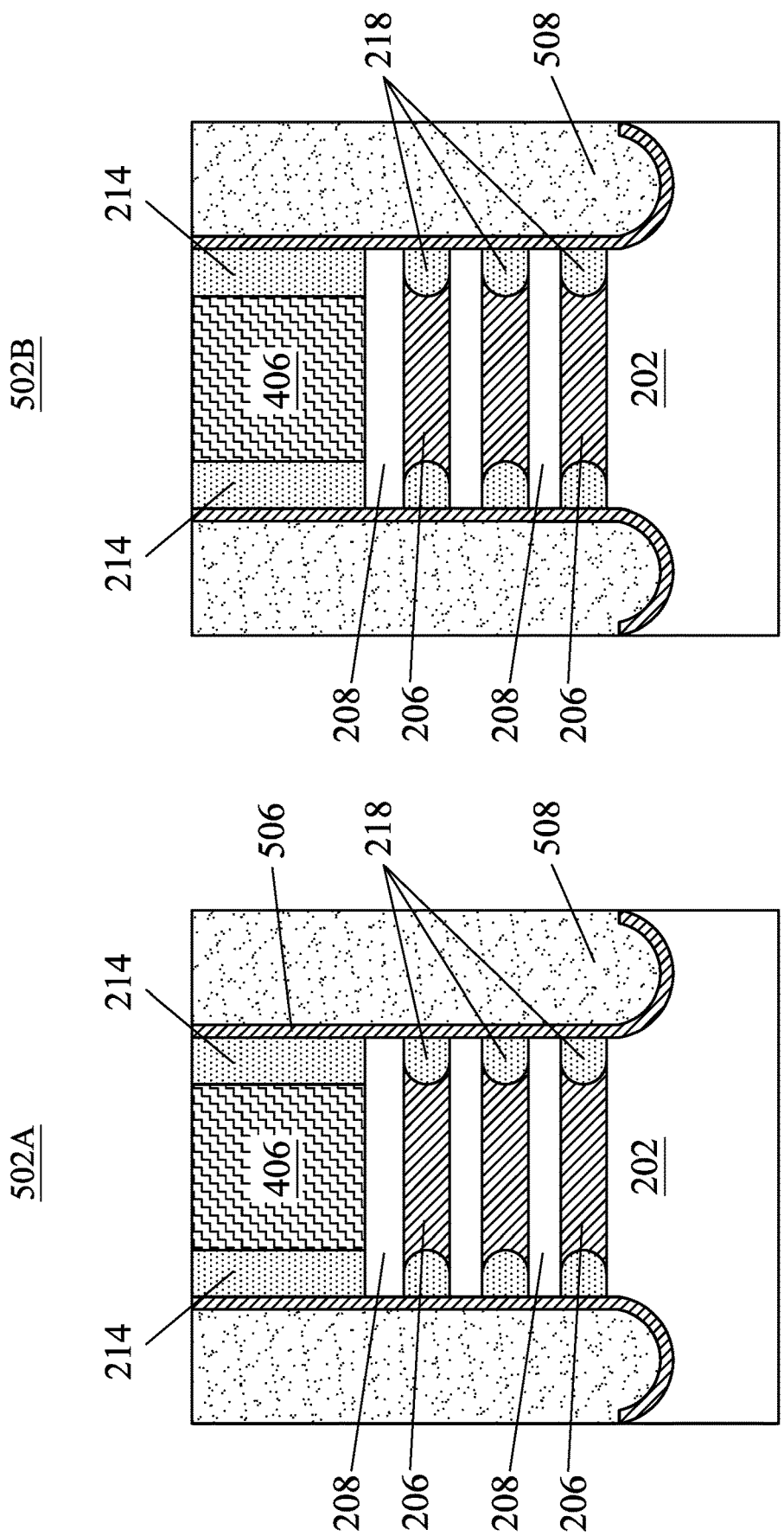

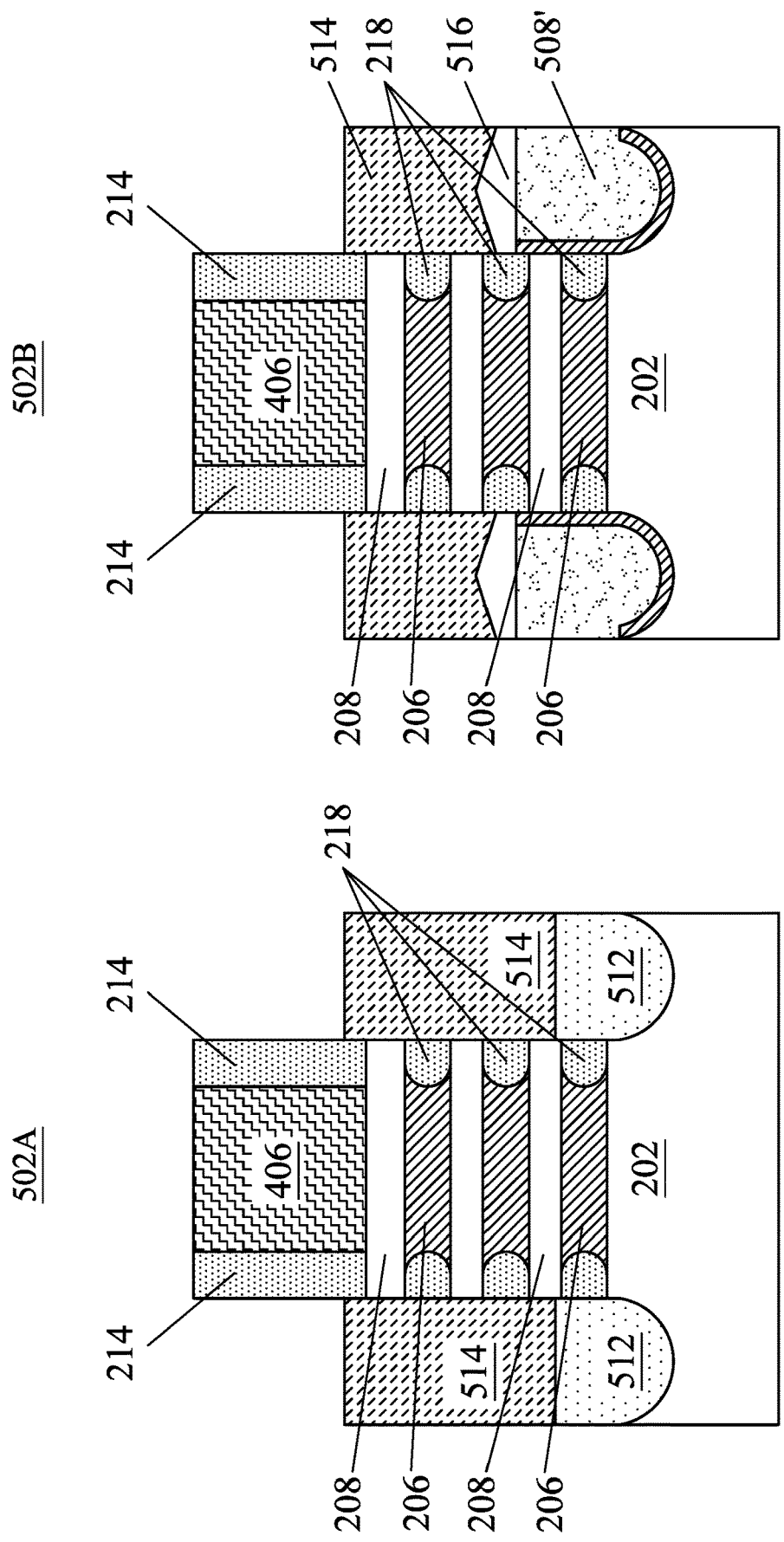

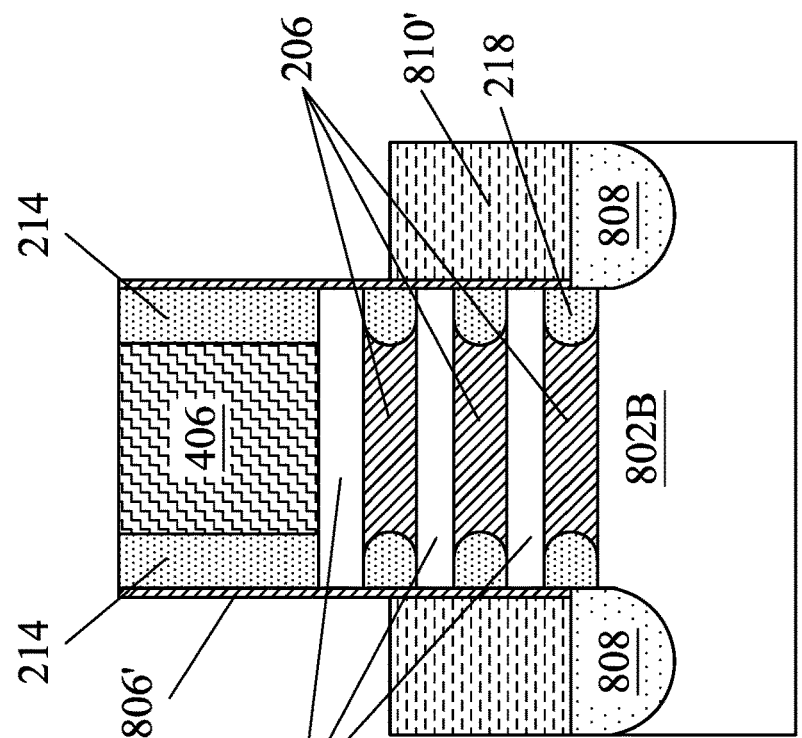
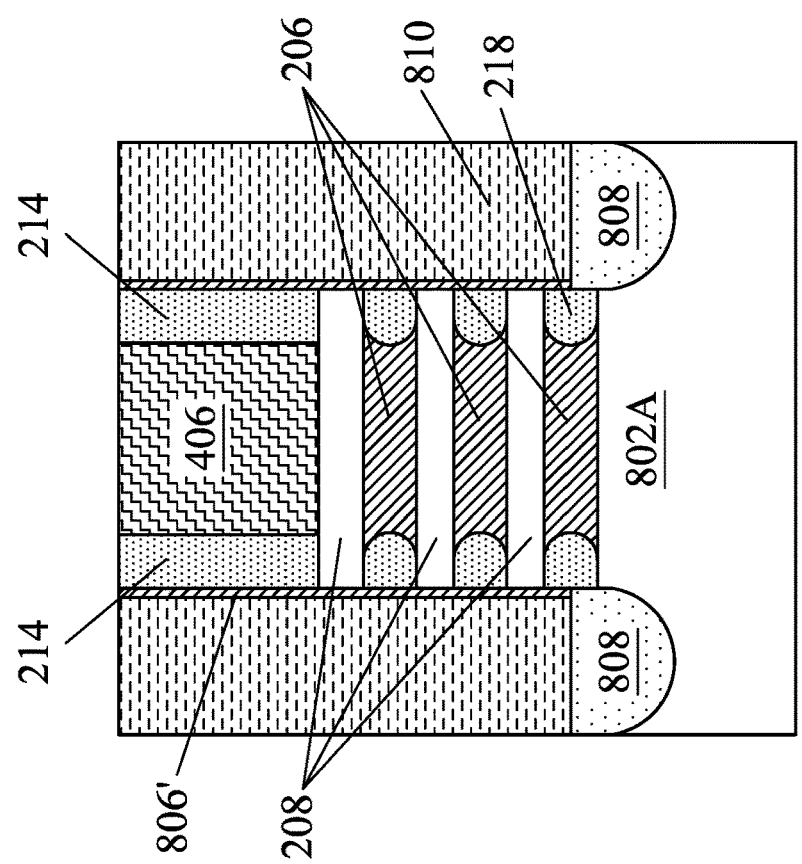
FIG. 8I
FIG. 8H

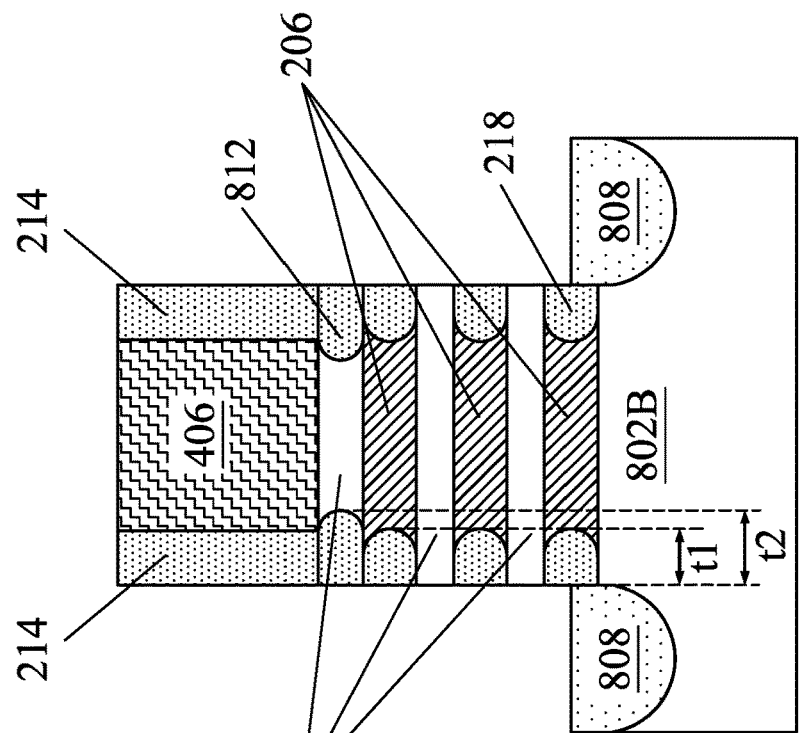
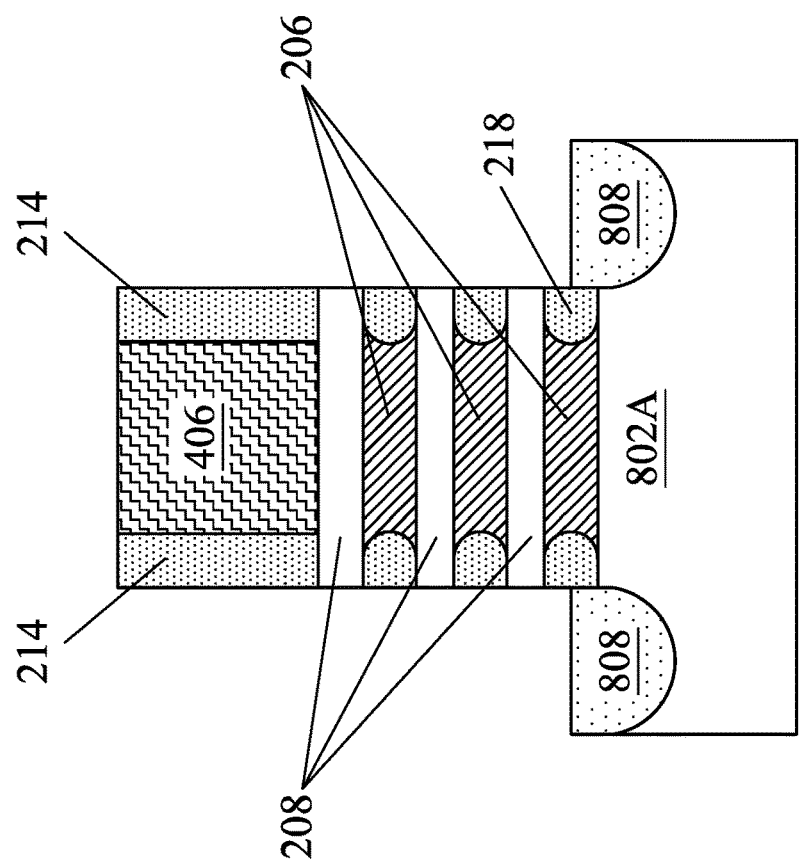
FIG. 8M
FIG. 8L

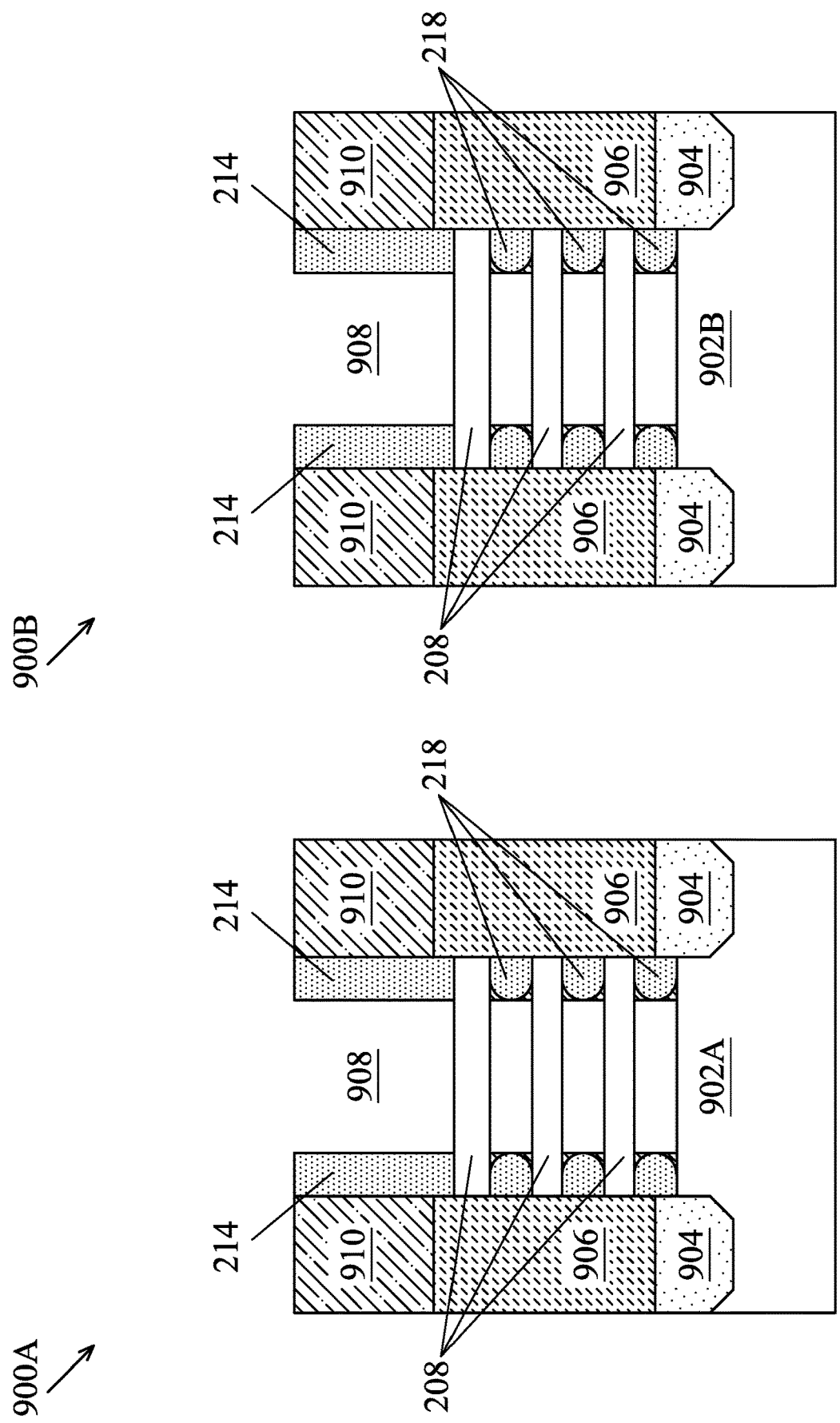

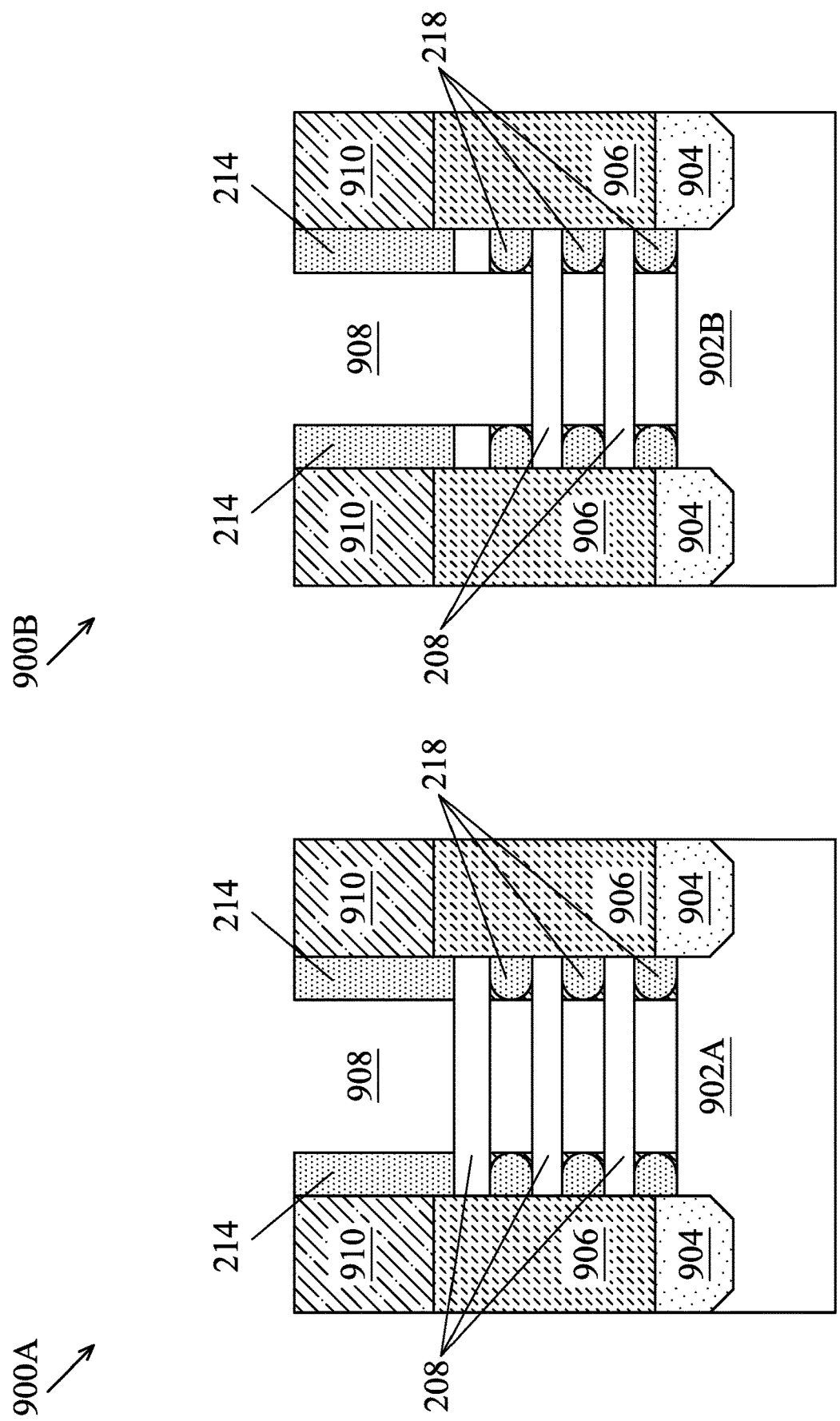

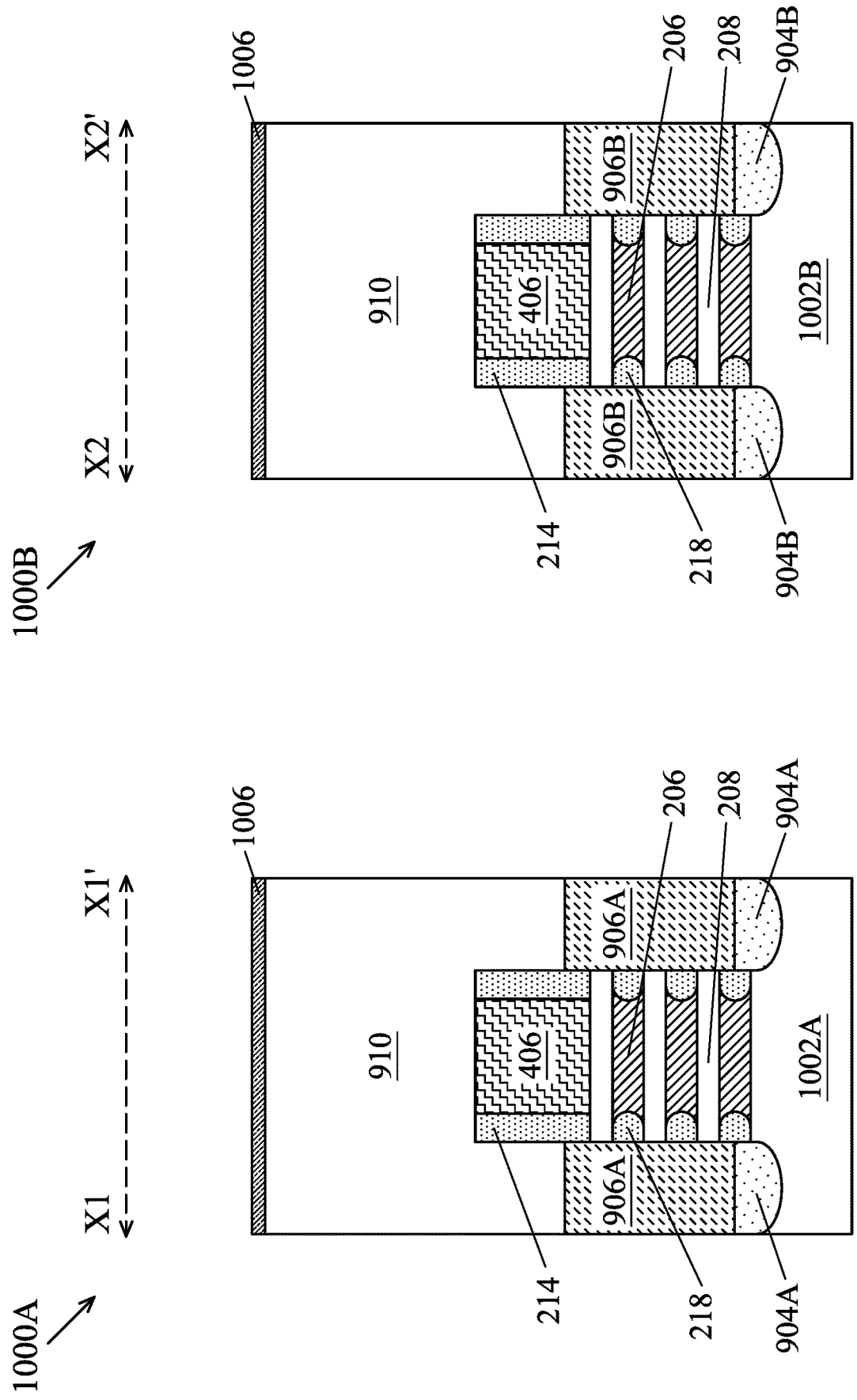

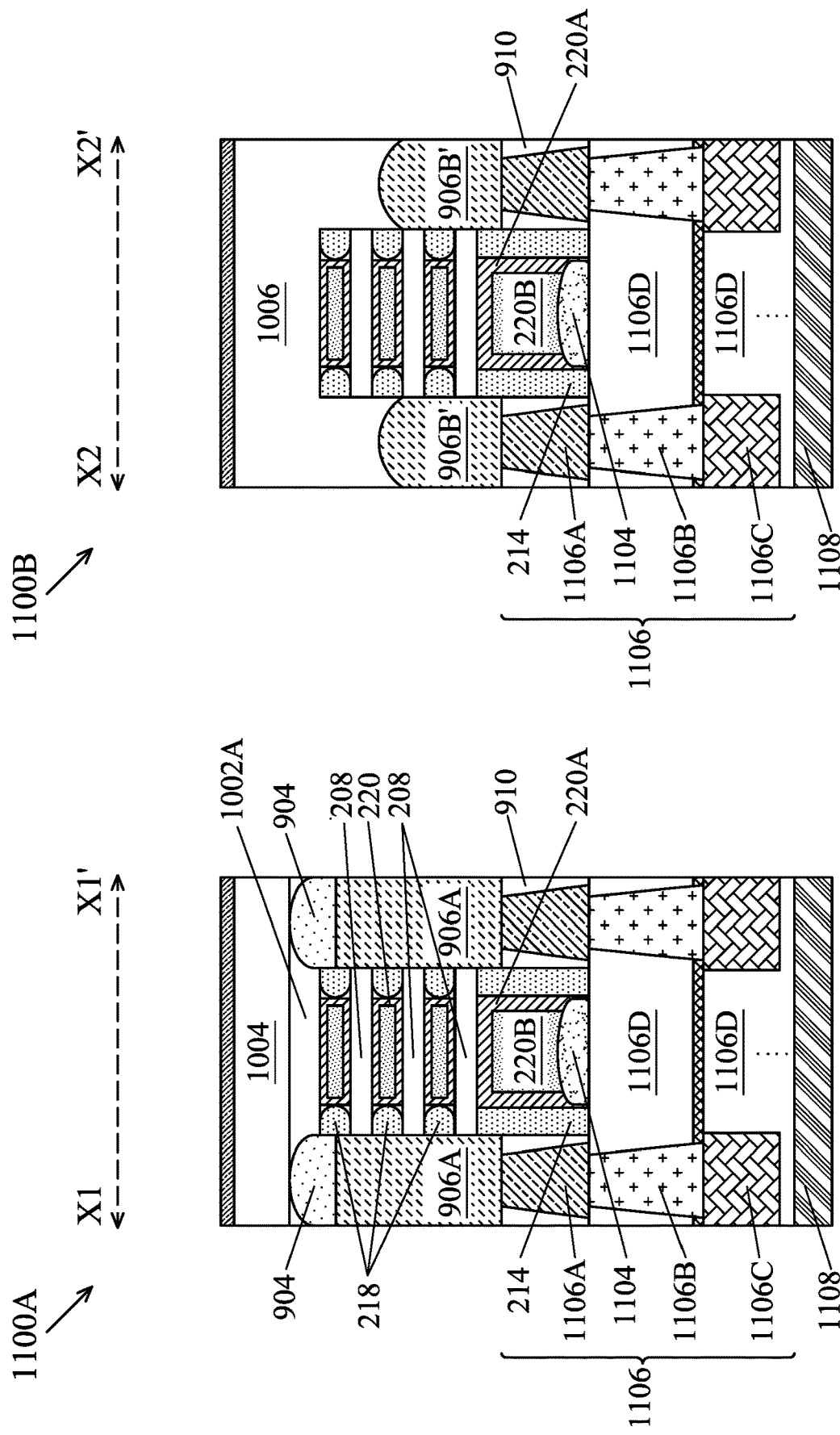

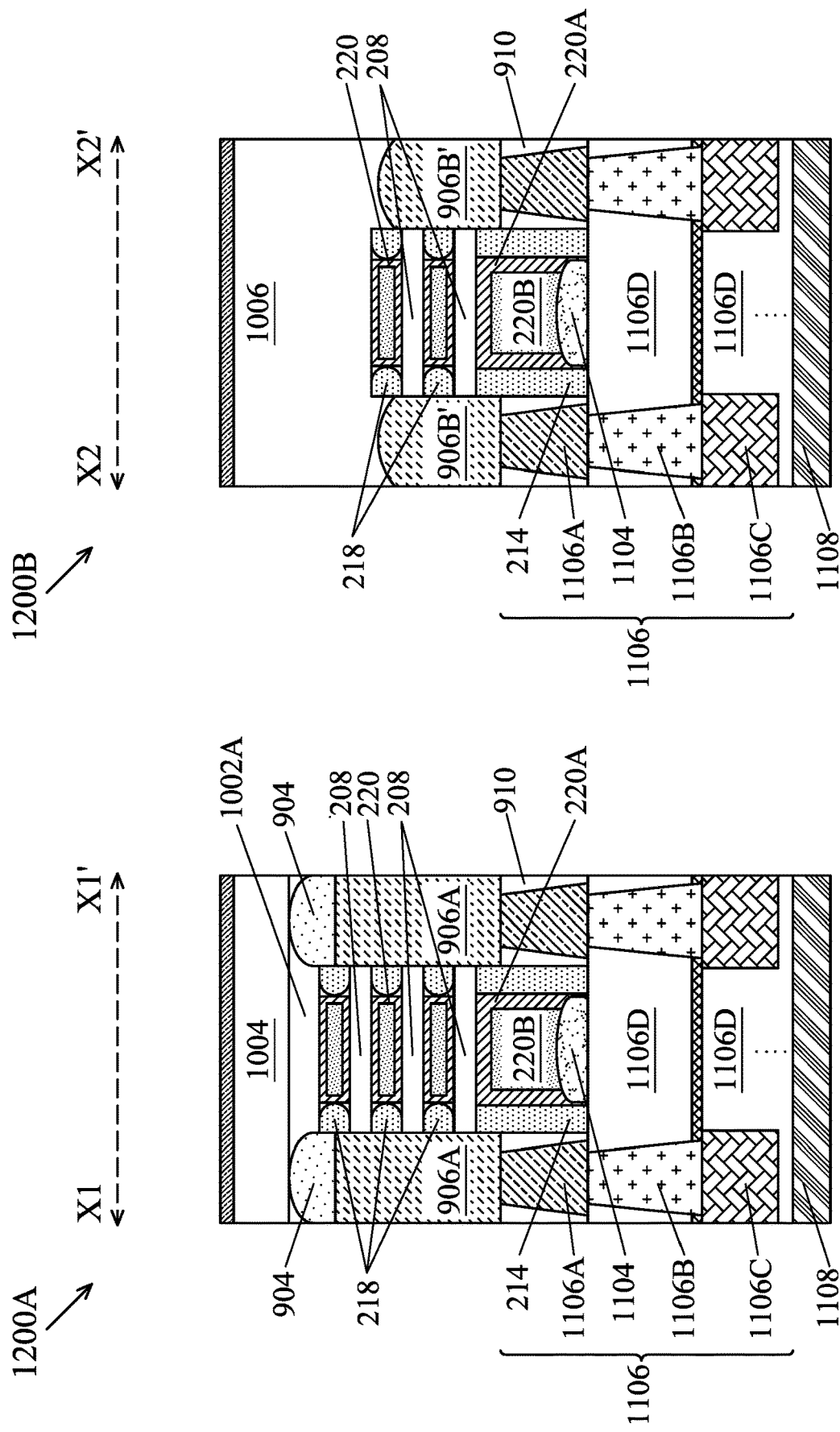

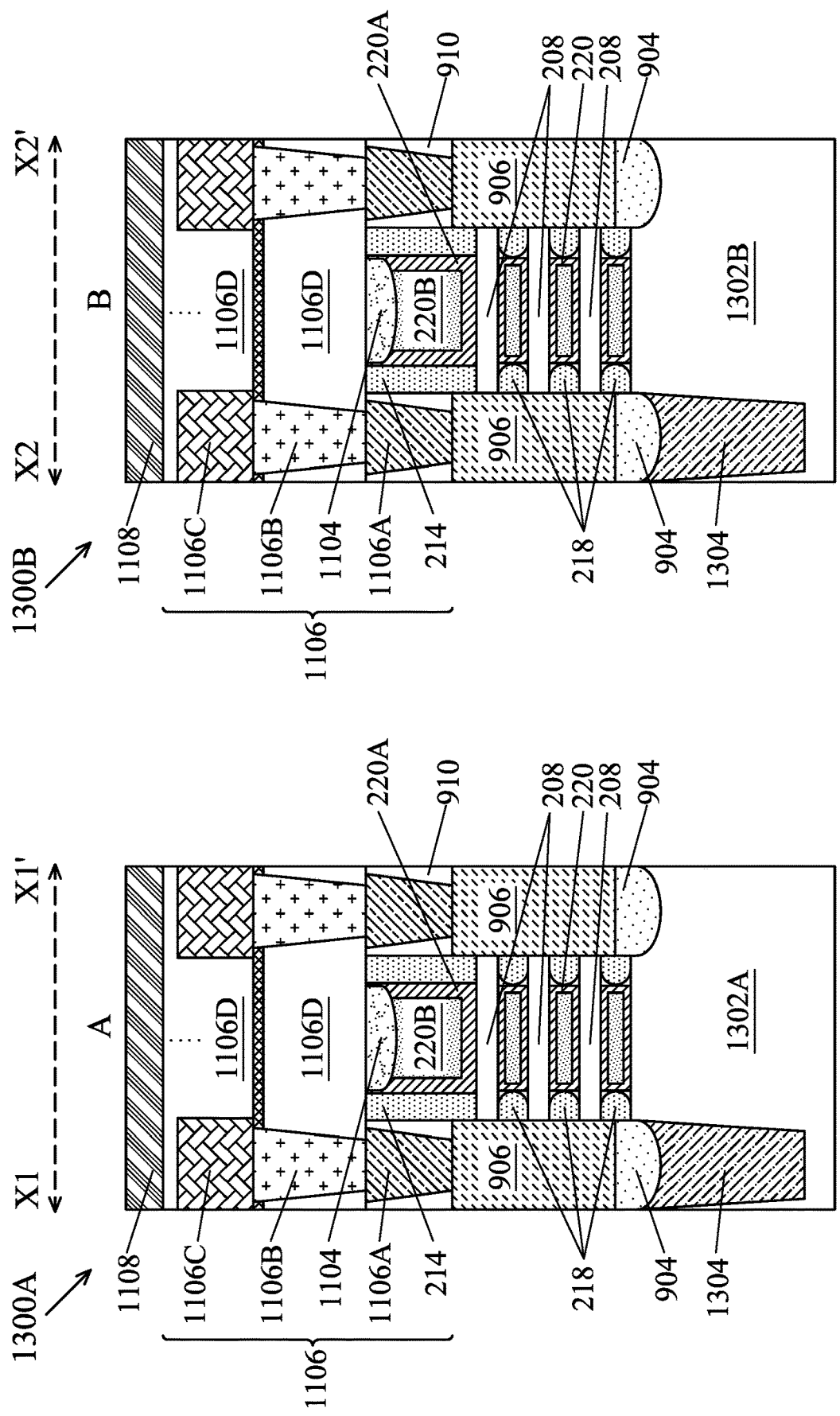

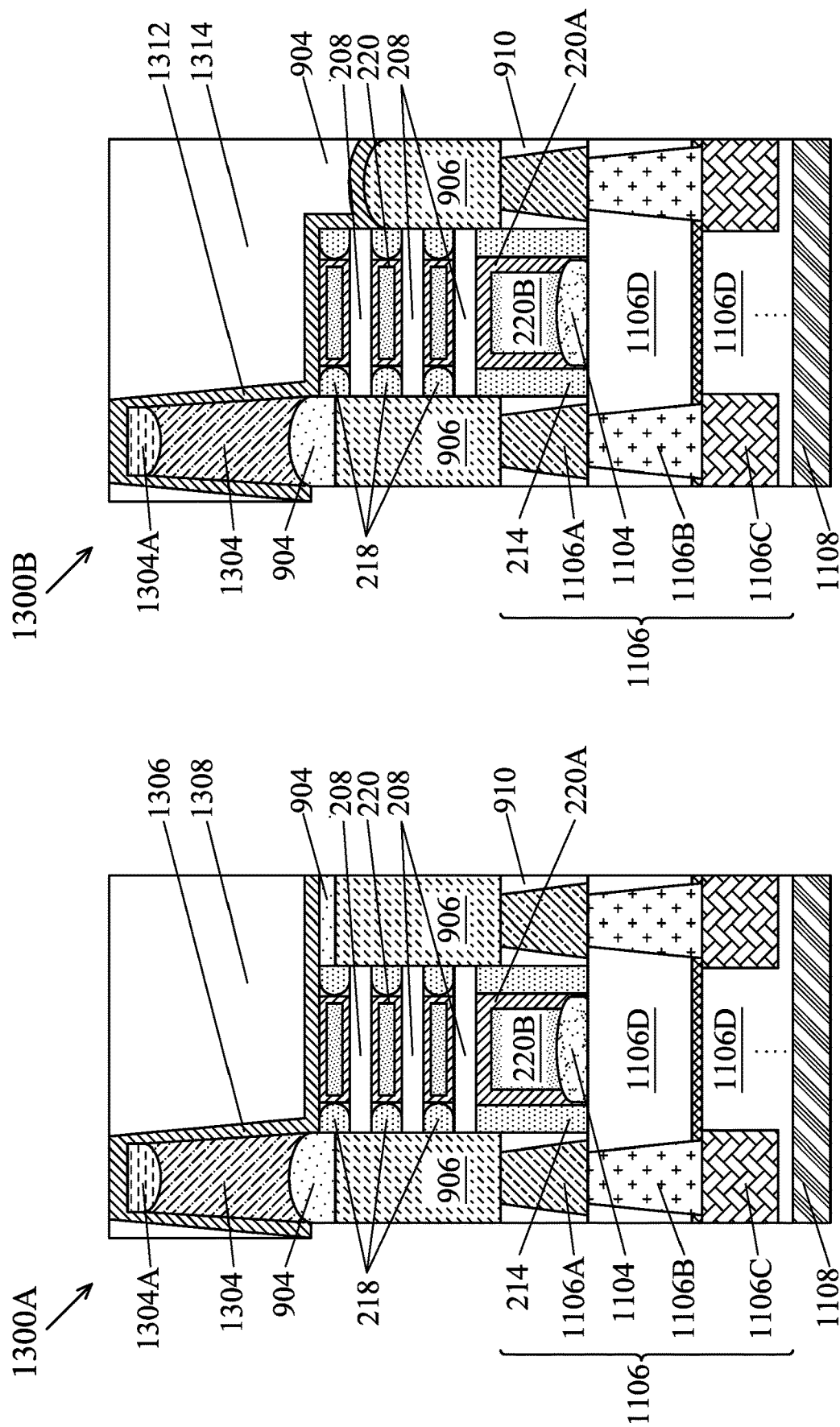

DEVICE AND METHOD OF FABRICATING MULTIGATE DEVICES HAVING DIFFERENT CHANNEL CONFIGURATIONS

CROSS-REFERENCE TO RELATED APPLICATIONS

The present application claims priority to Provisional Application Ser. No. 63/199,841, filed Jan. 28, 2021, hereby incorporated by reference in its entirety.

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

Recently, multigate devices have been introduced to improve gate control. Multigate devices have been observed to increase gate-channel coupling, reduce OFF-state current, and/or reduce short-channel effects (SCEs). One such multigate device is the gate-all around (GAA) device, which includes a gate structure that can extend, partially or fully, around a channel region to provide access to the channel region on at least two sides. GAA devices enable aggressive scaling down of IC technologies, maintaining gate control and mitigating SCEs, while seamlessly integrating with conventional IC manufacturing processes. Certain devices may have a different channel configuration to provide for differing performance or differing circuit applications. Providing these differing configurations implemented into IC manufacturing processes may raise challenges in integration. Accordingly, although existing GAA devices and methods for fabricating such have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-2K are fragmentary diagrammatic views of a multigate device, in portion or entirety, at various fabrication stages according to various aspects of the present disclosure;

FIGS. 4A-4G are fragmentary diagrammatic views of another multigate device, in portion or entirety, at various fabrication stages according to various aspects of the present disclosure including manipulating the source/drain depth of a device;

FIGS. 9A-9H are fragmentary diagrammatic views of another multigate device, in portion or entirety, at various fabrication stages according to various aspects of the present disclosure including removing at least a portion of an upper channel region;

FIGS. 10A-10F are fragmentary diagrammatic views of another multigate device, in portion or entirety, at various fabrication stages according to various aspects of the present disclosure including configuring a lower channel region through backside processing;

FIGS. 11A-11F are fragmentary diagrammatic views of another multigate device, in portion or entirety, at various fabrication stages according to various aspects of the present disclosure including another method of configuring a lower channel region through backside processing;

FIGS. 12A-12B are fragmentary diagrammatic views of another multigate device, in portion or entirety, at various fabrication stages according to various aspects of the present disclosure including another method of configuring a lower channel region through backside processing.

DETAILED DESCRIPTION

Figure 1:
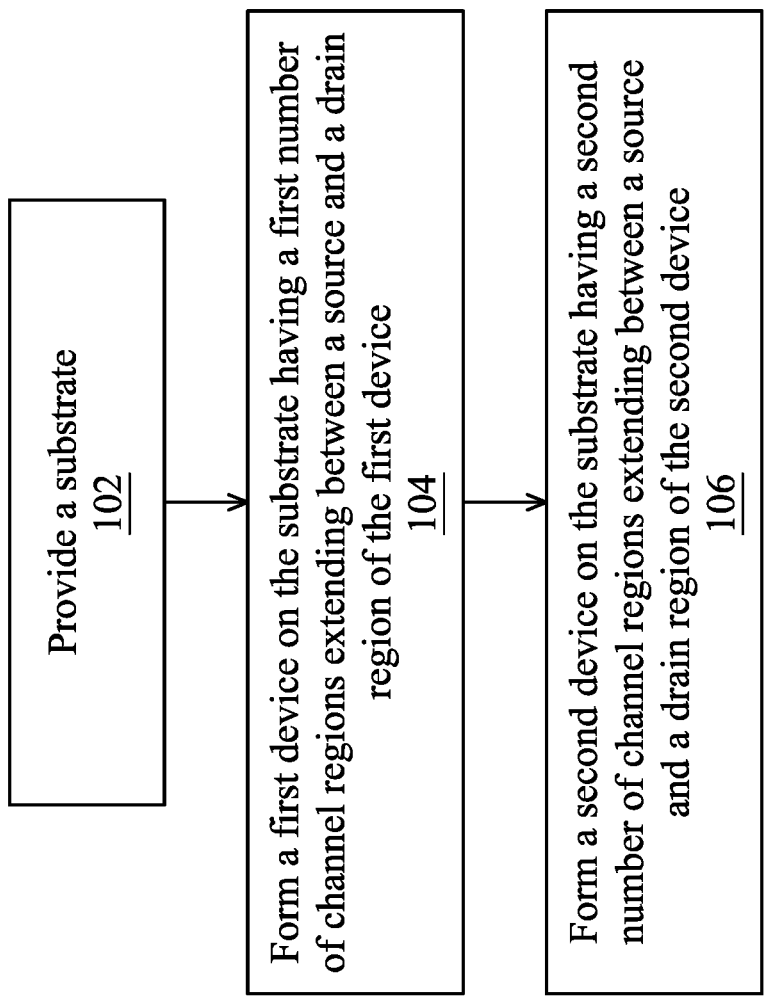
FIG. 1 is a flow chart of a method for fabricating a multigate device according to various aspects of the present disclosure.

The present disclosure relates generally to integrated circuit devices, and more particularly, to multigate devices, such as gate-all-around (GAA) devices.

The following disclosure provides many different embodiments, or examples, for implementing different features. Reference numerals and/or letters may be repeated in the various examples described herein. This repetition is for the purpose of simplicity and clarity and does not in itself dictate a relationship between the various disclosed embodiments and/or configurations. Further, specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the formation of a feature on, connected to, and/or coupled to another feature in the present disclosure may include embodiments in which the features are formed in direct contact, and may also include embodiments in which additional features may be formed interposing the features, such that the features may not be in direct contact.

Further, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used herein for ease of description to describe one element or feature's relationship to another element(s) or feature(s). The spatially relative terms are intended to encompass different orientations than as depicted of a device (or system or apparatus) including the element(s) or feature(s), including orientations associated with the device's use or operation. The apparatus may be otherwise oriented (rotated 90 degrees or at other orientations) and the spatially relative descriptors used herein may likewise be interpreted accordingly.

The GAA devices described herein include channel regions having various dimensions and/or shapes (e.g., cylindrical-shaped (e.g., nanowire), rectangular-shaped (e.g., nanobar), sheet-shaped (e.g., nanosheet), etc.). The present disclosure refers to channel regions of various dimensions and shapes collectively as nanostructures. The nanostructures may refer to the semiconductor layer (e.g., designed to provide a channel or portion thereof) as fabricated, after channel release, after gate structure is formed there around, and/or with or without current flow.

FIG. 1 is a flow chart of a method 100 for fabricating a multigate device according to various aspects of the present disclosure. In some embodiments, method 100 fabricates a multi-gate device that includes p-type GAA transistors and n-type GAA transistors. The method 100 provides a method of fabricating GAA transistors on a substrate having different channel configurations, e.g., different number of channel regions between a first or first plurality of devices and a second or second plurality of devices. The method 100 allows for providing devices having a different channel configuration (e.g., number of nanostructures providing channel regions) on the substrate allowing for devices to be targeted for different performances and/or applications. For example, devices having a greater number of channel regions provides for a high-performance application in a circuit, such as a high-speed device. Devices having a lower number of channel regions provides for a low power application in a circuit, such as a low standby leak circuit design. The devices may be suitable for logic applications, memory applications, and/or other device features.

At block 102, a substrate is provided. In some implementations, the substrate includes silicon. Alternatively or additionally, substrate includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate can include various doped regions depending on design requirements of multigate device.

Block 104 includes forming a first device on the substrate having a first number of channel regions or nanostructures (also referred to as "nanosheets" or just "sheets") extending between a source and a drain region of the first device. In some embodiments, the first device is one of an n-type or a p-type device. In some embodiments, the first device is an GAA device that includes a first number of channel regions or nanostructures (sheets). In some implementations, the gate structure of the first device interfaces (e.g., surrounds) the first number of channel regions. The number of channel regions or nanostructures may be one or greater.

Block 106 includes forming a second device on the substrate having a second number of channel regions or nanostructures (also referred to as "nanosheets" or just "sheets") extending between a source and a drain region of the second device. In some embodiments, the second device is one of an n-type or a p-type device. The second device may be the same device type as the first device or be different. In some embodiments, the second device is an GAA device that includes a second number of channel regions or nanostructures (sheets). The number of channel regions of the second device may be one or greater. In an embodiment, the second number of channel regions or nanostructures may be different than the first number of channel regions or nanostructures. In an embodiment, the second device includes the same number of physical nanostructure layers as the first device, however, the effective or functional number of channel regions of the first device is different than the second device. For example, various methods may include modifying the channel region or the source/drain region to inhibit or prohibit current flow through a nanostructure for one device, while providing current flow through a similarly configured nanostructure for a first device.

In some embodiments of the method 100, the first and second devices are formed by any one or multiple of the example methods discussed below. Blocks 104 and 106 may be performed in either order and/or simultaneously as discussed in the examples below. Additional processing is contemplated by the present disclosure. Additional steps can be provided before, during, and after method 100, and some of the steps described can be moved, replaced, or eliminated for additional embodiments of method 100. The discussion that follows illustrates various embodiments of nanostructure-based integrated circuit devices that can be fabricated according to method 100.

The multigate devices formed by the method 100 may be included in a microprocessor, a memory, and/or other IC device. In some embodiments, multigate device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. In some embodiments, multigate device is included in a non-volatile memory, such as a non-volatile random-access memory (NVRAM), a flash memory, an electrically erasable programmable read only memory (EEPROM), an electrically programmable read-only memory (EPROM), other suitable memory type, or combinations thereof.

When a transistor is switched on, current flows between source/drain regions of the transistor through channel regions. For a GAA transistor, the channel regions are configured in nanostructures or sheets formed over a substrate. By configuring the channel regions, e.g., reducing the number of nanostructures providing channel regions, the GAA device performance may be tuned. Similarly, by configuring the source/drain regions and reducing an interface between the source/drain regions and a nanostructure, a GAA device can be tuned by decreasing the formed channels. Various of these embodiments are discussed herein and include a comparison between a first device (e.g., first GAA device) and a second device (e.g., second GAA device) formed upon a same substrate using many similar processes. The second device has a channel region having a different channel configuration, in the illustrated embodiments, a channel region that is decreased through one or more means. The devices shown may be of different conductivity types (n-type or p-type) or the same conductivity type.

Figure 2C:
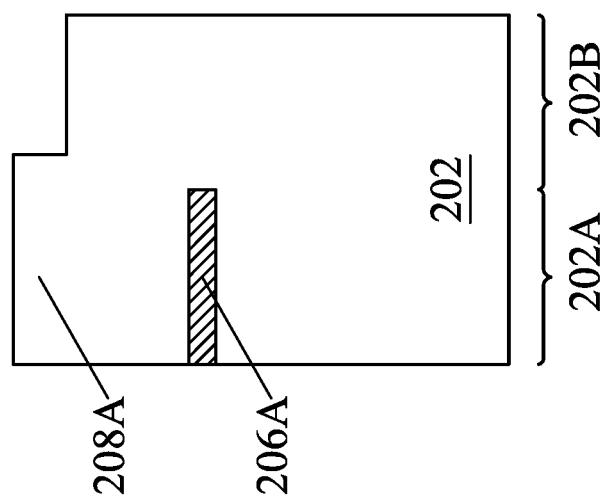

Referring now to FIGS. 2A-2K, illustrated is an embodiment of a multigate device 200 including a first device 200A and a second device 200B. Specifically, FIGS. 2A, 2B, 2C, 2D, 2E, 2G, 2H, and 2I-2K are fragmentary cross-sectional views of a multigate device 200, in portion or entirety, at various fabrication steps. FIG. 2F is a fragmentary perspective view of the multigate device 200 corresponding to fabrication step of FIG. 2G. FIGS. 2A-2E and 2G-2I are taken along the Y-Y' plane illustrated in FIG. 2F. FIG. 2J is taken along the X1-X1' plane device 200A), FIG. 2K is taken along the X2-X2' (device 200B). Additional features can be added in multigate device 200, and some of the features described below can be replaced, modified, or eliminated in other embodiments of multigate device 200.

FIG. 2A illustrates a multigate device 200 includes a substrate (wafer) 202. In the depicted embodiment, substrate 202 includes silicon. Alternatively, or additionally, substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 202 can include various doped regions depending on design requirements of multigate device 200.

FIG. 2A illustrates a first layer 206A of a stack of semiconductor layers 204. A semiconductor layer stack 204 is formed over substrate 202, where semiconductor layer stack includes semiconductor layers 206 and semiconductor layers 208 stacked vertically (e.g., along the z-direction) in an interleaving or alternating configuration from a surface of substrate 202. The first layer 206A is epitaxially grown on the substrate 202. In some embodiments, epitaxial growth of semiconductor layer 206A is achieved by a molecular beam epitaxy (MBE) process, a chemical vapor deposition (CVD) process, a metalorganic chemical vapor deposition (MOCVD) process, other suitable epitaxial growth process, or combinations thereof. The first layer 206A may be a first composition, such as silicon germanium, as discussed below.

The first layer 206A, like the layers 206 discussed below may be sacrificial or dummy layers that are subsequently removed. In some implementations, the first layer 206A and/or the layers 206 define a space within which a gate structure is formed.

FIG. 2B illustrates a patterning of the semiconductor layer 206A. The patterning includes removing the semiconductor layer 206A from a second region 202B of the substrate 202, while maintaining the semiconductor layer 206A on the first region 202A of the substrate. In some implementations, the first region 202A includes devices having a first number of channel regions, and the second region 202B includes devices having a second number of channel regions, the second number of channel regions being less than the first number of channel regions. The patterning may be performed by suitable lithography and etching processes.

Figure 2D:
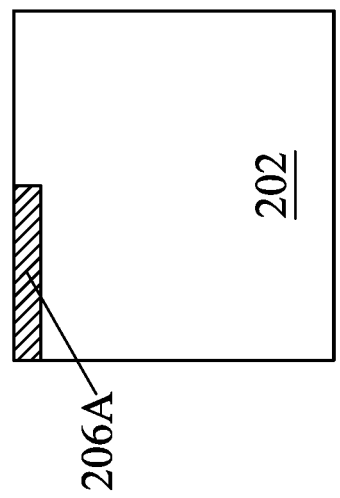
Figure 2E:
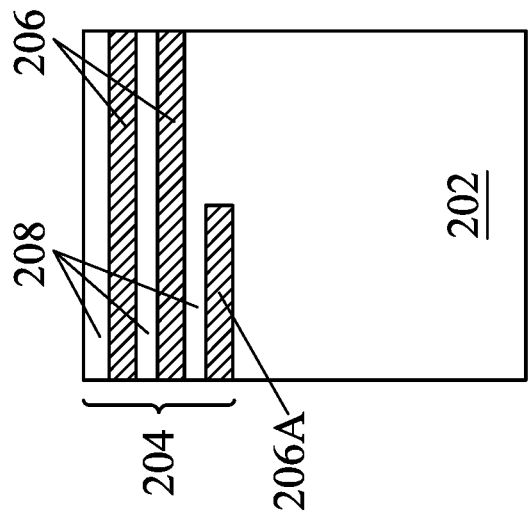

FIG. 2C illustrates a second semiconductor layer 208A formed over region 202A and 202B of the substrate 202. The second layer 208A is epitaxially grown on the substrate 202 and over the first semiconductor layer 206A. In some embodiments, epitaxial growth of semiconductor layer 208A is achieved by a molecular beam epitaxy (MBE) process, a chemical vapor deposition (CVD) process, a metalorganic chemical vapor deposition (MOCVD) process, other suitable epitaxial growth process, or combinations thereof. The second layer 208A may be a second composition, such as silicon, as discussed below. In an embodiment, the second layer 208A is the same composition as the substrate 202. After growth of the second layer 208A, a planarization process such as chemical mechanical planarization (CMP) process is performed as illustrated in FIG. 2D.

The second semiconductor layer 208A, like the semiconductor layers 208 discussed below, provide a channel region of the device. The second semiconductor layer 208A provide a nanostructure within which the channel is formed and the current of the transistor flows.

Additional numbers of layers of the stack 204 are then formed on the substrate including any plurality of semiconductor layers 206 and 208 comprising the first and second compositions respectively. In some embodiments, semiconductor layers 206 and semiconductor layers 208 are epitaxially grown in the depicted interleaving and alternating configuration.

A composition of semiconductor layers 206 is different than a composition of semiconductor layers 208 to achieve etching selectivity and/or different oxidation rates during subsequent processing. In some embodiments, semiconductor layers 206 have a first etch rate to an etchant and semiconductor layers 208 have a second etch rate to the etchant, where the second etch rate is less than the first etch rate. In some embodiments, semiconductor layers 206 have a first oxidation rate and semiconductor layers 208 have a second oxidation rate, where the second oxidation rate is less than the first oxidation rate. In the depicted embodiment, semiconductor layers 206 and semiconductor layers 208 include different materials, constituent atomic percentages, constituent weight percentages, thicknesses, and/or characteristics to achieve desired etching selectivity during an etching process, such as an etching process implemented to form suspended channel layers in channel regions of multigate device 200. For example, where semiconductor layers 206 include silicon germanium and semiconductor layers 208 include silicon, a silicon etch rate of semiconductor layers 208 is less than a silicon germanium etch rate of semiconductor layers 206. In some embodiments, semiconductor layers 206 and semiconductor layers 208 can include the same material but with different constituent atomic percentages to achieve the etching selectivity and/or different oxidation rates. The present disclosure contemplates that semiconductor layers 206 and semiconductor layers 208 include any combination of semiconductor materials that can provide desired etching selectivity, desired oxidation rate differences, and/or desired performance characteristics (e.g., materials that maximize current flow), including any of the semiconductor materials disclosed herein.

The semiconductor layers 208 or portions thereof form nanostructures that provide channel regions of multigate device 200. Semiconductor layers 206 provide dummy or sacrificial layers between the channel regions, where the removal of the semiconductor layers 206 provides a space for a gate structure to formed around the channel regions of the semiconductor layers 208.

In the depicted embodiment, semiconductor layer stack 204 in region 202A includes three semiconductor layers 208 and three semiconductor layers 206. After undergoing subsequent processing, such configuration will result in three nanostructure regions of the multigate device 200 of the region 202A that provide three channel regions. In the depicted embodiment, semiconductor layer stack 204 in region 202B includes two semiconductor layers 208 and two semiconductor layers 206. After undergoing subsequent processing, such configuration will result in two nanostructure regions of the multigate device 200 of the region 202B to provide two channel regions. The number of nanostructures and channel layers is exemplary only and not intended to be limited.

The present disclosure contemplates embodiments where semiconductor layer stack 204 includes more or less semiconductor layers, for example, depending on a number of channels desired for the devices in each of region 202A and 202B. For example, in some embodiments, the steps above may be repeated for any number of times including patterning the semiconductor layer 206 such that it is removed from region 202B. Thus, the multigate device of region 202B may include n channel regions, and the multigate device of region 202A may include n+x channel regions, where x is an integer of 1 or greater. For example, semiconductor layer stack 204 can include two to ten semiconductor layers 206 and two to ten semiconductor layers 208. In furtherance of the depicted embodiment, semiconductor layers 206 have a first thickness and semiconductor layers 208 have a second thickness, where first thickness and second thickness are chosen based on fabrication and/or device performance considerations for multigate devices. For example, first thickness can be configured to define a desired distance (or gap) between adjacent channels of multigate device (e.g., between semiconductor layers 208), second thickness can be configured to achieve desired thickness of channels of multigate devices.

Turning to FIGS. 2F and 2G, semiconductor layer stack 204 is patterned to form a fin 210A and a fin 210B (also referred to as fin structures, fin elements, etc.). Fins 210A, 210B include a substrate portion (i.e., a portion of substrate 202) and a semiconductor layer stack portion (i.e., a remaining portion of semiconductor layer stack 204 including semiconductor layers 206 and semiconductor layers 208). Fins 210A, 210B extend substantially parallel to one another along a x-direction, having a length defined in the x-direction, a width defined in an y-direction, and a height defined in a z-direction. In some implementations, a lithography and/or etching process is performed to pattern semiconductor layer stack 204 to form fins 210A, 210B. The lithography process can include forming a resist layer over semiconductor layer stack 205 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process removes portions of semiconductor layer stack 204 using the patterned resist layer as an etch mask. In some embodiments, the patterned resist layer is formed over a hard mask layer disposed over semiconductor layer stack 204, a first etching process removes portions of the hard mask layer to form a patterned hard mask layer, and a second etching process removes portions of semiconductor layer stack 204 using the patterned hard mask layer as an etch mask. The etching process can include a dry etching process, a wet etching process, other suitable etching process, or combinations thereof. In some embodiments, the etching process is a reactive ion etching (RIE) process. After the etching process, the patterned resist layer (and, in some embodiments, a hard mask layer) is removed, for example, by a resist stripping process or other suitable process. Alternatively, fins 210A, 210B are formed by a multiple patterning process, such as a double patterning lithography (DPL) process (for example, a lithography-etch-lithography-etch (LELE) process, a self-aligned double patterning (SADP) process, a spacer-is-dielectric (SID) SADP process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. In some embodiments, directed self-assembly (DSA) techniques are implemented while patterning semiconductor layer stack 204. Further, in some embodiments, the exposure process can implement maskless lithography, electron-beam (e-beam) writing, and/or ion-beam writing for patterning the resist layer.

Fin element 210A is provided in substrate region 202A and includes the stack 204 that includes a first semiconductor layer 206A. Fin element 210B is provided in substrate 202B and includes the stack 204 that omits the semiconductor layer 204A. Thus, fin element 210A provides a fin structure for fabricating a GAA device that includes an additional nanostructure providing an additional channel region than that of the fin element 210B which provides a fin structure for fabricating a GAA device that includes a lower number of channel regions.

Figure 2I:
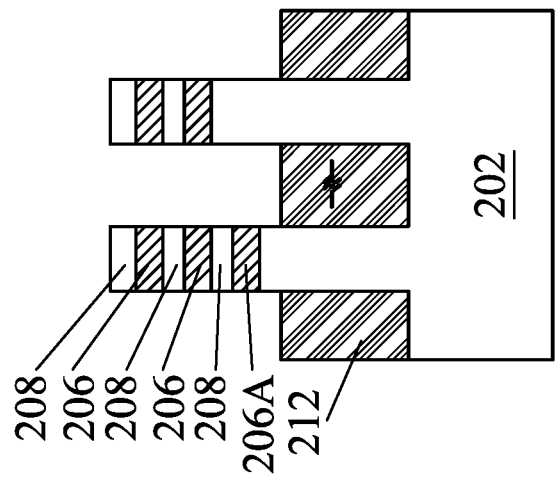
Figure 2H:
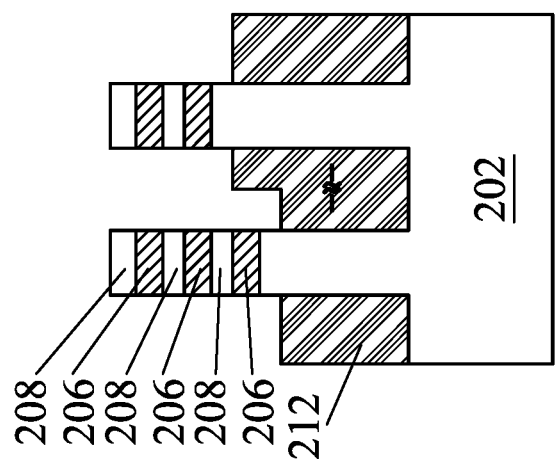

FIGS. 2H and 2I illustrate cross-sectional views including an isolation feature(s) 212 is formed over and/or in substrate 202 to isolate various regions, such as various device regions, of multigate device 200. For example, isolation features 212 surround a bottom portion of fins 210A, 210B, such that isolation features 212 separate and isolate fins 210A, 210B from each other. In the depicted embodiment, isolation features 212 surround the substrate portion of fins 210A, 210B and partially surround the semiconductor layer stack portion of fins 210A, 210B. Isolation features 212 include silicon oxide, silicon nitride, silicon oxynitride, other suitable isolation material (for example, including silicon, oxygen, nitrogen, carbon, or other suitable isolation constituent), or combinations thereof. In an embodiment, isolation features 212 can include STI features that define and electrically isolate fins 210A, 210B from other active device regions (such as fins) and/or passive device regions. STI features can be formed by filling the trench with insulator material (for example, by using a CVD process or a spin-on glass process). A chemical mechanical polishing (CMP) process may be performed to remove excessive insulator material and/or planarize a top surface of isolation features 212, which may be followed by an etch back process or process(es). In some embodiments, STI features include a multi-layer structure that fills the trenches, such as a silicon nitride comprising layer disposed over a thermal oxide comprising liner layer. In another example, STI features include a dielectric layer disposed over a doped liner layer (including, for example, boron silicate glass (BSG) or phosphosilicate glass (PSG)). The top surface of the isolation features 212 may be coplanar across region 202A and 202B, as illustrated in FIG. 2I. In some implementations, the top surface of the isolation features 212 may be higher in region 202B as compared to region 202A, as illustrated in FIG. 2H. FIG. 2H in some implementations allows the isolation features 212 adjacent the fin 210B to be optimized and/or the source/drain depth optimized to minimize device capacitance from gate and source/drain, for example, for better speed and power efficiency. FIG. 2I may benefit in some implementations from reduced processing steps eliminating a patterning step of forming the isolation features 212 having a different height.

In subsequent processes, further processing may provide for placing dummy gate structures traversing the fins 210A, 210B traversing in the y-direction. Spacer elements 214 are formed on the sidewalls of the dummy gate structures. The dummy gate electrode may include a suitable dummy gate material, such as polysilicon layer. In some embodiments a dummy gate dielectric disposed between the dummy gate electrode and fins 210A, 210B, the dummy gate dielectric includes a dielectric material, such as silicon oxide, a high-k dielectric material, other suitable dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. In some embodiments, the dummy gate dielectric includes an interfacial layer (including, for example, silicon oxide) disposed over fins 210A, 210B and a high-k dielectric layer disposed over the interfacial layer. Dummy gates can include numerous other layers, for example, capping layers, interface layers, diffusion layers, barrier layers, hard mask layers, or combinations thereof. For example, dummy gate stacks can further include a hard mask layer disposed over the dummy gate electrode. Dummy gate stacks are formed by deposition processes, lithography processes, etching processes, other suitable processes, or combinations thereof.

The spacer elements 214 may be formed by a dielectric material such as silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). For example, a dielectric layer including silicon and nitrogen, such as a silicon nitride layer, can be deposited over dummy gate and subsequently etched (e.g., anisotropically etched) to form gate spacers 214. Gate spacers 214 are formed by any suitable process and include a dielectric material. Other dielectric materials for the gate spacers 214 can include silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)), and/or other suitable compositions.

Source/drain features 216 may be formed in the fins 210A, 210B adjacent the dummy gate structures such as, for example, etching recesses in the fins 210A, 210B. Within the recesses, an etch back of the semiconductor materials 206 between the semiconductor layers 208 provides a portion within which inner spacer features 218 are formed. In some implementations, residual portions 208' remain adjacent the inner spacers 218, of the semiconductor layer 208. In some implementations, this material has been oxidized. After formation of the inner spacers 218 (e.g., deposition and/or etch back of deposited dielectric), epitaxial growth processes may form source/drain features 216 in the recesses of the fins. An epitaxy process can use CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of exposed surface, in particular, a semiconductor surface, that provides a seed for the epitaxial growth. Epitaxial source/drain features formed in the recesses of the fins are doped with n-type dopants and/or p-type dopants. In some embodiments, for the n-type GAA transistors, epitaxial source/drain features include silicon. Epitaxial source/drain features for an n-type GAA transistor can be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, for the p-type GAA transistors, epitaxial source/drain features include silicon germanium or germanium. Epitaxial source/drain features can be doped with boron, other p-type dopant, or combinations thereof (for example, forming Si:Ge:B epitaxial source/drain features). In some embodiments, epitaxial source/drain features include more than one epitaxial semiconductor layer, where the epitaxial semiconductor layers can include the same or different materials and/or dopant concentrations. In some embodiments, epitaxial source/drain features are doped during deposition by adding impurities to a source material of the epitaxy process (i.e., in-situ). In some embodiments, epitaxial source/drain features are doped by an ion implantation process subsequent to a deposition process. In some embodiments, annealing processes (e.g., rapid thermal annealing (RTA) and/or laser annealing) are performed to activate dopants in epitaxial source/drain features and/or other source/drain regions (for example, heavily doped source/drain regions and/or lightly doped source/drain (LDD) regions). In some embodiments, epitaxial source/drain features of a first transistor (e.g., on fin 210A) are formed in separate processing sequences that include, for example, masking the second transistor regions (e.g., on fin 210B) when forming epitaxial source/drain features. In some embodiments, epitaxial source/drain features of a first transistor (e.g., on fin 210A) are substantially the same those within the second transistor regions (e.g., on fin 210B) for example when forming devices 200A and 200B of the same conductivity.

The epitaxial growth processes may form suitably doped source/drain features such as silicon, silicon germanium, silicon carbide doped with n-type or p-type dopants. After formation of the source/drain features 216, interlayer dielectric may be formed over the source/drain features and adjacent the dummy gate structure. The dummy gate structure may be subsequently removed, followed by a channel release process etching the semiconductor layers 206 from the channel region. The channel release process selectively removes the semiconductor layers 206 by an etching process having various etching parameters tuned to achieve selective etching of semiconductor layers 206, such as etchant composition, etching temperature, etching solution concentration, etching time, etching pressure, source power, RF bias voltage, RF bias power, etchant flow rate, other suitable etching parameters, or combinations thereof. For example, an etchant is selected for the etching process that etches the material of semiconductor layers 206 (in an embodiment, silicon germanium) at a higher rate than the material of semiconductor layers 208 (in an embodiment, silicon) (i.e., the etchant has a high etch selectivity with respect to the material of semiconductor layers 206). The etching process is a dry etching process, a wet etching process, other suitable etching process, or combinations thereof. In some embodiments, a dry etching process (such as an RIE process) utilizes a fluorine-containing gas (for example, $SF_6$) to selectively etch semiconductor layers 206. In some embodiments, a ratio of the fluorine-containing gas to an oxygen-containing gas (for example, $O_2$), an etching temperature, and/or an RF power may be tuned to selectively etch silicon germanium or silicon. In some embodiments, a wet etching process utilizes an etching solution that includes ammonium hydroxide ($NH_4OH$) and water ($H_2O$) to selectively etch semiconductor layers 206. In some embodiments, a chemical vapor phase etching process using hydrochloric acid (HCl) selectively etches semiconductor layers 206.

After releasing the channel regions, a gate structure is formed surrounding the channel regions including within the spaces provided by removal of semiconductor layer 206. Gate structure 220 may be formed including gate dielectric 220A and gate electrode 220B materials. The gate structures 220A surround the semiconductor layers 208 released providing nanostructures within which the channel is provided. Gate dielectric 220A may include a high-k dielectric material, such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). Interfacial layer may be formed by any of the processes described herein, such as thermal oxidation, chemical oxidation, ALD, CVD, other suitable process, or combinations thereof. Gate dielectric layer 220A may be formed by any of the processes described herein, such as ALD, CVD, PVD, oxidation-based deposition process, other suitable process, or combinations thereof. In some embodiments, gate dielectric layer 220A has a thickness of about 1 nm to about 2 nm.

The metal gate electrode 220B includes one or more conductive layers. In some embodiments, the metal gate electrode 220B includes P-type work function layer or layers such as any suitable p-type work function material, such as TiN, TaN, TaSN, Ru, Mo, Al, WN, WCN $ZrSi_2$, $MoSi_2$, $TaSi_2$, $NiSi_2$, other p-type work function material, or combinations thereof. In some embodiments, the metal gate electrode 220B includes N-type work function layer or layer(s) such as any suitable n-type work function material, such as Ti, Al, Ag, Mn, Zr, TiAl, TiAlC, TiAlSiC, TaC, TaCN, TaSiN, TaAl, TaAlC, TaSiAlC, TiAlN, other n-type work function material, or combinations thereof. The metal gate electrode 220B can be formed using another suitable deposition process, such as CVD, PVD, HDPCVD, MOCVD, RPCVD, PECVD, LPCVD, ALCVD, APCVD, spin coating, plating, other deposition process, or combinations thereof. Further processing including forming multilayer interconnect (MLI) features providing interconnect lines, vias and interposing dielectric layers.

FIGS. 2A-2K provide an embodiment of a portion of the method 100 forming a first device 200A (e.g., from the channel regions of the semiconductor layers 208 of the fin 210A) and a second device 200B (e.g., from the channel regions of the semiconductor layers 208 of the fin 210B) where the second device has less nanostructures providing less channel regions than that the nanostructures providing channel regions within the first device. The device 200B has less channel regions by eliminating one or more lower channel region or nanostructure in comparison with the device 200B.

FIGS. 2A-2K and the accompanying description provide for an embodiment of the method 100 forming an embodiment of GAA transistors 200A and 200B having different channel configurations. The embodiments discussed below different in some respects to the embodiment of FIGS. 2A-2K, while sharing many similar features. For ease of understanding, the similar features of not described in detail below. Rather, any description of the similar features apply equally to the following embodiments.

Figure 3B:
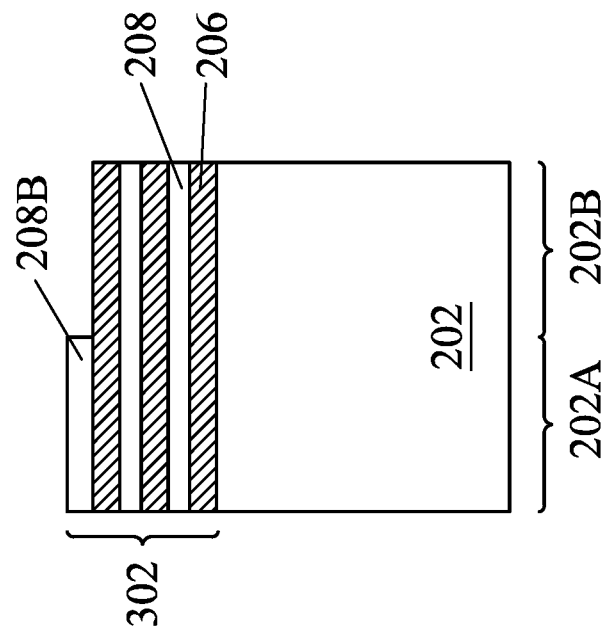
FIGS. 3A-3I are fragmentary diagrammatic views of another multigate device, in portion or entirety, at various fabrication stages according to various aspects of the present disclosure including reducing a sheet number from a frontside of a device.
Figure 3A:
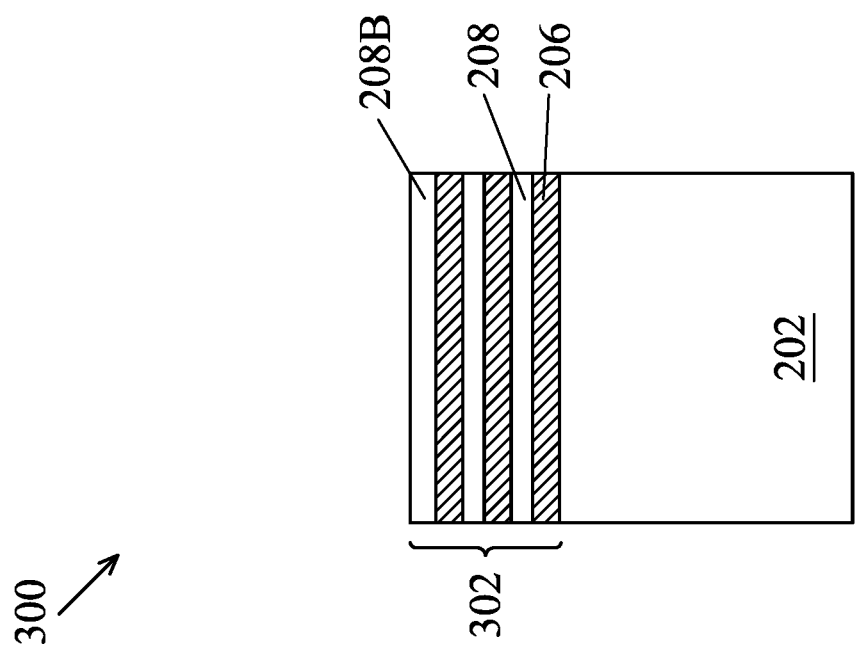
Figure 3D:
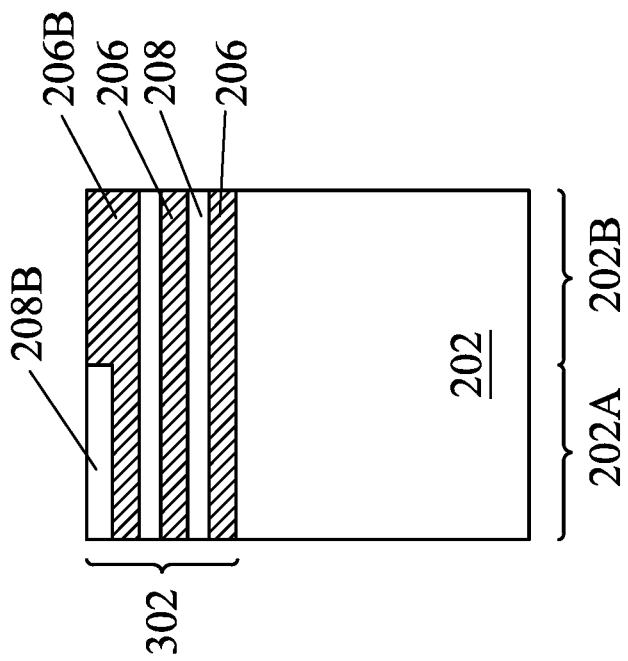
Figure 3C:
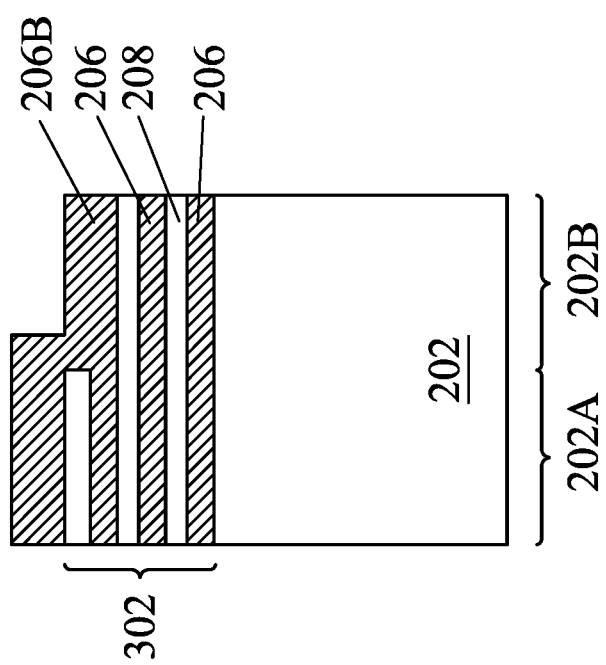
Figure 3F:
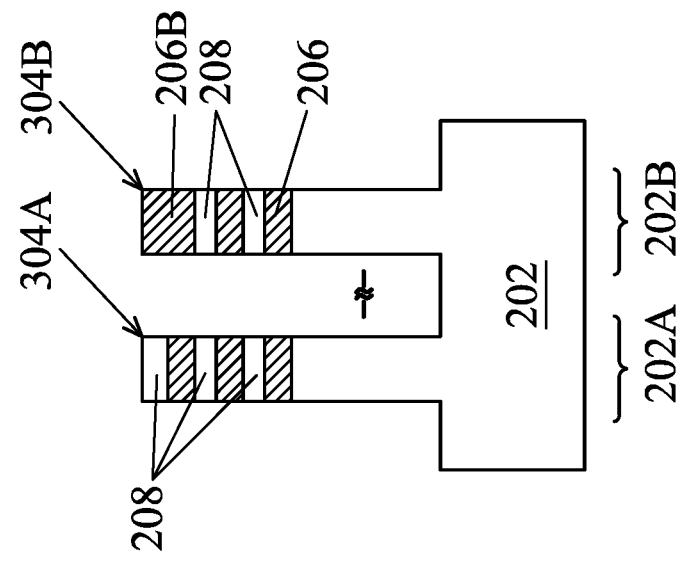
Figure 3E:
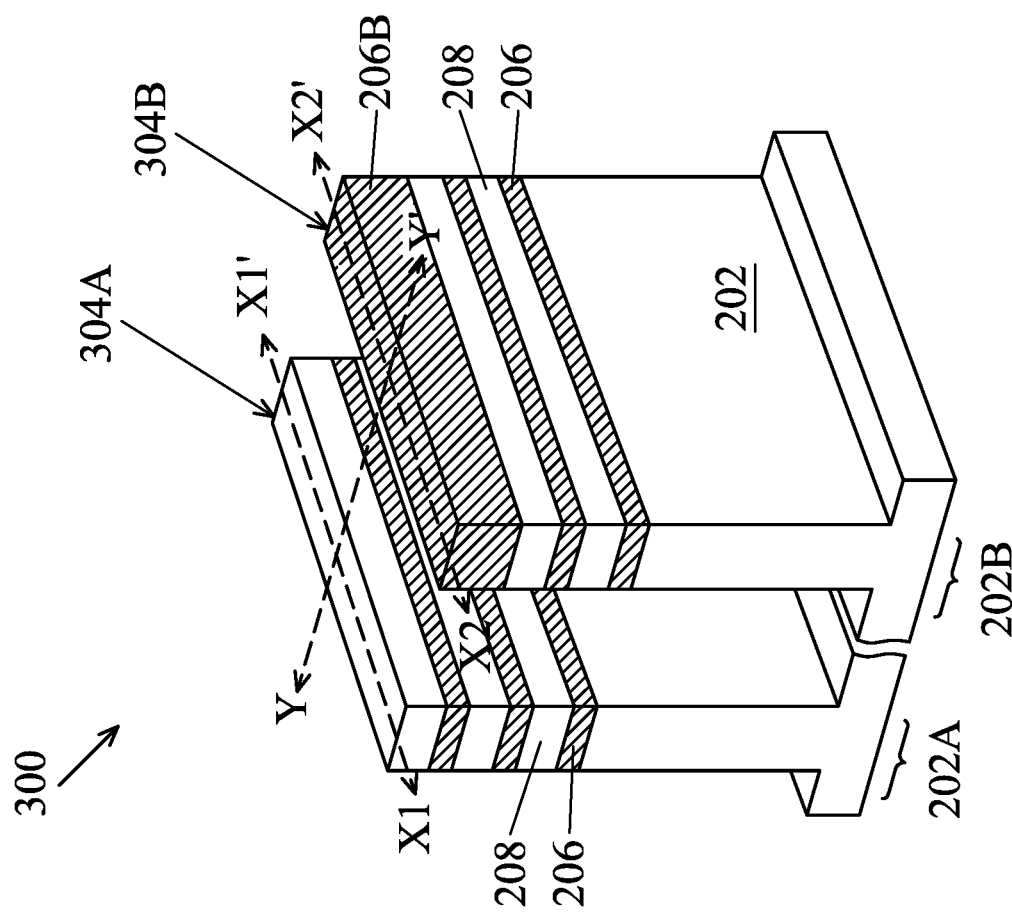
Figure 3G:
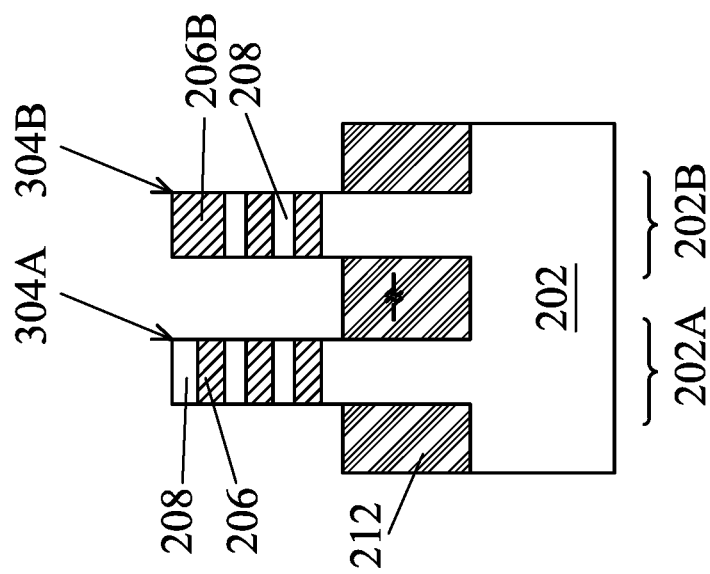
Figure 3I:
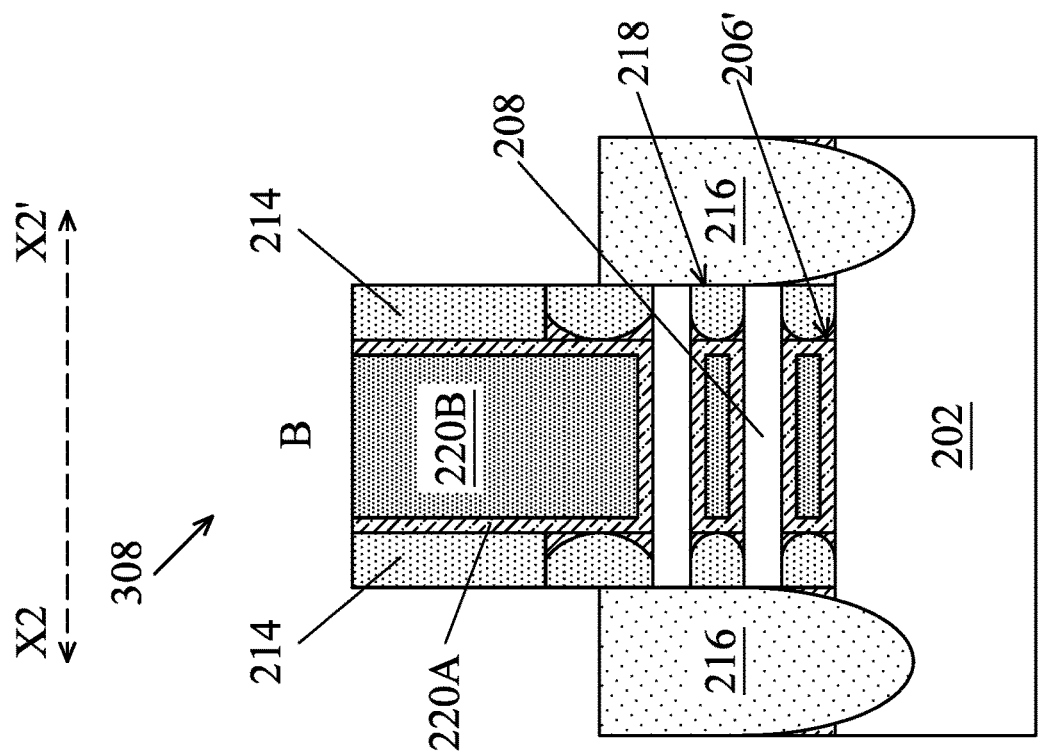
Figure 3H:
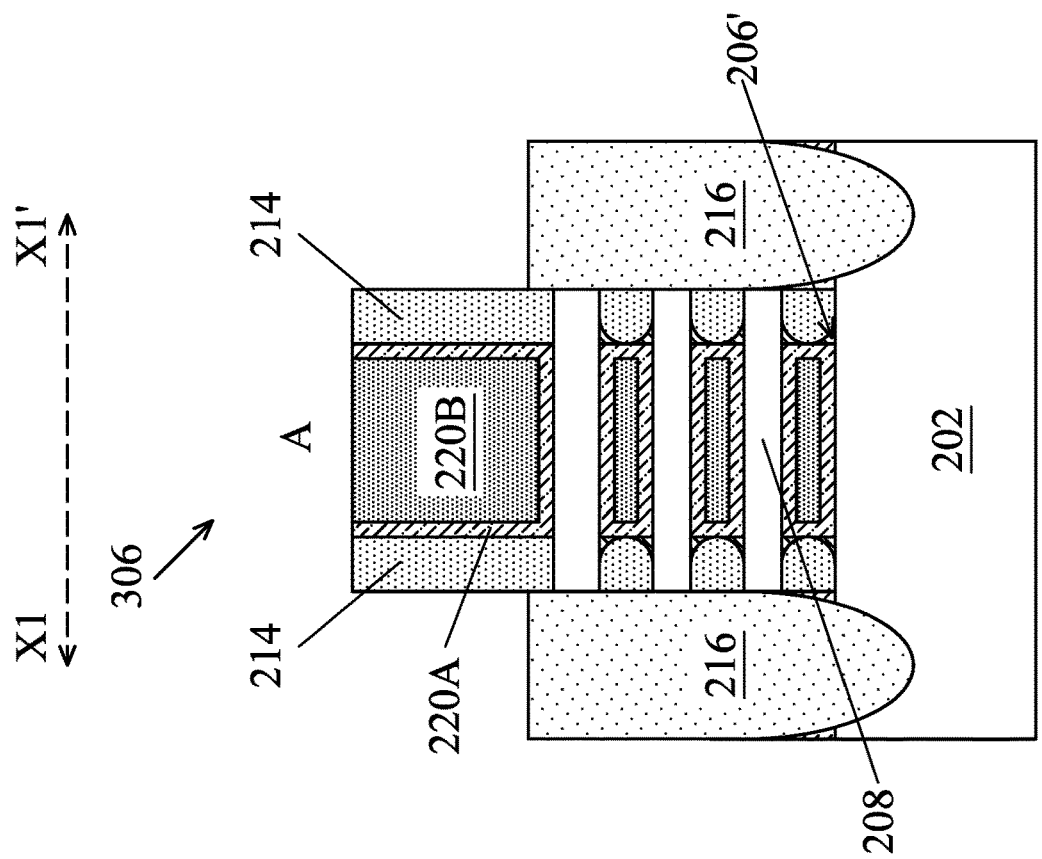

Referring now to FIGS. 3A-3D, 3F, and 3G-3H are fragmentary cross-sectional views of a multigate device 200, in portion or entirety, at various fabrication steps. FIG. 3E is a fragmentary perspective view of the multigate device 300 corresponding to fabrication step of FIG. 3F. FIGS. 3A-3D and 3F taken along the Y-Y' plane illustrated in FIG. 3E. FIG. 3H is taken along the X1-X1' plane, FIG. 3I is taken along the X2-X2'. Additional features can be added in multigate device 300, and some of the features described below can be replaced, modified, or eliminated in other embodiments of multigate device 300.

FIG. 3A illustrates a multigate device 300 includes a substrate (wafer) 202, substantially similar to as discussed above. A stack 302 of interleaving or alternating epitaxial layers 206 and 208 are formed over the substrate 202. The layers 206 and 208 may be substantially similar to as discussed above. After formation of the stack 302 of FIG. 3A, a top layer 208B is patterned to remove the semiconductor layer 208B from the second region 202B as shown in FIG. 3B. In other words, an upper nanostructure providing a channel region (semiconductor layer 208B) is removed from the second region 202B, which is designed to include one or more devices of a reduced channel configuration. The patterning may be performed by suitable lithography and etching processes.

FIG. 3C then illustrates an additional semiconductor layer 206B is grown. After growth of the additional semiconductor layer 206B, a planarization process is performed as shown in FIG. 3D. The method to this point leaves a stack 302 that includes a greater number of nanostructures-semiconductor layers 208 (i.e., those forming a channel region) in region 202A than the number of nanostructures-semiconductor layers 208 in region 202B. In particular, region 202A including three semiconductor layers 208 and three semiconductor layers 206, region 202B including two semiconductor layers 208 and three semiconductor layers 206. After undergoing subsequent processing, such configuration will result in multigate device 300 of the region 202A having three nanostructures providing channel regions. After undergoing subsequent processing, such configuration will result in multigate device 300 of the region 202B having two nanostructures providing channel regions.

However, the present disclosure contemplates embodiments where semiconductor layer stack 302 includes more or less semiconductor layers forming more of less nanostructures, for example, depending on a number of channels desired for the devices in each of region 202A and 202B. For example, in some embodiments, the steps above may be repeated for any number of times including patterning the upper semiconductor layer 208 such that it is removed from region 202B. Thus, the multigate device of region 302B may include n nanostructures providing channel regions, and the multigate device of region 202A may include n+x nanostructures providing channel regions, where x is an integer of 1 or greater. For example, semiconductor layer stack 302 can include two to ten semiconductor layers 206 and two to ten semiconductor layers 208. In furtherance of the depicted embodiment, semiconductor layers 206 have a first thickness and semiconductor layers 208 have a second thickness, where first thickness and second thickness are chosen based on fabrication and/or device performance considerations for multigate devices. For example, first thickness can be configured to define a desired distance (or gap) between adjacent channels of multigate device (e.g., between semiconductor layers 208), second thickness can be configured to achieve desired thickness of channels of multigate devices.

Turning to FIGS. 3E and 3F, semiconductor layer stack 302 is patterned to form a fin 304A and a fin 304B. Fins 304A, 304B include a substrate portion (i.e., a portion of substrate 202) and a semiconductor layer stack portion (i.e., a remaining portion of semiconductor layer stack 302 including semiconductor layers 206 and semiconductor layers 208). Fins 304A, 304B extend substantially parallel to one another along a x-direction, having a length defined in the x-direction, a width defined in an y-direction, and a height defined in a z-direction. In some implementations, a lithography and/or etching process is performed to pattern semiconductor layer stack 302 to form fins 304A, 304B. Various methods for forming the fins 304A, 304B may be used including those discussed above with reference to fins 210A, 210B above.

Fin element 304A is provided in substrate region 202A and includes the stack 302 that includes three semiconductor (channel or nanostructure) layers 208. Fin element 304B is provided in substrate 202B and includes the stack 302 that omits an upper layer of the semiconductor layers 208. Thus, fin element 304A provides a fin structure for fabricating a GAA device that includes an additional nanostructure respect to the fin element 304B which provides a fin structure for fabricating a GAA device that includes a lower number of nanostructures providing channel regions.

FIG. 3G illustrates cross-sectional views including the isolation feature(s) 212, which may be substantially similar to as discussed above. In subsequent processes, further processing may provide for placing dummy gate structures traversing the fins 304A, 304B traversing in the y-direction. Spacer elements 214 are formed on the sidewalls of the dummy gate structures. Source/drain features 216 may be formed in each of the fins 304A, 304B adjacent the dummy gate structures such as, for example, etching recesses in the fins 304A, 304B. Within the recesses, an etch back of the semiconductor materials 206 between the semiconductor layers 208 provides a portion within which inner spacer features 218 are formed. In some implementations, residual portions 206' remain adjacent the inner spacers 218, of the semiconductor layer 208. In some implementations, this material has been oxidized. After formation of the inner spacers 218 (e.g., deposition and/or etch back of deposited dielectric), epitaxial growth processes may form source/drain features 216 in the recesses of the fins. The epitaxial growth processes may form suitably doped source/drain features such as silicon, silicon germanium, silicon carbide doped with n-type or p-type dopants. The source/drain regions of the fin 304A may be the same conductivity or different conductivity as the fin 304B. After formation of the source/drain features 216, interlayer dielectric may be formed over the source/drain features and adjacent the dummy gate structure. The dummy gate structure may be subsequently removed, followed by a channel release process etching the semiconductor layers 206 from the channel region. Gate structure 220 may be formed including gate dielectric 220A and gate electrode 220B materials. The gate structures surround the nanostructures provided by the released semiconductor layers 208. Further processing including forming multi-layer interconnect (MLI) features providing interconnect lines, vias and interposing dielectric layers. These features after subsequent fabrication are shown in FIGS. 3H and 3I.

FIGS. 3H-3I provides an embodiment of a portion of the method 100 forming a first device 306 (e.g., from the channel regions of nanostructures formed of the semiconductor layers 208 of the fin 304A) and a second device 308 (e.g., from the channel regions of nanostructures formed of the semiconductor layers 208 of the fin 304B) where the second device has less nanostructures providing channel regions the first device. The device 308 has less nanostructures providing channel regions by eliminating an upper nanostructure channel region or region(s) in comparison with the device 306. As discussed above, during the channel release process the semiconductor layers 206 are removed from the channel region. In the illustrated embodiment, during the channel release process, the semiconductor layer 206 including the upper layer 206B, which has an increased thickness to account for the removal of the semiconductor layer 208, provides a larger opening in which to form the gate structure 220. Thus, the gate structure 220 extends to the nanostructure provided by the upper semiconductor layer 208 of the device 308 providing a larger gate structure 220 (e.g., length in a z-direction) than that of device 306. A portion of the inner spacers 218 (and/or residual semiconductor material 208', which may be oxidized) interfaces the gate structure 220 that is formed over the first or upper nanostructure provided by semiconductor layer 208 of the device 308.

In some implementations, the height of the source/drain epitaxial material 216 of the device 308 may be lower than the height of the source/drain epitaxial material 216 of the device 306. This may be in part due to the additional semiconductor material (e.g., 208) provided as a seed for the epitaxial growth process for device 306. Nonetheless, the source/drain features 216 of devices 306 and 308 may be fabricated as the same time (e.g., using the same epitaxial growth process and/or the same recess process of the fins 304A and 304B). Due to the differences in height, the contact landing depth (e.g., the interface with the source/drain features 216 and a vertical contact feature) differs from device 306 to device 308. The contact feature must extend closer to the substrate 202 to contact the source/drain feature 216 of the device 308. Contacts include a conductive material, such as metal. Metals include aluminum, aluminum alloy (such as aluminum/silicon/copper alloy), copper, copper alloy, titanium, titanium nitride, tantalum, tantalum nitride, tungsten, polysilicon, metal silicide, other suitable metals, or combinations thereof. The metal silicide may include nickel silicide, cobalt silicide, tungsten silicide, tantalum silicide, titanium silicide, platinum silicide, erbium silicide, palladium silicide, or combinations thereof. The contact provides a vertical electrical and physical connection to the feature, for example, here to the source/drain feature 216.

Turning to FIGS. 4A-4E, illustrated is another embodiment of a method of forming devices having different channel configurations. In an embodiment, the different channel configurations provide for a second device having a decreased channel area by providing at least one nanostructure of the device within which a channel region is not substantially formed. FIG. 4A, 4B, and 4C illustrate a multigate device 400 includes a substrate (wafer) 202, in many respects substantially similar to as discussed above. A stack of interleaving or alternating epitaxial layers 206 and 208 are formed over the substrate 202. The layers 206 and 208 may be substantially similar to as discussed above. In some embodiments, the stack includes an alternating stack of layers configured in the same manner for both the substrate region 202A and substrate region 202B. That is the fin structures 402A and 402B respectively, as shown in FIGS. 4A, 4B, 4C, are formed having the same alternating stack of layers. In particular, as illustrated region 202A including three semiconductor layers 208 and three semiconductor layers 206 to form fin element 402A, region 202B including three semiconductor layers 208 and three semiconductor layers 206 to form fin element 402B. However, other embodiments, other numbers of layers of the stack may be provided such as, for example, between 2 or 10 layers. In furtherance of the depicted embodiment, semiconductor layers 206 have a first thickness and semiconductor layers 208 have a second thickness, where first thickness and second thickness are chosen based on fabrication and/or device performance considerations for multigate devices. For example, first thickness can be configured to define a desired distance (or gap) between adjacent channels of multigate device (e.g., between semiconductor layers 208), second thickness can be configured to achieve desired thickness of channels of multigate devices.

Fins 402A, 402B include a substrate portion (i.e., a portion of substrate 202) and a semiconductor layer stack portion. Fins 402A, 402B extend substantially parallel to one another along a x-direction, having a length defined in the x-direction, a width defined in an y-direction, and a height defined in a z-direction. Various methods for forming the fins 402A, 402B may be used including those discussed above with reference to fins 210A, 210B above.

FIG. 4B provides a cross-sectional view along the Y-Y' cut of FIG. 4A. FIG. 4B illustrates cross-sectional views including the isolation feature(s) 212, which may be substantially similar to as discussed above, and may extend between fins. FIG. 4C provides a cross-sectional view that is illustrative of the cut along X1-X1' as well as the cut along X2-X2'.

In subsequent processes, further processing may provide for placing dummy gate structures 406 (FIGS. 4D and 4E) traversing the fins 402A, 402B in the y-direction. Spacer elements 214 are formed on the sidewalls of the dummy gate structures. 406. The dummy gate electrode 406 may include a suitable dummy gate material, such as polysilicon layer. A dummy gate dielectric material may also be included along with numerous other layers, for example, capping layers, interface layers, diffusion layers, barrier layers, hard mask layers, or combinations thereof. The dummy gate 406 may define the dimensions of the device, for example, defining the gate length.

After placing the dummy gate structures 406 over the fins 402A, 402B, source/drain recesses are formed by etching the respective fins 402A, 402B adjacent the dummy gate structures 406. First source drain recess 404A is provided in fin 402A as illustrated in FIG. 4D; a second source drain recess 404B is provided in fin 402B as illustrated in FIG. 4E. In an embodiment, the fins 402A in the substrate region 202A are etched to a first depth d1. The first depth d1 may provide the recess 404A extending below the bottom epitaxial layer 208. The etching process can include a dry etching process, a wet etching process, other suitable etching process, or combinations thereof. In some embodiments, the etching process is a multi-step etch process.

In an embodiment, the fins 402B in the substrate region 202B are etched to a second depth d2 to form recesses 404B. The etching process can include a dry etching process, a wet etching process, other suitable etching process, or combinations thereof. In some embodiments, the etching process to form the recess 404B is done separately from the etching to form the recess 404A. For example, in some implementations, a masking element may cover the fin 402B, while recess 404A is formed in fin 402A. The second depth d2 of recess 404B is less than the first depth d1 of recess 404A. The recesses 404B have a second depth d2 that does not expose a bottom epitaxial layer 206C. Thus, at least one epitaxial layer 206 remains below the recess 404B. The bottom of the recess 404B may be defined by a semiconductor layer 208. In an embodiment, a bottom semiconductor layer 208C is partially etched to retain a thickness of a bottom semiconductor layer 208C. In other embodiments, additional epitaxial layers 206/208 are unetched in forming the recesses 404B. The depth d1 of the recess 404A and the depth d2 of the recess 404B are defined to provide devices of different channel configurations as discussed below.

Figures 4F, 4G:
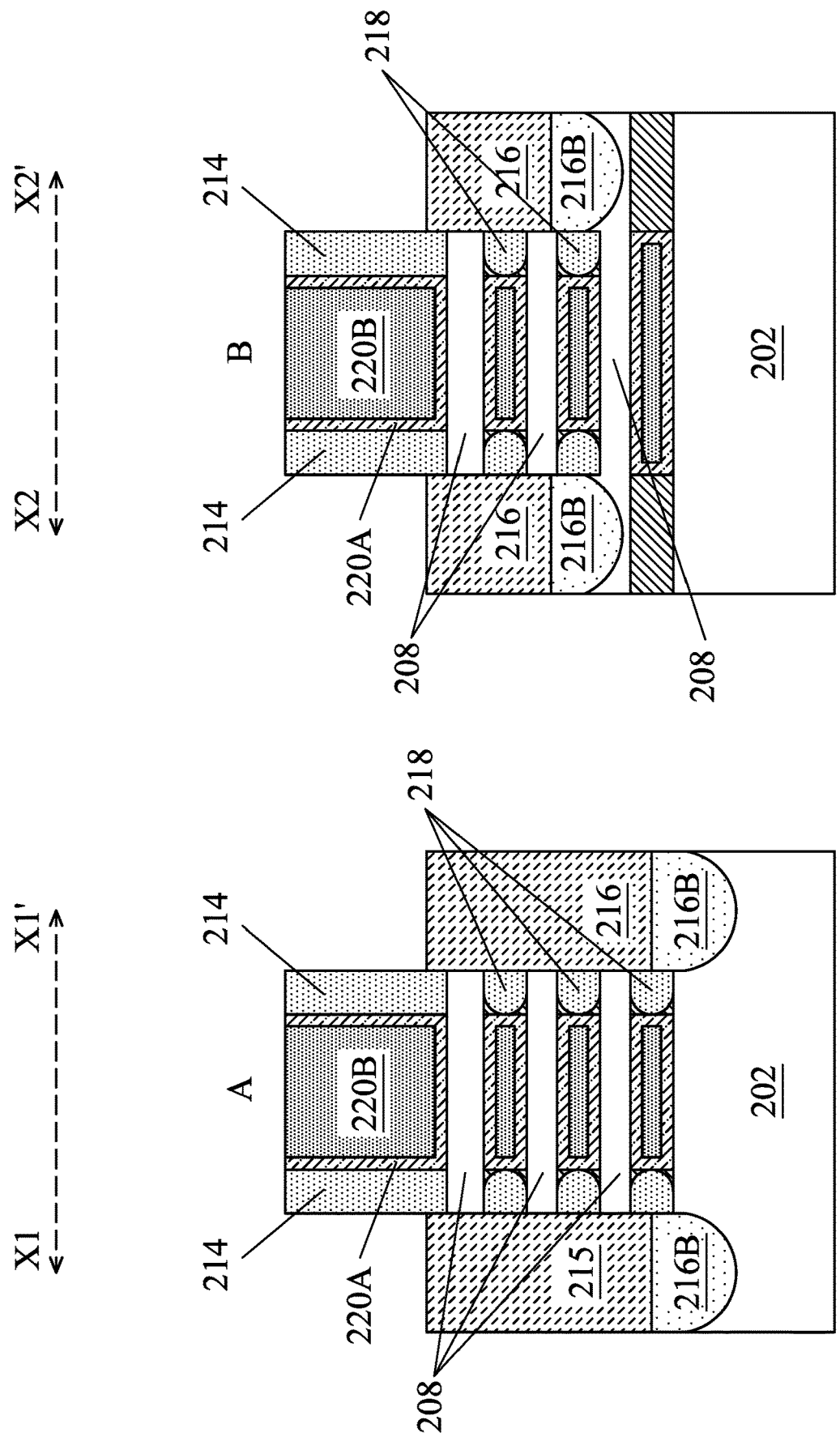

After forming the recesses 404A and/or 404B, inner spacers 218 may be formed adjacent the recesses 404A, 404B and the channel region of the device as illustrated in FIGS. 4F and 4E. Inner spacers 218 may be formed by suitable deposition processes and/or etch back of deposited dielectric. In some implementations, residual portions 206' remain adjacent the inner spacers 218, of the semiconductor layer 208. In some implementations, residual portions 206' may include an oxide. Source/drain features 216 may be formed in the recesses 404A, 404B. The source/drain features 216 may be substantially similar as discussed above. For example, an epitaxial growth process or processes may form suitably doped source/drain features such as silicon, silicon germanium, silicon carbide doped with n-type or p-type dopants. The source/drain features 216 of the recesses 404A and 404B may comprise the same or different materials, including the same or different dopants. As the source/drain features 216 fill the respective recess 404A, 404B, the source/drain features 216 filling the recess 404A have a greater height than the source/drain features 216 filling the recess 404B. In an embodiment, the source/drain features 216 include a bottom region 216B, which may be substantially undoped epitaxial material. In some implementations, the bottom epitaxial portion 216B is an undoped semiconductor material such as silicon, silicon germanium, silicon carbide, and/or other suitable materials. In some implementations, the bottom epitaxial portion 216B includes a same material as the upper region of the source/drain features 216. The bottom epitaxial portion 216B and the remainder of the source/drain feature 216 may be formed in-situ.

After formation of the source/drain features 216, an interlayer dielectric may be formed over the source/drain features and adjacent the dummy gate structure. The dummy gate structure may be subsequently removed, followed by a channel release process etching the semiconductor layers 206 from the channel region. A gate structure 220 may then be formed including gate dielectric 220A and gate electrode 220B materials. The gate structures surround the released nanostructures provided by semiconductor layers 208. Further processing including forming multi-layer interconnect (MLI) features providing interconnect lines, vias and interposing dielectric layers.

The gate structure 220 and the source/drain feature 216 formed on fin element 402A form a first device 400A; the gate structure 220 and the source/drain feature 216 formed on fin element 402B form a second device 400B. The channel region of the device 400A differs from the channel region of the device 400B. Because the source/drain feature 216 in recesses 404B does not extend to be adjacent, lateral to, and/or below the bottom gate structure of the device 400B, the device 400B has a decreased channel region. For example, there is little to no current flow between the source/drain features 216 at the upper portion of 202 within the fin 402B. Thus, the device 400B has in effect a channel configuration of a reduced number of nanostructures (sheets) that are functioning as channel regions. While the semiconductor material forming the nanostructure corresponding to the channel region or sheet is physically formed, due to the configuration of the source/drain structure the channel region is decreased. The device 400B may, in some implementations, have an increased risk of leakage from gate to source/drain feature and/or between gate structures of neighboring devices. In some implementations, a bottom gate length could help to suppress leakage from a bottom parasitic device.

Turning to FIGS. 5A-5T, illustrated is another method of forming devices having different channel configurations. FIGS. 5A, 5B, and 5C illustrate a multigate device 500 that is substantially similar to as discussed above including with reference to the structure of FIGS. 4A, 4B, and 4C. Fins 502A, 502B are formed as shown in FIGS. 5A and 5B.

Figure 5E:
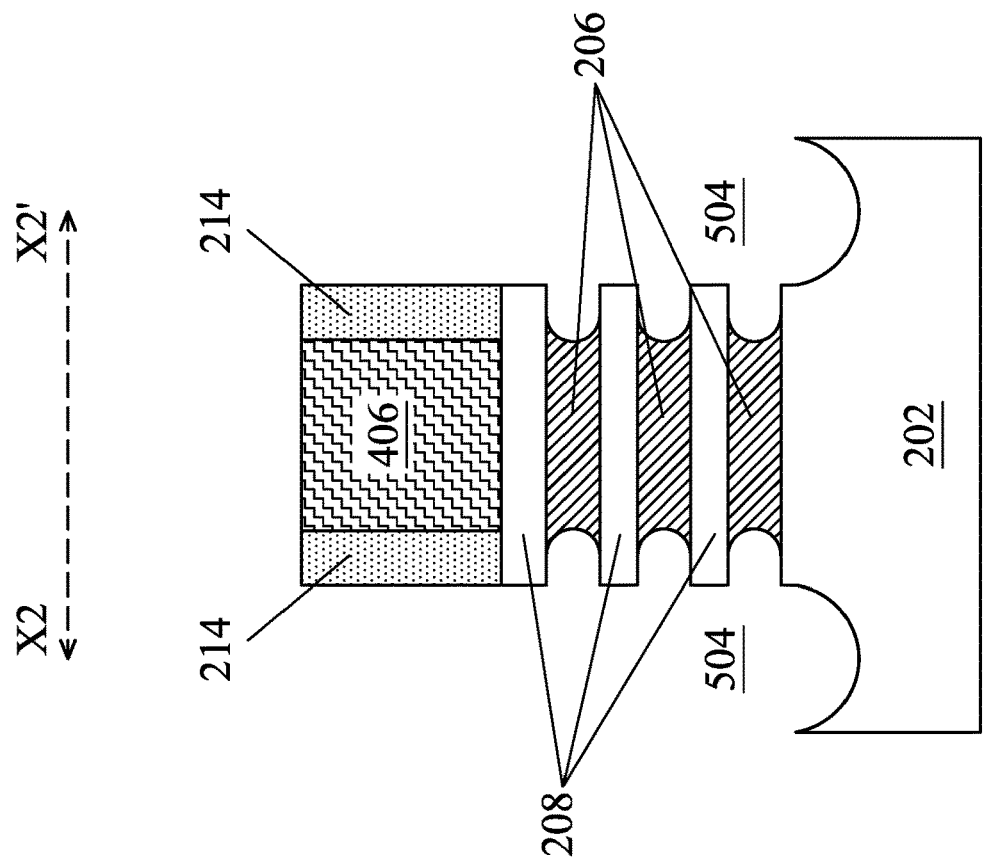
FIGS. 5A-5S are fragmentary diagrammatic views of another multigate device, in portion or entirety, at various fabrication stages according to various aspects of the present disclosure including manipulating the source/drain configuration of a device including providing dielectric in the source/drain region.
Figure 5D:
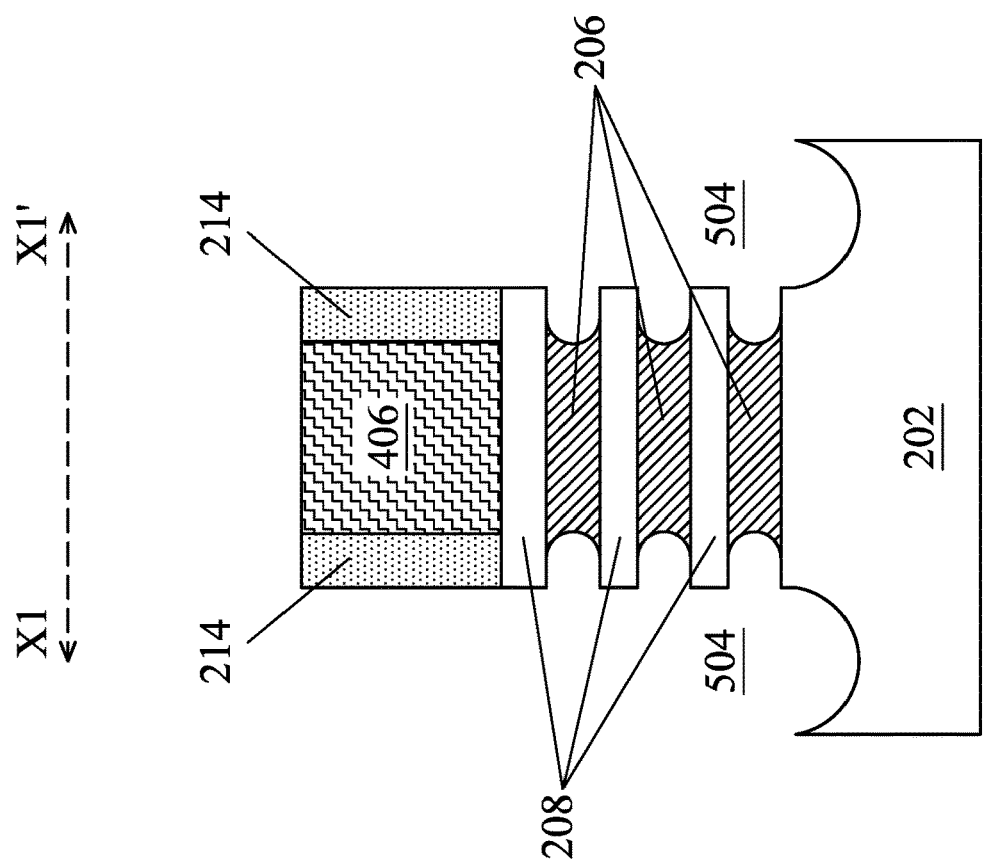

After placing the dummy gate structures 406 over the fins 502A, 502B, source/drain recesses are formed by etching the respective fins 502A, 502B adjacent the dummy gate structures 406 as illustrated in FIGS. 5D and 5E respectively. First source drain recess 504 is provided in fin 502A as illustrated in FIG. 5D; a second source drain recess 504 is provided in fin 502B as illustrated in FIG. 5E. The etching process can include a dry etching process, a wet etching process, other suitable etching process, or combinations thereof. In some embodiments, the etching process is a multi-step etch process. In some implementations, recesses 504 in both the fin 502A and 502B are etched concurrently. The etching forms the recesses 504 (for example, of similar depth) that extend below the lower epitaxial layers (e.g., 206/208). In some embodiments, the recesses 504A and 504B extend partially under dummy gate 406. In particular, the etching processes may laterally etch the semiconductor layers 206 reducing their length in x-direction.

After forming the recesses 504A and/or 504B, a dielectric layer 506 is formed on the sidewalls of the recesses 504A and 504B as illustrated in FIGS. 5F and 5G. The dielectric layer 506 may fill space extending under the dummy gate 406 provided by the lateral etch of semiconductor layers 206. In an embodiment, the dielectric layer 506 is a low-k dielectric material such as a dielectric material including oxygen, carbon, and/or nitrogen. In some implementations, another dielectric layer 508 is deposited over the dielectric layer 506 to fill the recesses 504A, 504B. In an embodiment, the another dielectric layer 508 includes an oxide layer. In some implementations, the oxide layer may have an oxide-rich composition. Other suitable compositions of dielectric materials are also possible including those that provide an etch selectivity between the dielectric layer 506 and the dielectric layer 508. The deposition of dielectric layers 506 and/or 508 may be performed by CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), other suitable methods, or combinations thereof. After the deposition of dielectric layers 506 and/or 508, a planarization process such as a chemical mechanical polish (CMP) may be performed for example, stopping at a top of the dummy gate 406.

Figure 5I:
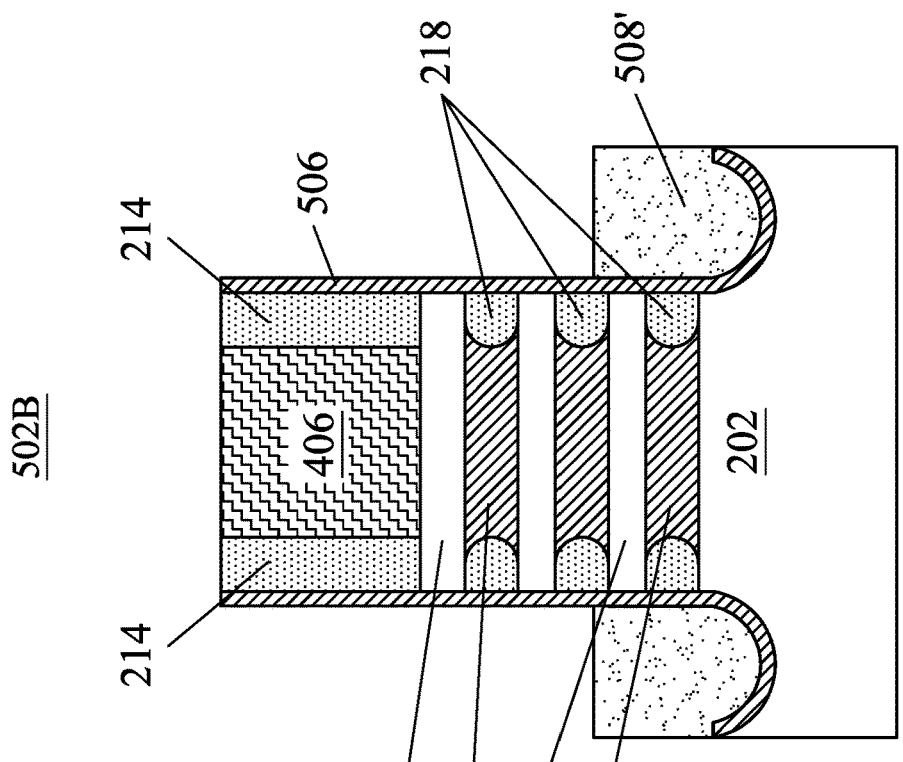
Figure 5H:
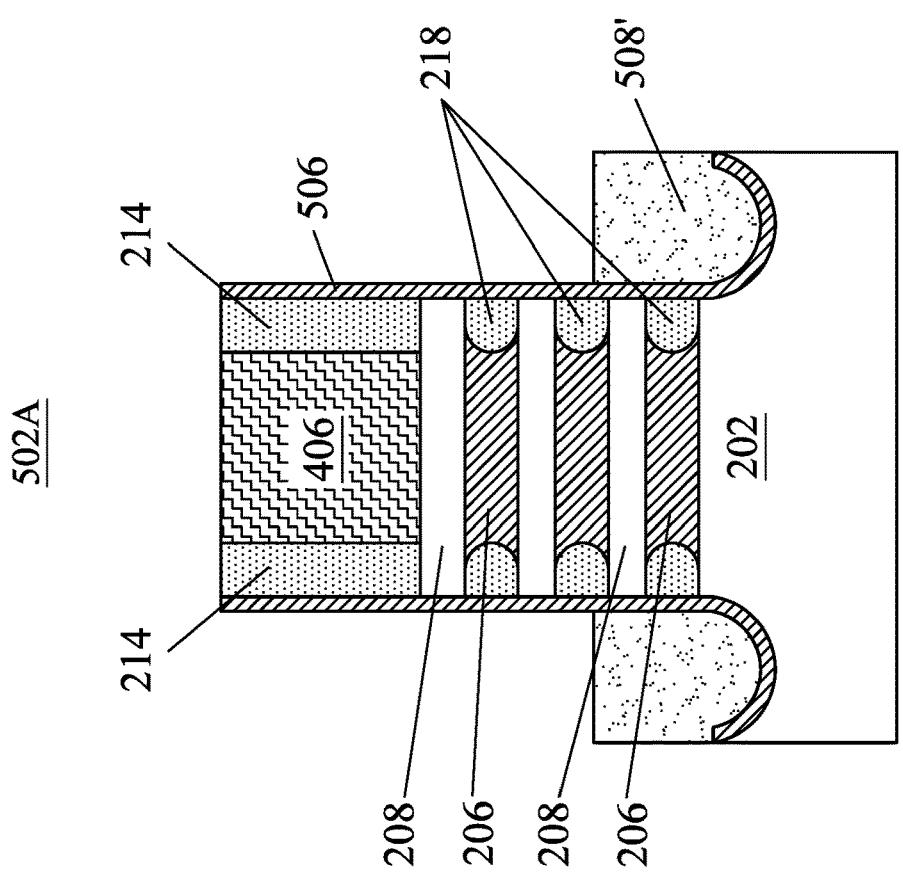

Referring to the example of FIGS. 5H and 5I, the dielectric layer 508 is etched back to form etched back dielectric layer 508'. The etched back dielectric layer 508' has a top surface that is above at least one bottom semiconductor layer 206 and/or at least one bottom semiconductor layer 208. The depth of the etch back defines the channel configuration of the device to be formed on fin 502B. For example, the semiconductor layer or layers 208 (nanostructures) that lie below the top surface of the dielectric layer 508' will not be configured as channel layers in the device formed on fin 502B. The etching back process of the dielectric layer 508 may include a suitable wet etch or dry etching process including processes that provide etch selectivity between the dielectric layer 508 and the dielectric layer 506.

Figure 5K:
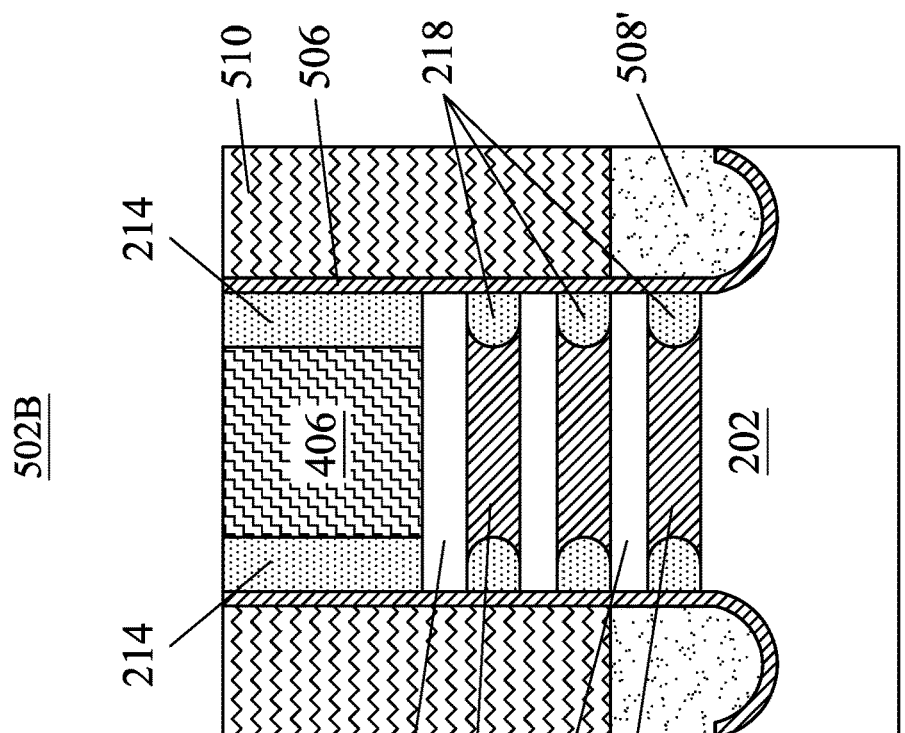
Figure 5J:
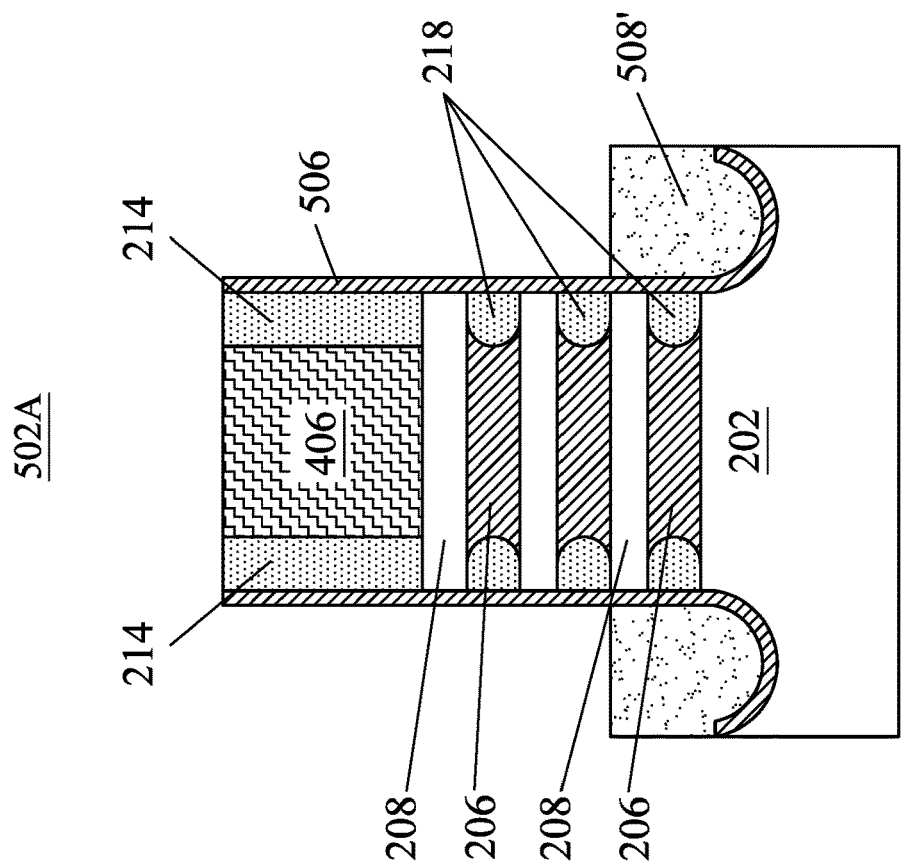

Referring to FIGS. 5J and 5K, a masking element 510 is provided in the recess 504 of the fin 502B over the etched back dielectric layer 508', while exposing the etched back dielectric layer 508' in the recess 504 of the fin 502A. The masking element 510 may include a hard mask material such as silicon nitride, photoresist, and/or other suitable materials.

Figure 5L:
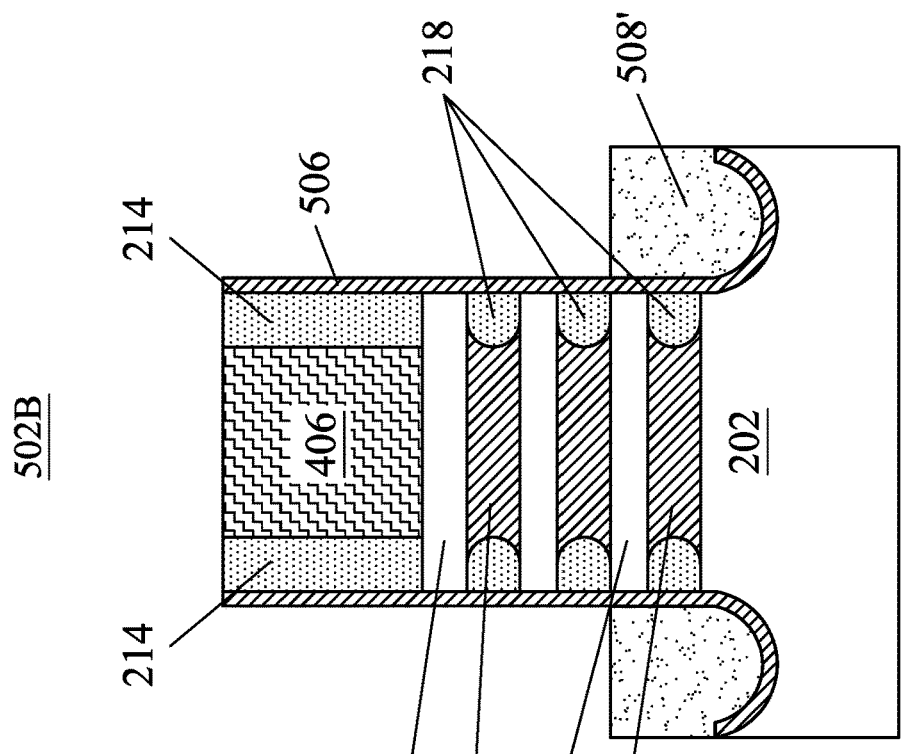
Figure 5M:
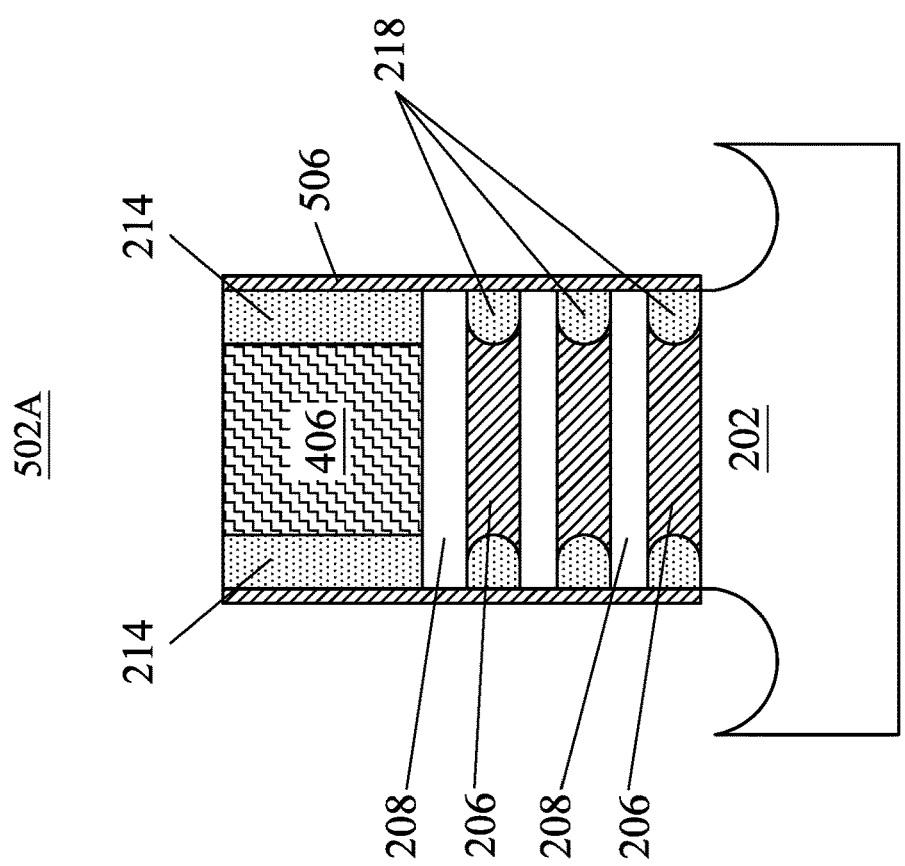

Referring to FIGS. 5L and 5M, the etched back dielectric layer 508' is removed from the fin 502A. The removal process may include suitable etching such as wet etch, dry etch, and/or other suitable processes. In some implementations, the masking element 510 protects the etched back dielectric layer 508' from removal for the fin 502B during the removal of the etched back dielectric layer 508' from the fin 502A. After removing the etched back dielectric layer 508' from the fin 502A, the masking element 510 may be removed (e.g., by stripping). The dielectric layer 506 may also be removed from a bottom portion of the recess 504 in fin 502A thereby exposing a semiconductor surface (e.g., substrate 202) suitable to provide a seed area for subsequent epitaxial growth processes.

Figure 5O:
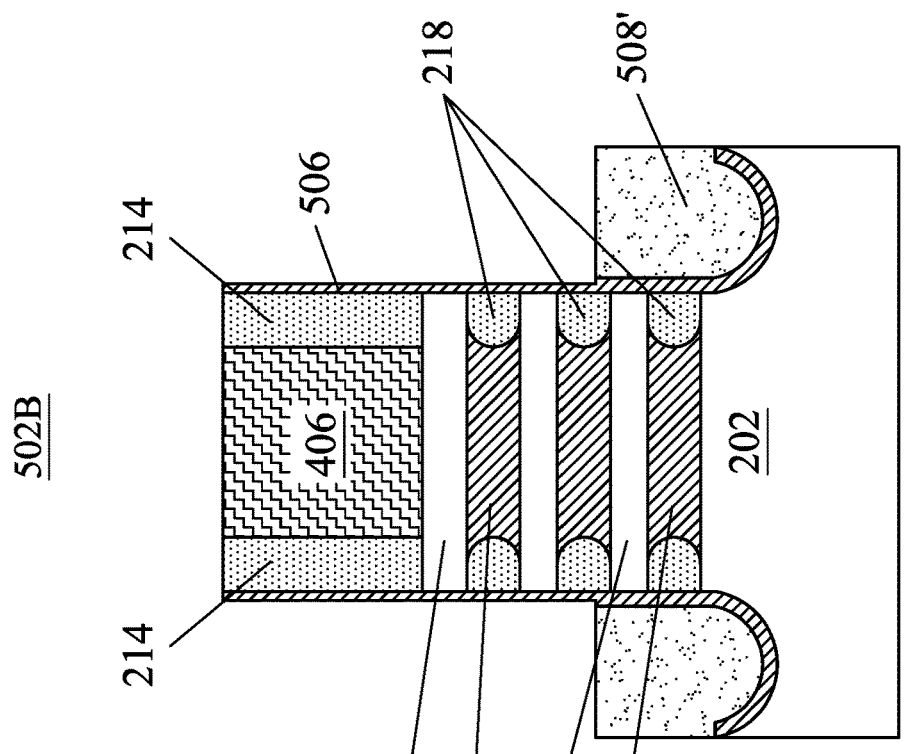
Figure 5N:
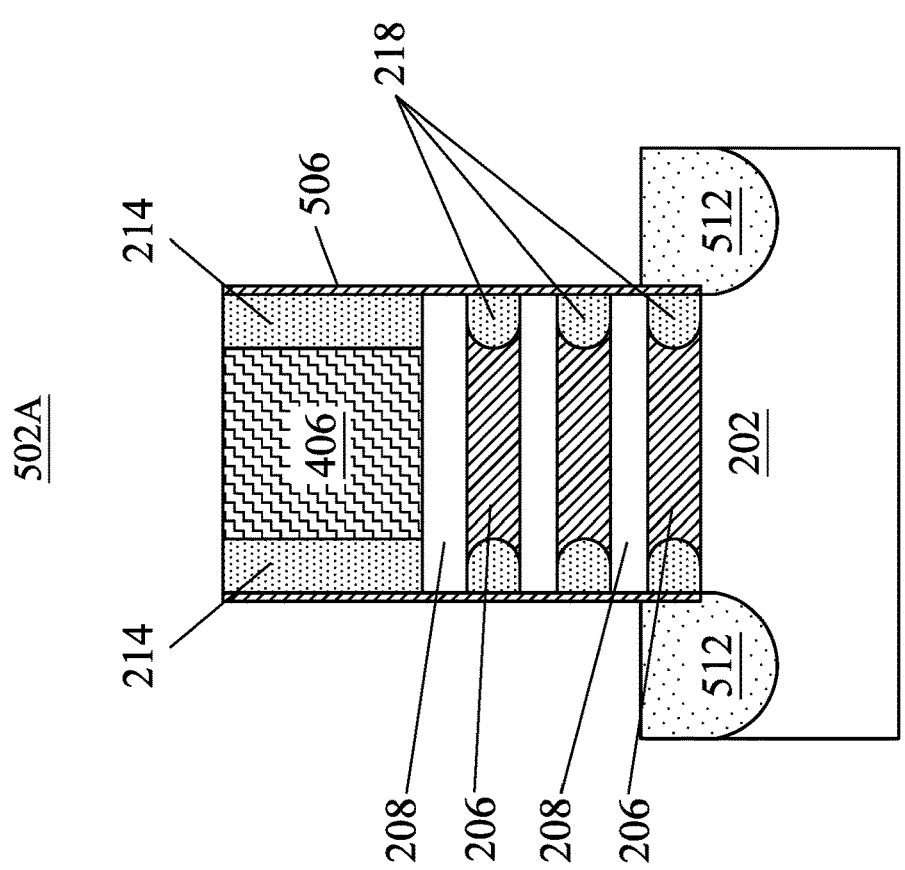
Figure 5R:
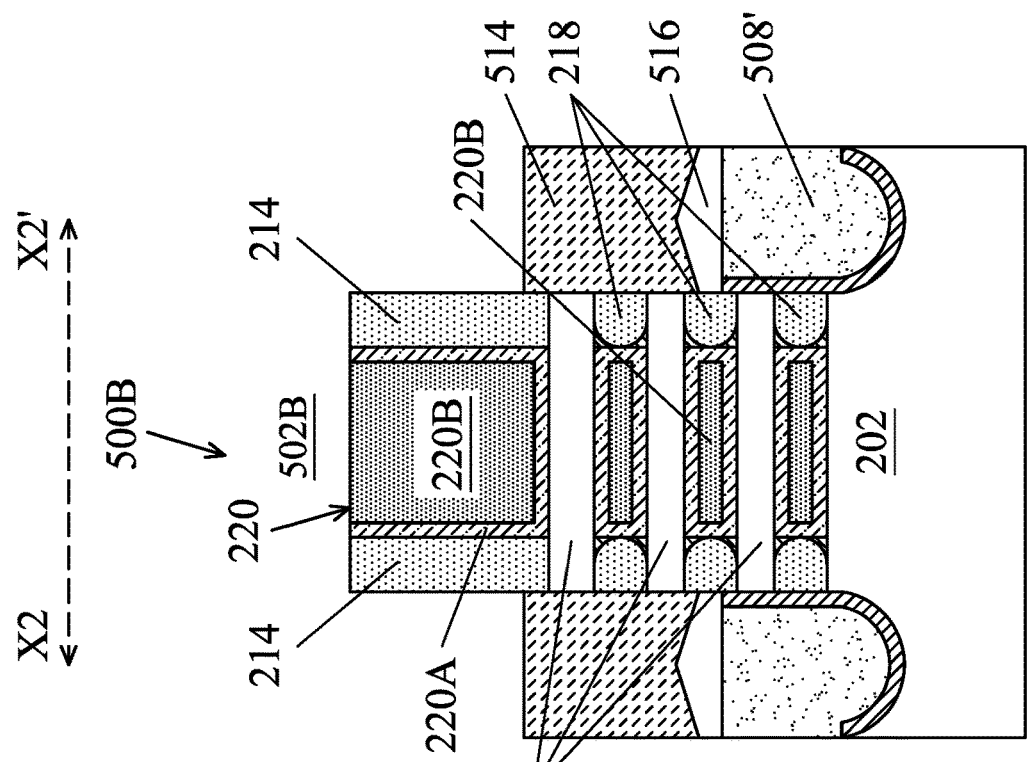
Figure 5S:
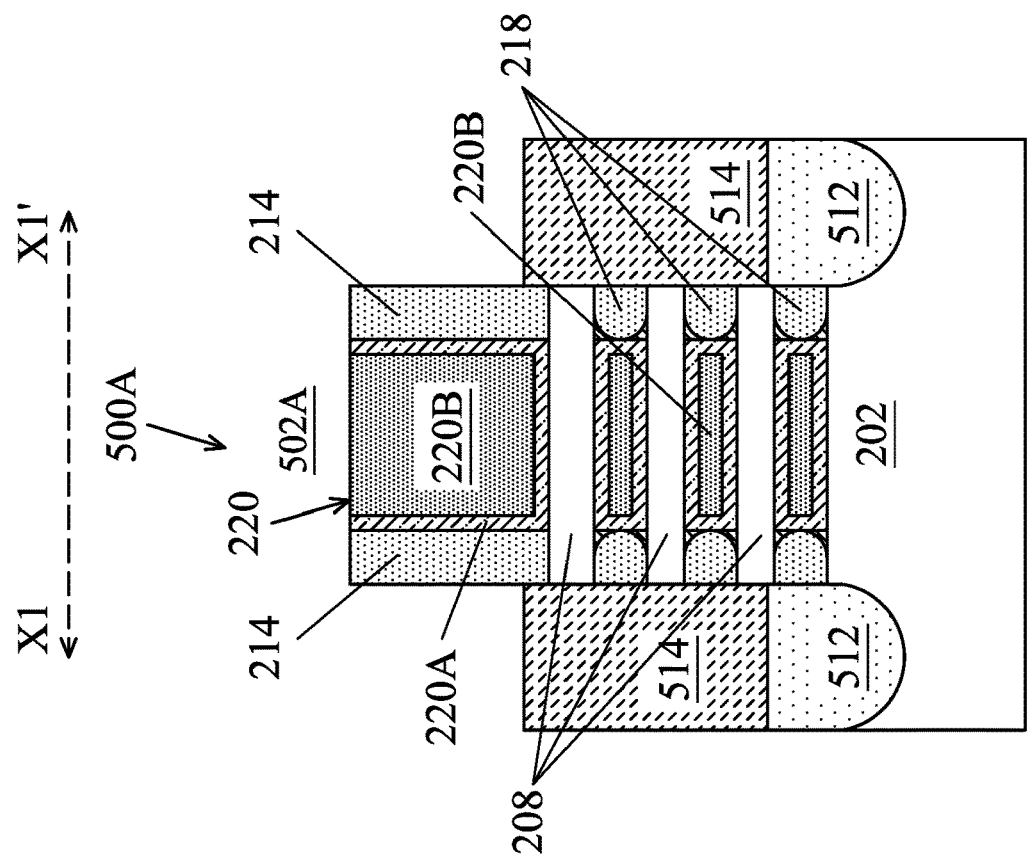

Referring to FIGS. 5N and 5O, an epitaxial growth process may be performed to form a first epitaxial portion 512 in the recess 504 of the fin 502A. In some implementations, the first epitaxial portion 512 is an undoped semiconductor material such as silicon, silicon germanium, silicon carbide, and/or other suitable materials.

Referring to the FIGS. 5P and 5Q, in some implementations, the exposed dielectric layer 506 may be trimmed. The trimming process may employ an etching process to decrease the thickness of the dielectric layer 506. In some implementations, the dielectric layer 506 is etched back or trimmed such that it is contained in the gap between semiconductor layers 208 under the gate structure 406—forming inner spacers 218. In some implementations, after the etching back of the dielectric layer 506 to form inner spacers 218, additional epitaxial growth processes are performed to fill the source/drain recesses 404A, 404B. In other implementations, the dielectric layer 506 may be further etched back prior to forming the epitaxial feature 512.

As illustrated in FIGS. 5P and 5Q, epitaxial material is grown on both the fins 502A and the fins 502B to form source/drain features 514. In some implementations, the source/drain features 514 of fins 502A and 502B may be formed concurrently.

Epitaxial source/drain features 514 formed above the epitaxial feature 512 and the etched back dielectric layer 508' may be doped with suitable n-type dopants and/or p-type dopants. In some embodiments, for the n-type GAA transistors, epitaxial source/drain features 514 include silicon. Epitaxial source/drain features 514 for an n-type GAA transistor can be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, for the p-type GAA transistors, epitaxial source/drain features 514 include silicon germanium or germanium. For example, epitaxial source/drain features 514 can be doped with boron, other p-type dopant, or combinations thereof (for example, forming Si:Ge:B epitaxial source/drain features). In some embodiments, epitaxial source/drain features 514 include more than one epitaxial semiconductor layer, where the epitaxial semiconductor layers can include the same or different materials and/or dopant concentrations. In some embodiments, epitaxial source/drain features 514 are doped during deposition by adding impurities to a source material of the epitaxy process (i.e., in-situ). In some embodiments, epitaxial source/drain features are doped by an ion implantation process subsequent to a deposition process. In some embodiments, annealing processes (e.g., rapid thermal annealing (RTA) and/or laser annealing) are performed to activate dopants in epitaxial source/drain features 514. The epitaxial features 514 disposed on the fin 502A may be the same or different in composition and/or conductivity (n-type or p-type) than the epitaxial features 514 disposed on the fin 502B.

A gap 516 may be formed between the etched back dielectric layer 508' and the epitaxial features 514 formed on the fin 502B. The gap 516 may result from the epitaxial growth on the exposed semiconductor material (e.g., semiconductor layer 208) being faster than the growth (if any) on the exposed dielectric material (e.g., etched back dielectric layer 508', inner spacer 218).

After formation of the source/drain features 514, an interlayer dielectric may be formed over the source/drain features and adjacent the dummy gate structure 406. The dummy gate structure 406 may be subsequently removed, followed by a channel release process etching the semiconductor layers 206 from the channel region. A gate structure 220 may then be formed including gate dielectric 220A and gate electrode 220B materials. The gate structure 220 may be a metal gate structure substantially similar to as discussed above. The gate structures 220 surround the nanostructures of the released nanostructures of semiconductor layers 208 providing channel regions. Further processing including forming multi-layer interconnect (MLI) features providing interconnect lines, vias and interposing dielectric layers. The gate structure 220 and the source/drain features 514 formed on fin 502A form a device (GAA transistor) 500A; gate structure 220 and the source/drain features 514 formed on fin 502B form a device (GAA transistor) 500B.

The channel region of the device 500A formed on fin 502A differs from the channel region of the device 500B formed on fin 502B. Because certain, lower nanostructures or sheets (semiconductor layers 208) in the channel region of the device 500B lack an adjacent or interfacing semiconductor source/drain region, the device has a decreased channel region. For example, there is little to no current flow within the bottom epitaxial layer 208 and/or the substrate 202 of the fin 402B. Thus, the device 500B has in effect a channel configuration of a reduced number nanostructures providing channel regions.

Figures 6A, 6B, 6C:
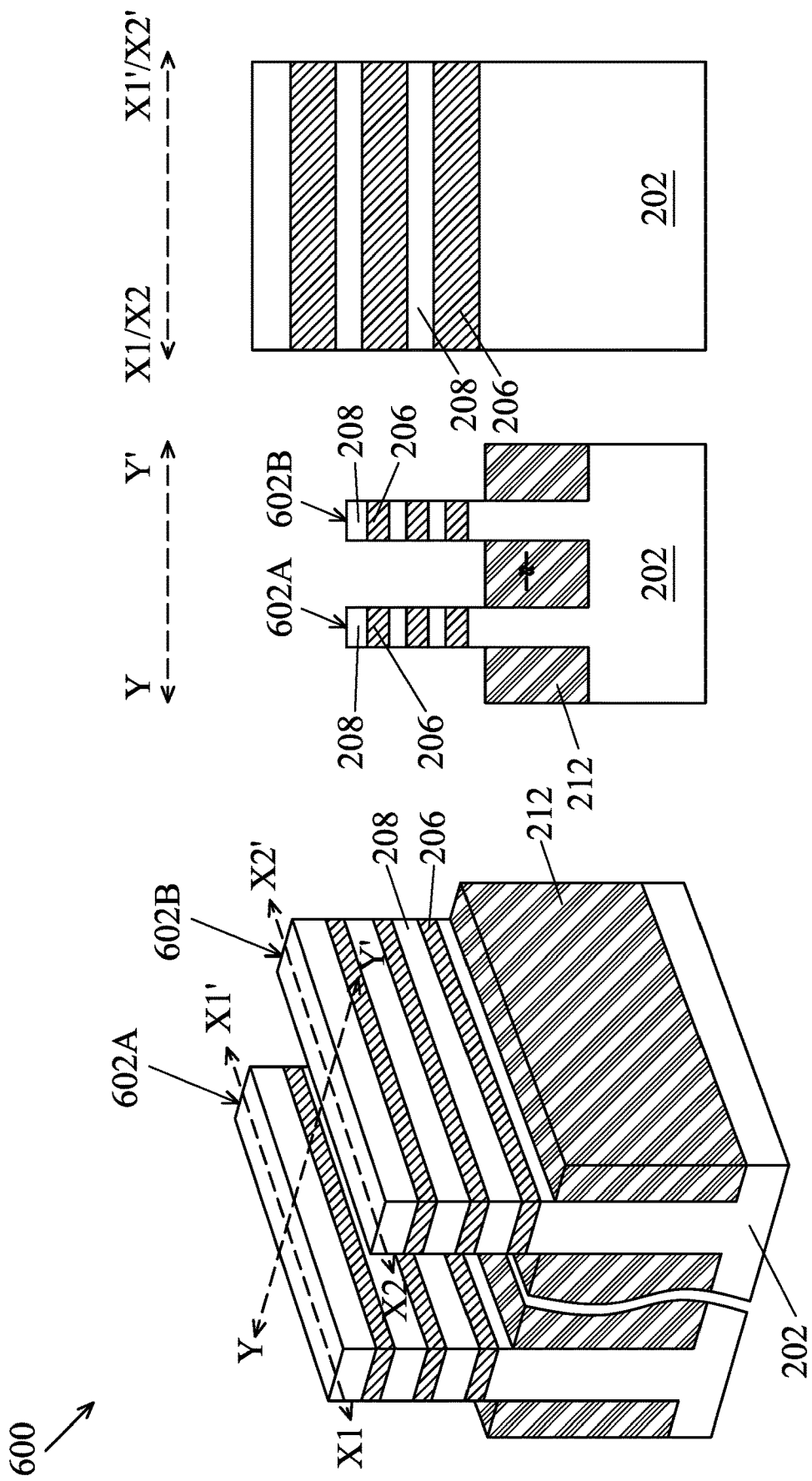
FIGS. 6A-6K are fragmentary diagrammatic views of another multigate device, in portion or entirety, at various fabrication stages according to various aspects of the present disclosure including manipulating the source/drain configuration of a device through providing a dopant profile.

Turning to FIGS. 6A-6K, illustrated is another method of forming devices having different channel configurations. FIGS. 6A, 6B, and 6C illustrate a multigate device 600 that is substantially similar to as discussed above with reference to the structure of FIGS. 4A, 4B, and 4C. Fins 602A, 602B are formed.

Figure 6E:
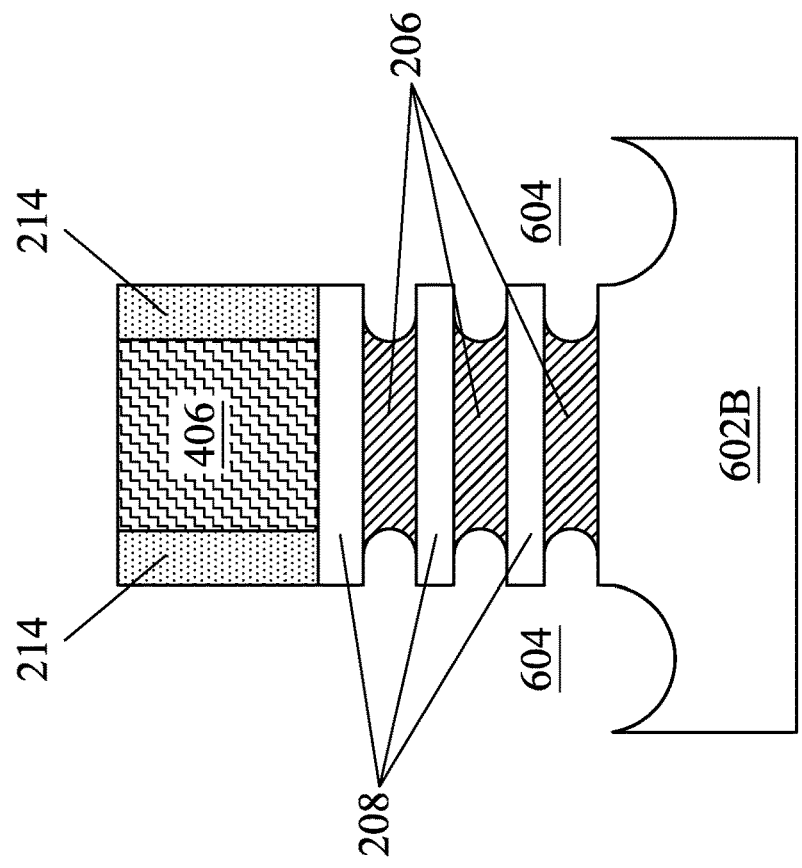
Figure 6D:
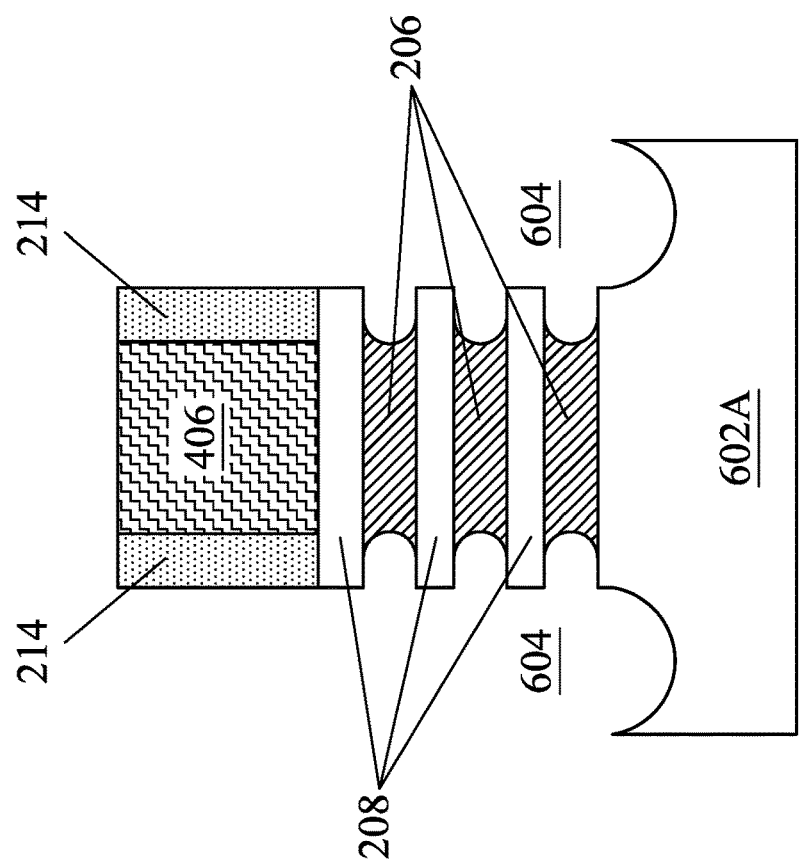

After placing the dummy gate structures 406 over the fins 602A, 602B, source/drain recesses are formed by etching the respective fins 602A, 602B adjacent the dummy gate structures 406. First source drain recess 604 is provided in fin 602A as illustrated in FIG. 6D; a second source drain recess 604 is provided in fin 602B as illustrated in FIG. 6E. The etching process can include a dry etching process, a wet etching process, other suitable etching process, or combinations thereof. In some embodiments, the etching process is a multi-step etch process. In some implementations, both the fins 602A and 602B are etched concurrently to form recesses 604. The etching forms the recesses 604 that extend below the lower epitaxial layers (e.g., 206/208). In some embodiments, the recesses 604 extend partially under dummy gate 406. In particular, the etching processes may laterally etch the semiconductor layers 206 reducing their length in x-direction.

Figure 6G:
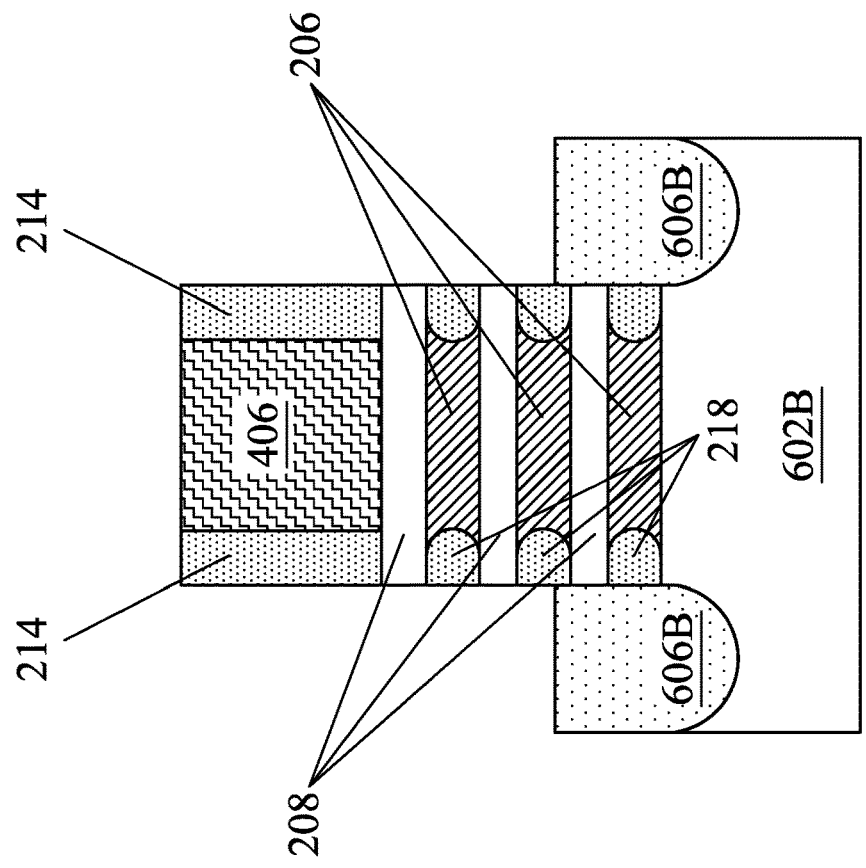
Figure 6F:
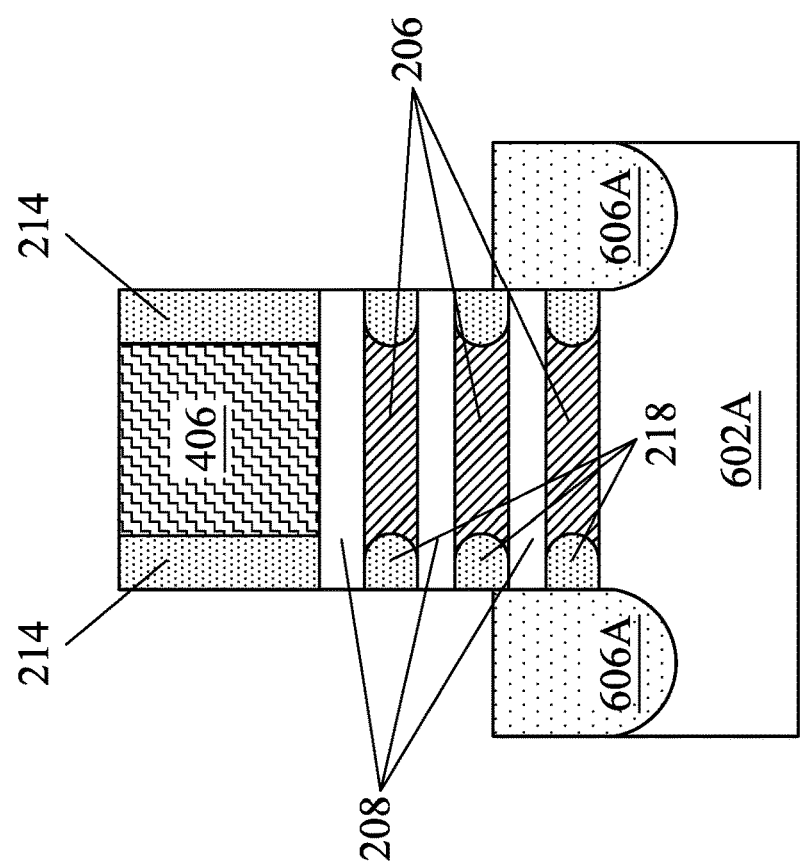

After forming the recesses 604, inner spacers 218 are formed adjacent the recesses 604 and the channel region of the device as illustrated in FIGS. 6F and 6E. Inner spacers 218 may be formed by suitable deposition processes and/or etch back of deposited dielectric. In some implementations, residual portions 206' remain adjacent the inner spacers 218, of the semiconductor layer 208. In some implementations, residual portions 206' include oxide.

Epitaxial features 606 is are formed in the recesses 604 of fins 602A and 602B respectively. Epitaxial material 606 may be an undoped semiconductor material such as silicon, silicon germanium, silicon carbide or the like. The epitaxial features may have a top surface above at least one pair of the 208/206 semiconductor layer. The height of the epitaxial features 606 defines which nanostructures will not form channel regions within device formed on fin 602B.

Figure 6I:
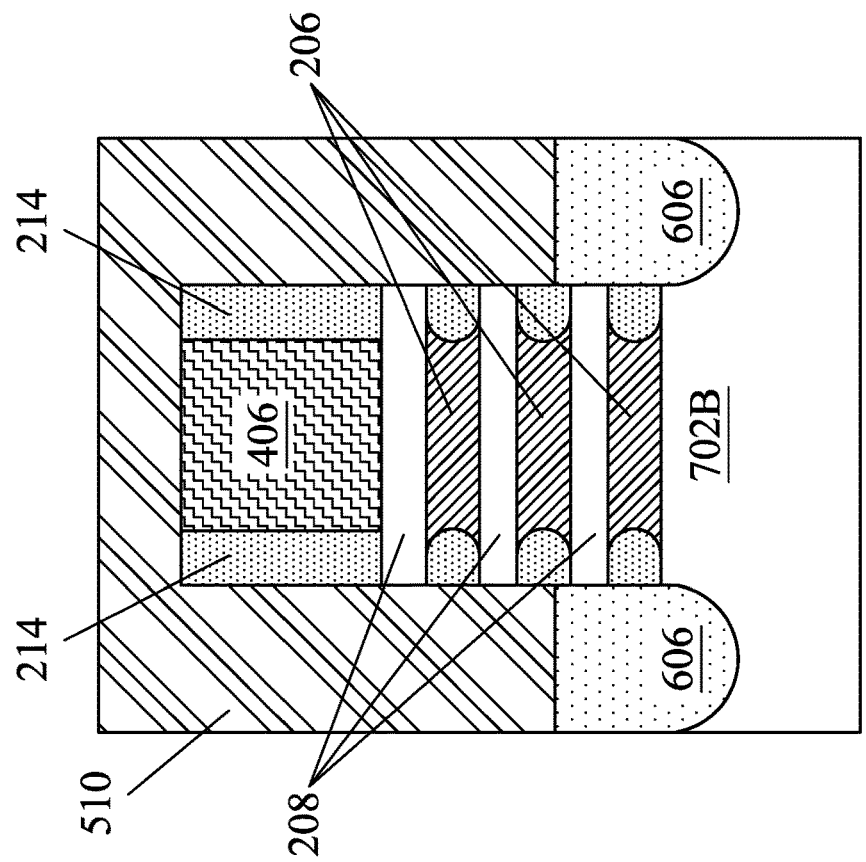
Figure 6H:
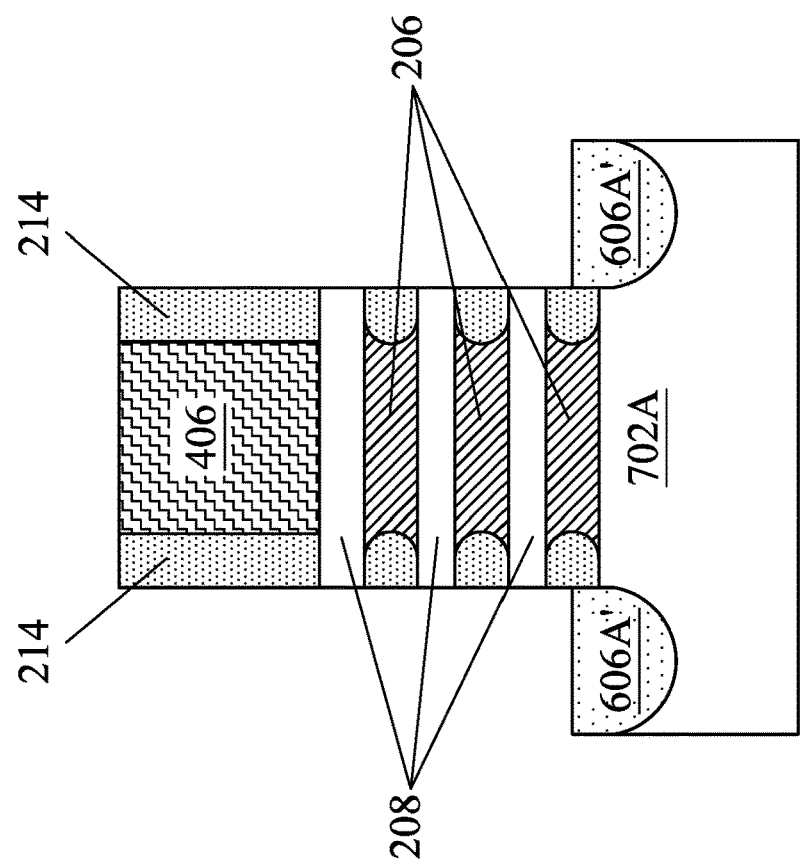

Referring to FIGS. 6H and 6I, a masking element 510 is provided in the recess 604 of the fin 602B, while exposing epitaxial feature 606 disposed in the recess 604 of the fin 602A. The masking element 510 may include a hard mask material such as silicon nitride, photoresist, and/or other suitable materials. While the masking element 510 protects epitaxial feature 606 on fin 602B, the epitaxial feature 606 on fin 602A is etched back to form etched back epitaxial material 606A' having a reduced height. In an embodiment, the epitaxial material 606A is etched back such that it has a top surface coplanar with a region of a bottom semiconductor layer 206. After the etch back, the masking element 510 is removed from the substrate (e.g., stripped).

Figure 6K:
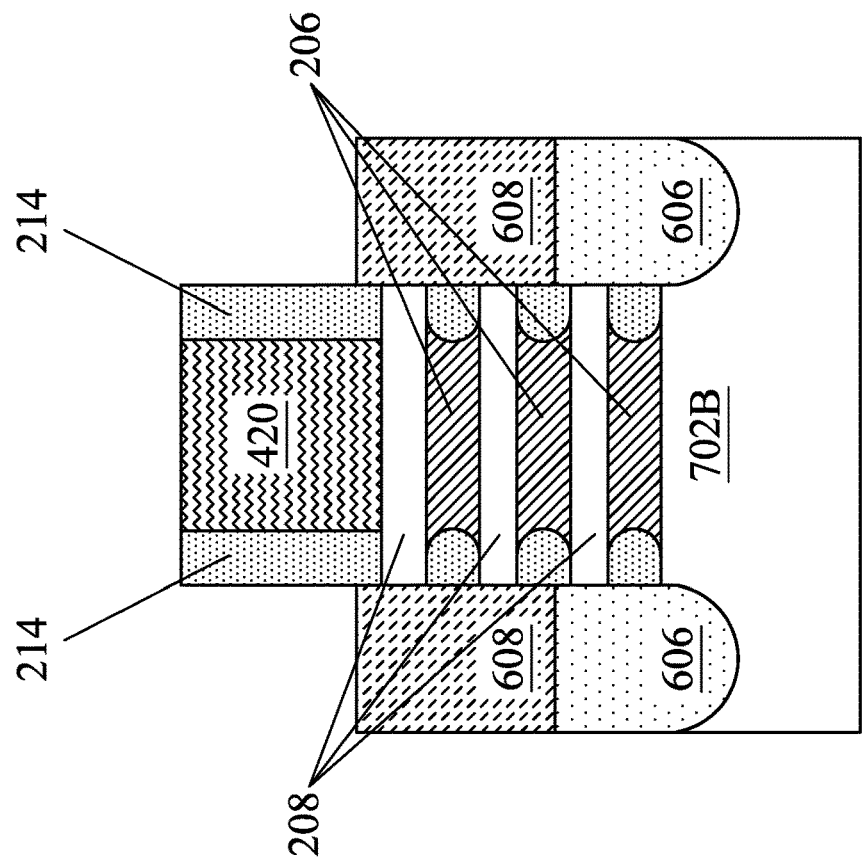
Figure 6J:
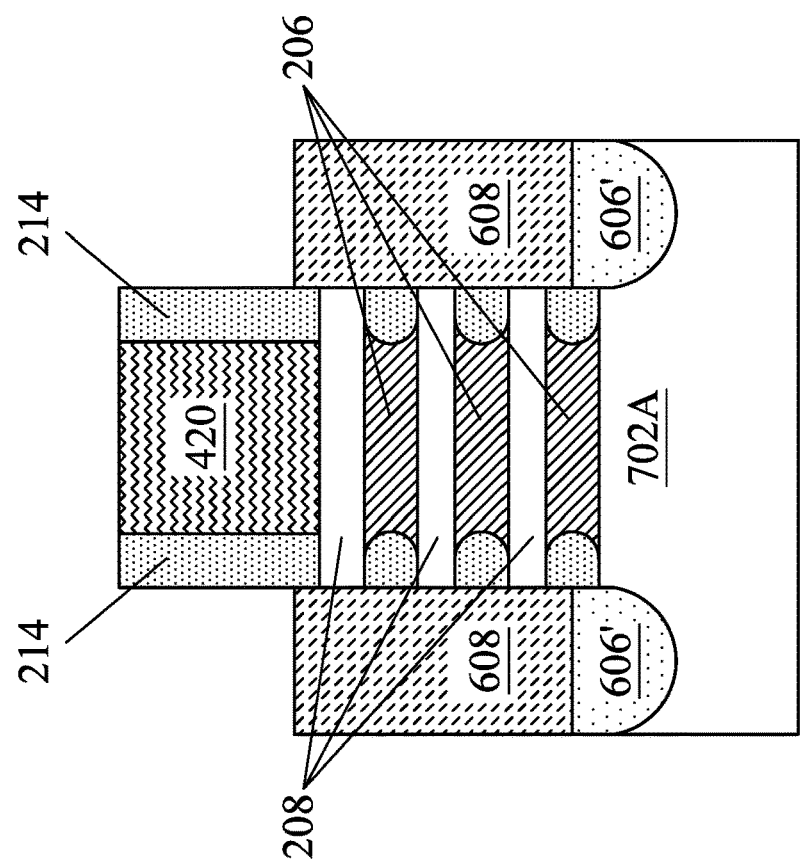

Referring to FIGS. 6J and 6K, source/drain epitaxial material 608 are formed filling the recesses 604 of the fins 602A and 602B respectively. The source/drain epitaxial material 608 may be formed concurrently in some implementations. The source/drain epitaxial material 608 formed in the recess 604 of fin 602A is formed on the etched back epitaxial material 606'. The source/drain epitaxial material 608B is formed on the epitaxial material 606. In some implementations, the source/drain epitaxial material 608 are formed in different processes and/or have different materials (e.g., conductivity).

Source/drain epitaxial features 608 formed above the epitaxial feature 606A' and 606 in each fin 602A and 602B respectively may be doped with suitable n-type dopants and/or p-type dopants. In some embodiments, for the n-type GAA transistors, epitaxial source/drain features 608 include silicon. Epitaxial source/drain features 608 for an n-type GAA transistor can be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, for the p-type GAA transistors, epitaxial source/drain features 608 include silicon germanium or germanium. Epitaxial source/drain features 608 can be doped with boron, other p-type dopant, or combinations thereof (for example, forming Si:Ge:B epitaxial source/drain features). In some embodiments, epitaxial source/drain features 608 include more than one epitaxial semiconductor layer, where the epitaxial semiconductor layers can include the same or different materials and/or dopant concentrations. In some embodiments, epitaxial source/drain features 608 are doped during deposition by adding impurities to a source material of the epitaxy process (i.e., in-situ). In some embodiments, epitaxial source/drain features are doped by an ion implantation process subsequent to a deposition process. In some embodiments, annealing processes (e.g., rapid thermal annealing (RTA) and/or laser annealing) are performed to activate dopants in epitaxial source/drain features 608. As explained above, the epitaxial features 608 disposed on the fin 602A may be the same or different compositions and/or dopants than the epitaxial features 608 disposed on the fin 602B.

Similar to as discussed above, the method may continue to remove the dummy gate structure 420, release the channel regions (e.g., remove semiconductor layers 206 from the channel region), and form a metal gate structure 220 surrounding the channel regions. The gate structure 220 and the source/drain features 608 (606') formed on fin 602A form a device (GAA transistor) 600A; gate structure 220 and the source/drain features 608 (606) formed on fin 602B form a device (GAA transistor) 600B. While the physical configuration of the nanostructures and gate structure for device 600A and 600B may be substantially the same, the effective reduction in the channel region of the device 600B is provided by the configuration of the source/drain in device 600B.

Thus, the method of FIGS. 6A-6K illustrate forming an undoped epitaxial material for each of two devices, then etching back undoped epitaxial material on a first device prior to forming the source/drain region leaves a first device and a second device with a different channel configuration. In particular, by modifying the source/drain configuration, a reduction in the nanostructures or sheets operating as channel regions in the second device may be provided.

Figure 7B:
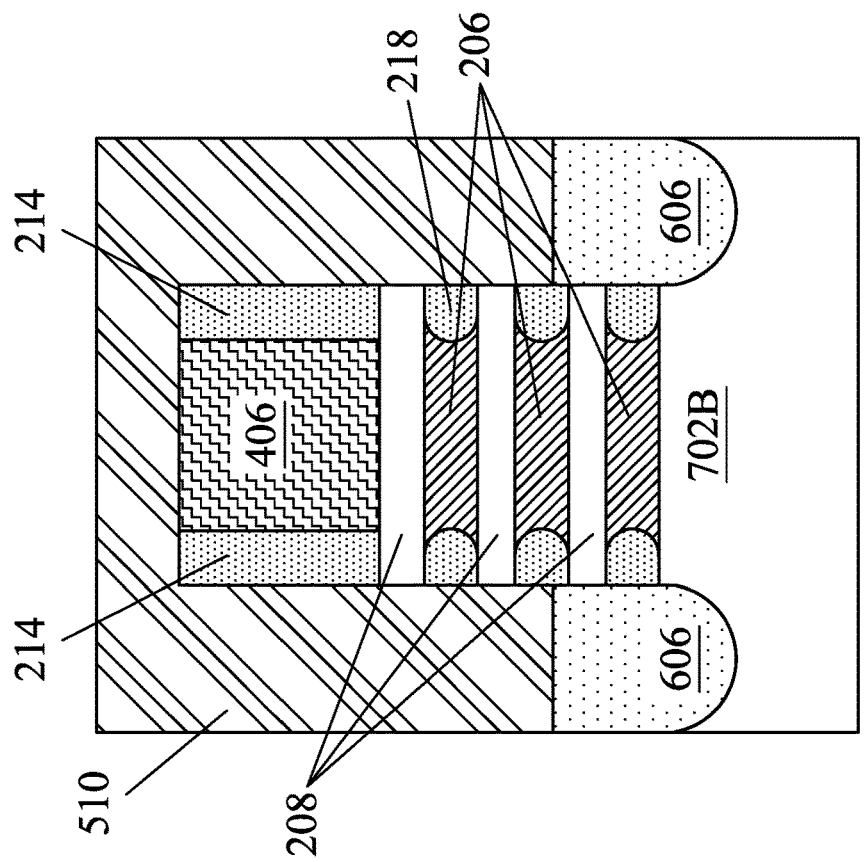
FIGS. 7A-7D are fragmentary diagrammatic views of another multigate device, in portion or entirety, at various fabrication stages according to various aspects of the present disclosure including manipulating the source/drain configuration of a device through providing another dopant profile.
Figure 7A:
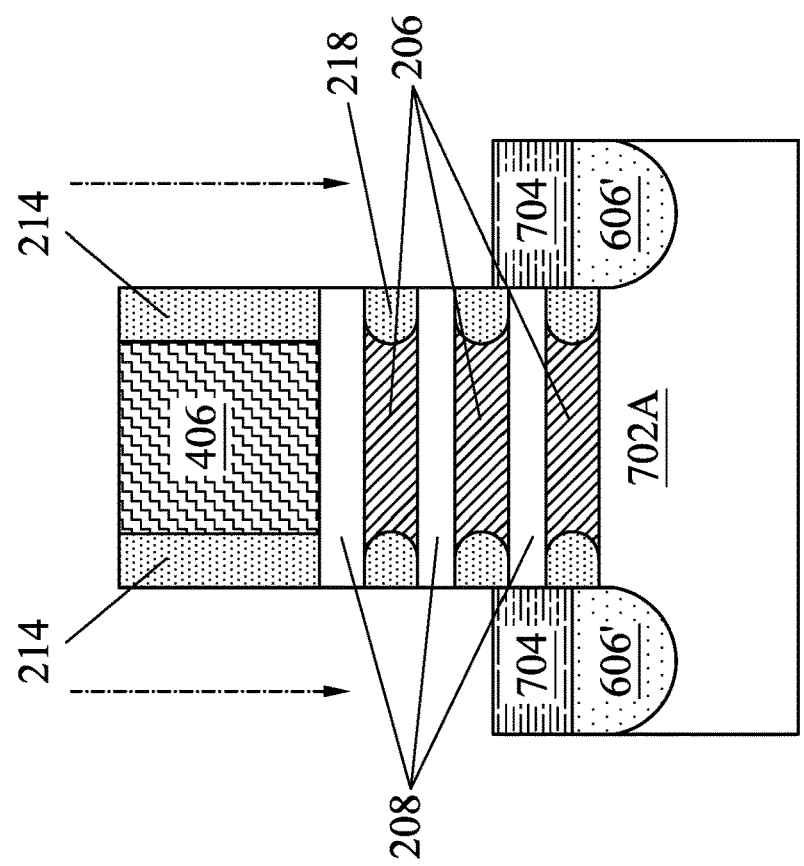

Referring now to FIGS. 7A-7D, illustrated is another method modifying a configuration the source/drain structures to provide for devices having a different channel region configuration. The method illustrated in FIGS. 7A-7D shares similarities with the formation of the device 600A and 600B discussed above. After providing one or more steps illustrated in FIGS. 6A-6G to form fins 702A and 702B substantially similar to fins 602A and 602B above, the epitaxial features 606 are provided as illustrated in FIGS. 6F and 6G. Referring then to FIGS. 7A and 7B, a masking layer 510 is placed over the epitaxial material 606 formed in the recess of fin 702B. An implantation process is performed on an upper portion of the exposed epitaxial material 606 formed in a recess of fin 702A. Thus, a doped epitaxial region 704 is formed of a portion of the epitaxial material 606 on the fin 702A. As discussed above, the epitaxial material 606 may be undoped semiconductor material, such as undoped silicon. For providing a device on fin 702A as a p-fet device, the dopant of the implantation process may include boron or other suitable p-type dopant. For providing a device on fin 702A as an n-fet device, the dopant may include arsenic, phosphorous, and/or other suitable n-type dopant. The implantation forms a source/drain epitaxial region 704 from a portion of the epitaxial material 606A. The remaining undoped epitaxial feature 606 of in 702A has been decreased in height and is referred to as epitaxial feature 606'.

Figure 7C:
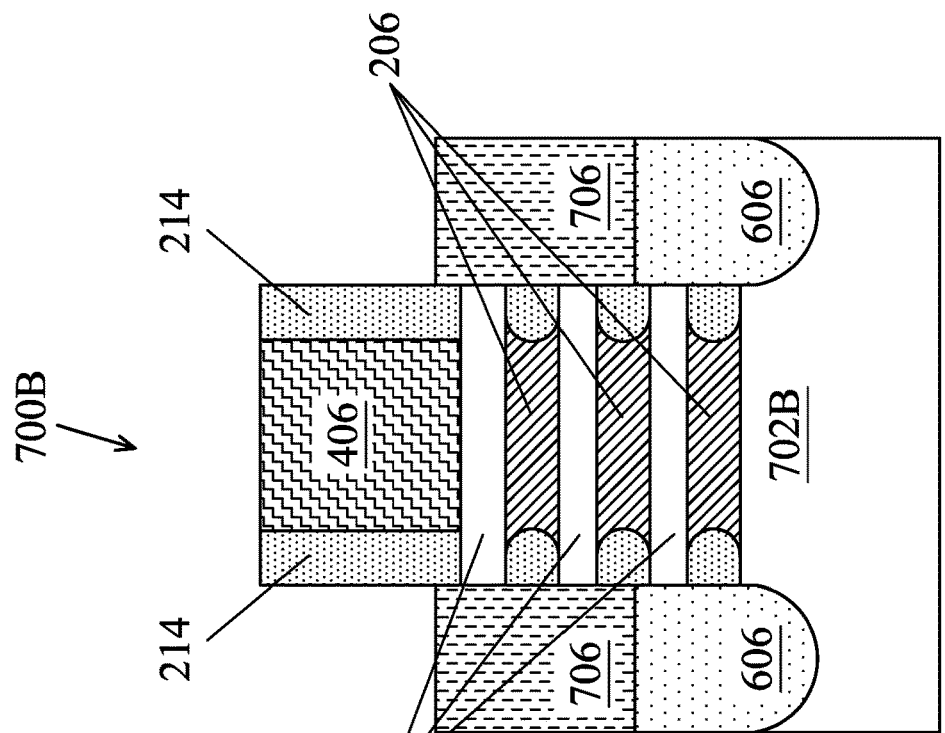
Figure 7D:
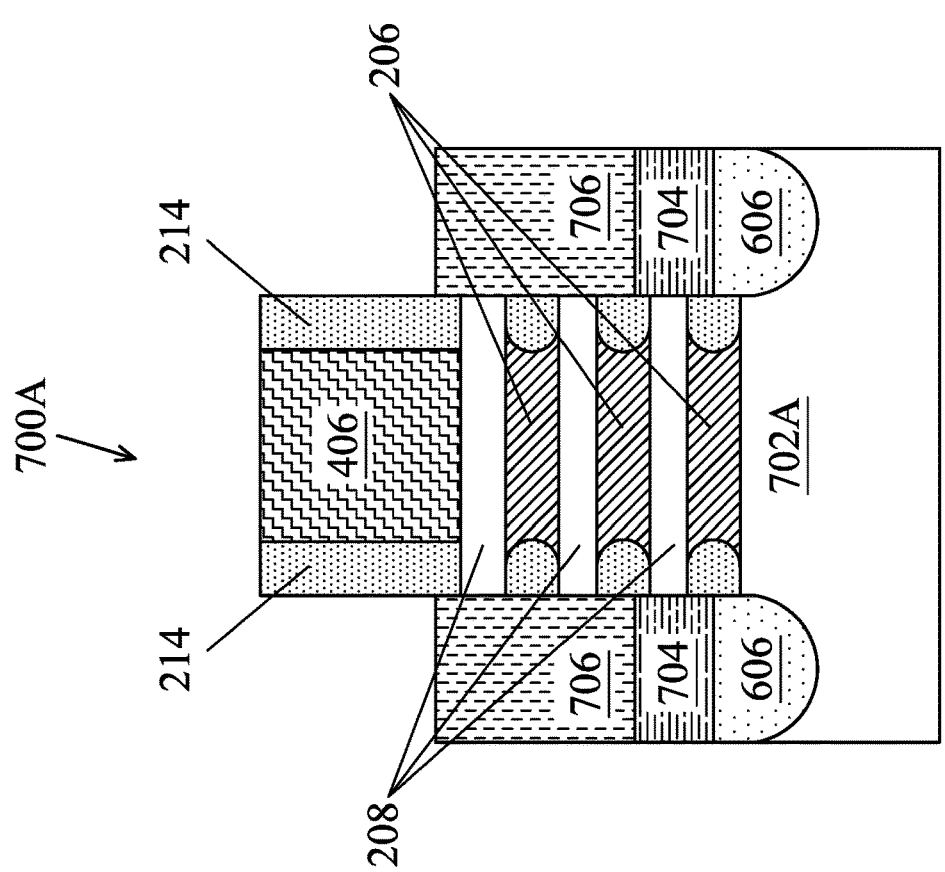

As illustrated in FIGS. 7C and 7D, source/drain epitaxial material 706 is then grown on the exposed portion of the doped region 704 on the fin 702A and/or over the epitaxial material 606 (e.g., undoped epitaxial material) over the fin 702B. In an embodiment, the epitaxial source/drain features 706 for an n-type GAA transistor can be doped with carbon, phosphorous, arsenic, other n-type dopant, or combinations thereof (for example, forming Si:C epitaxial source/drain features, Si:P epitaxial source/drain features, or Si:C:P epitaxial source/drain features, or Si:As). In some embodiments, for the p-type GAA transistors, epitaxial source/drain features 706 include silicon germanium or germanium or germanium tin (GeSn). Epitaxial source/drain features 706 can be doped with boron, other p-type dopant, or combinations thereof (for example, forming Si:Ge:B epitaxial source/drain features). The epitaxial features 706 may be the same or different for the fins 702A and 702B and formed concurrently or by different processes.

Similar to as discussed above, the method may continue to remove the dummy gate structure 420, release the channel regions (e.g., remove semiconductor layers 206 from the channel region), and form a metal gate structure (such as gate structure 220) surrounding the channel regions. A gate structure (such as gate structure 220) and the source/drain features 704, 706 (and undoped epitaxial feature 606') formed on fin 702A form a device (GAA transistor) 700A; gate structure (such as gate structure 220) and the source/drain features 708 (and undoped epitaxial feature 606) formed on fin 702B form a device (GAA transistor) 700B Thus, the method of FIGS. 7A-7D illustrates forming an undoped epitaxial material for each of two devices, implanting a portion of the undoped epitaxial material on a first device prior to forming the doped source/drain epitaxial material on a first device and a second device. In particular, by modifying the source/drain configuration, a reduction of nanostructures (or sheets) providing channel regions in the second device may be provided.

Figures 8A, 8B, 8C:
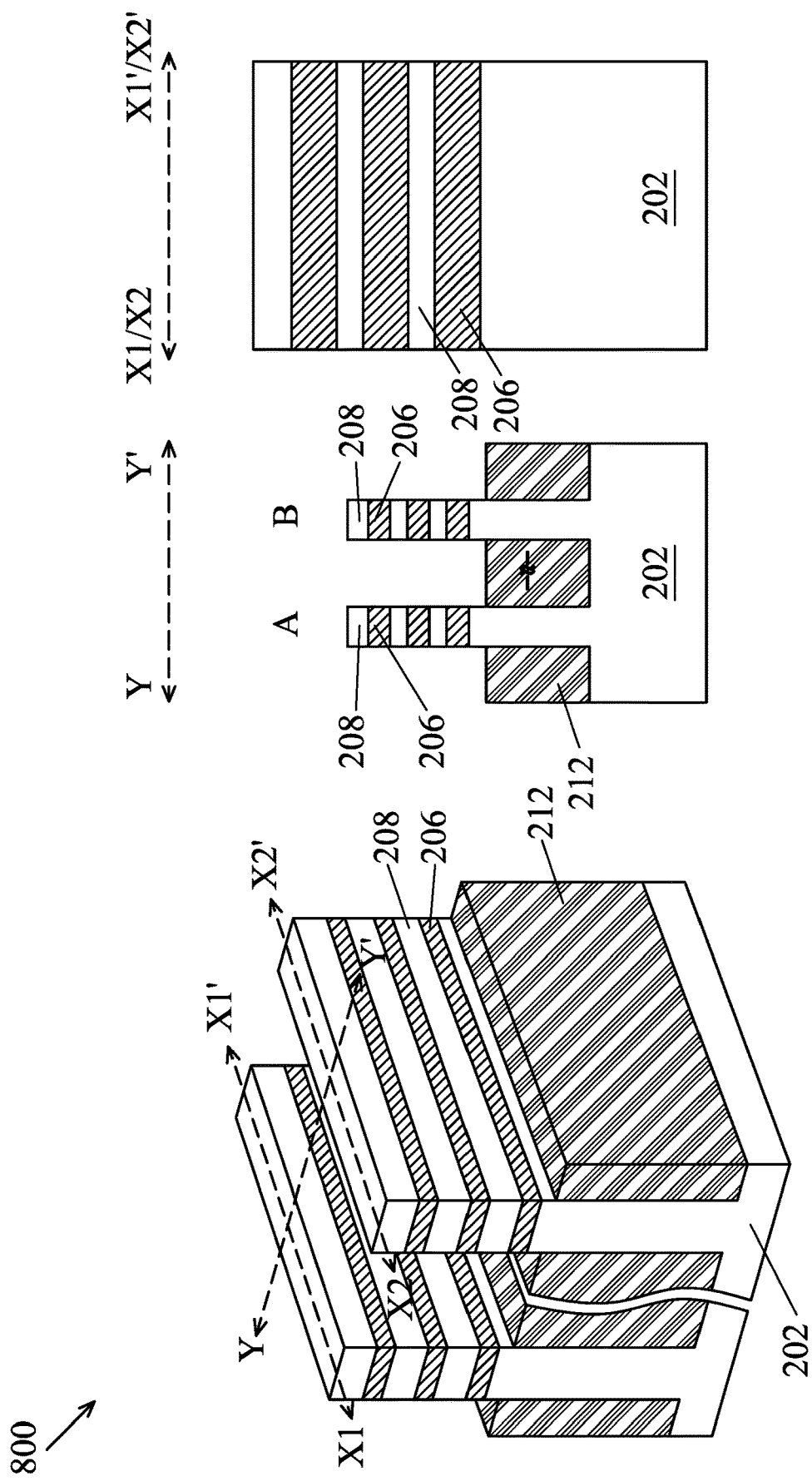
FIGS. 8A-8Q are fragmentary diagrammatic views of another multigate device, in portion or entirety, at various fabrication stages according to various aspects of the present disclosure including configuring an upper channel region.
Figure 8E:
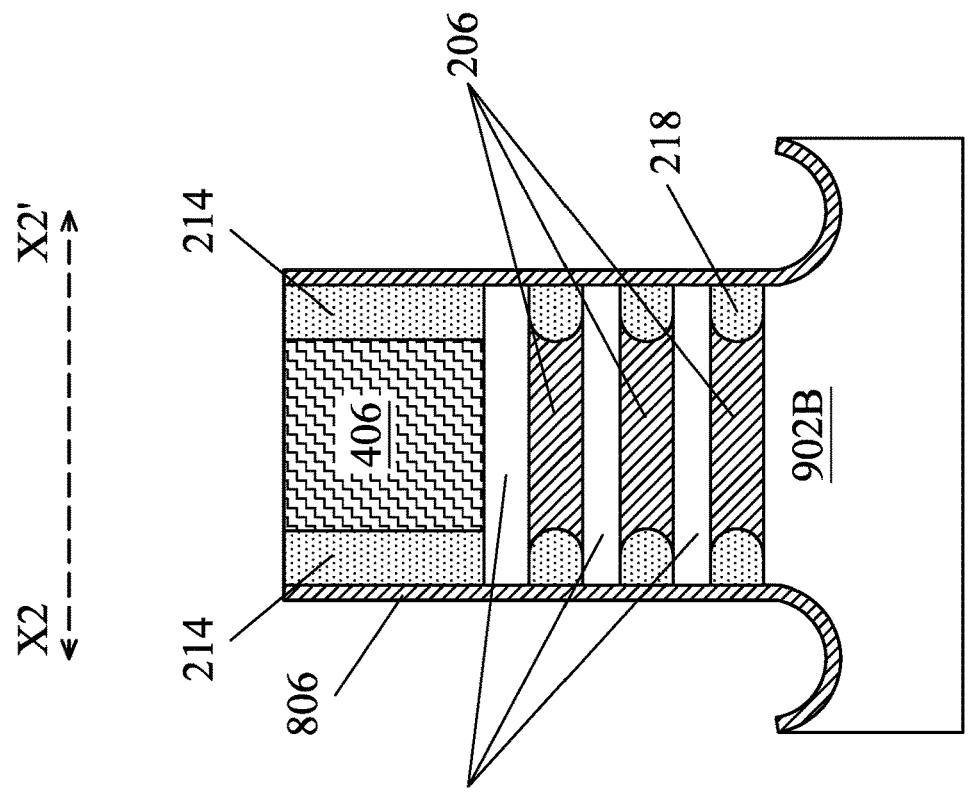
Figure 8D:
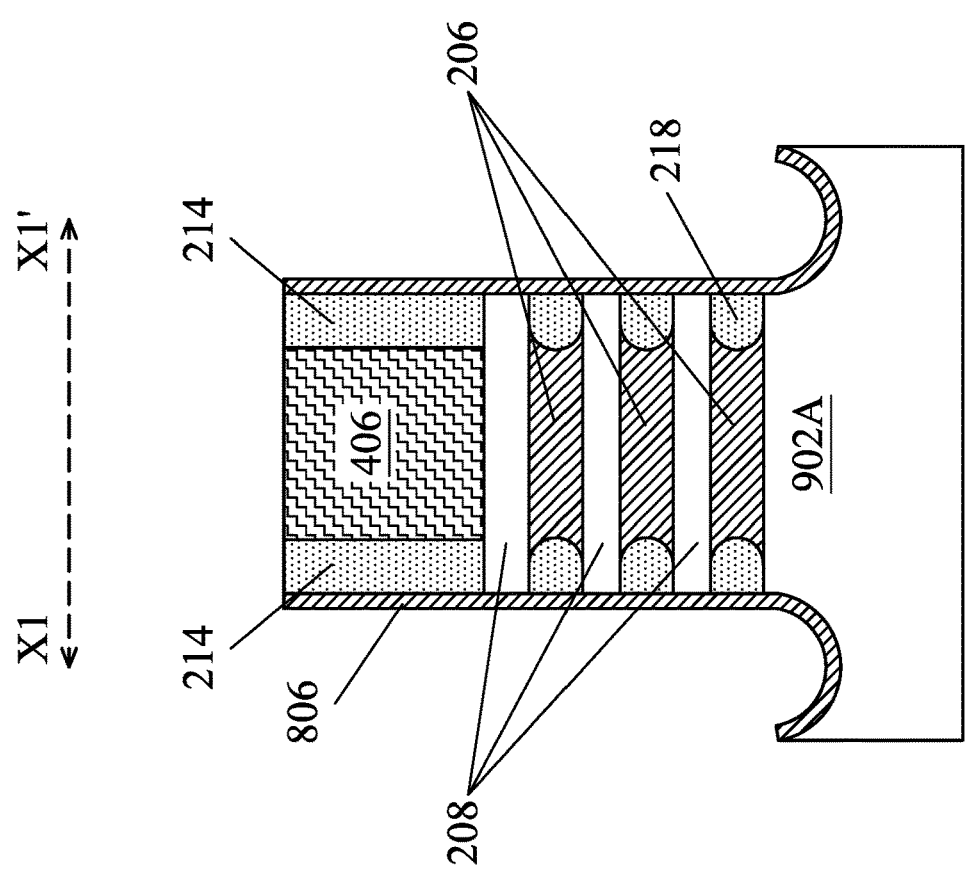
Figure 8G:
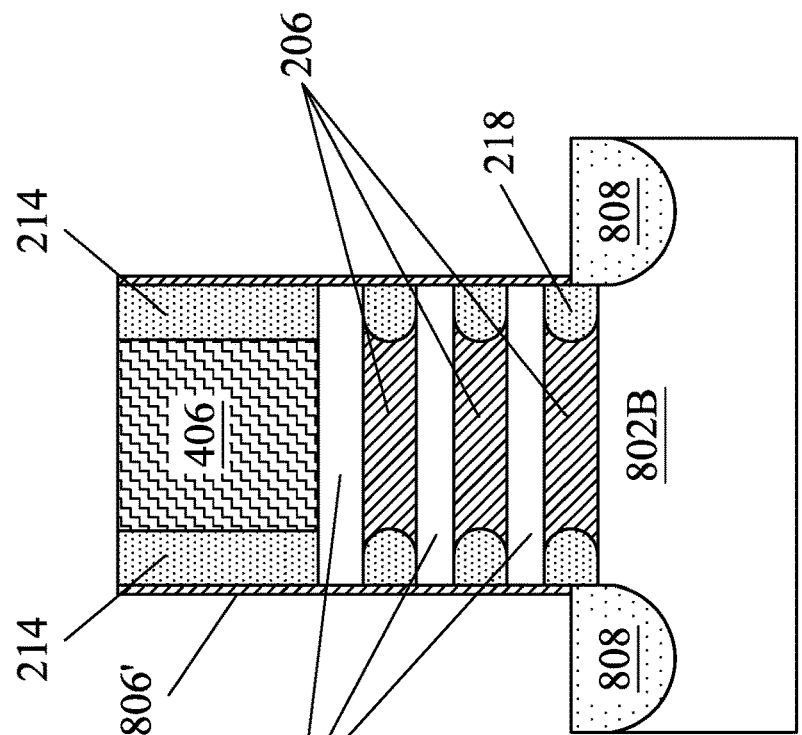
Figure 8F:
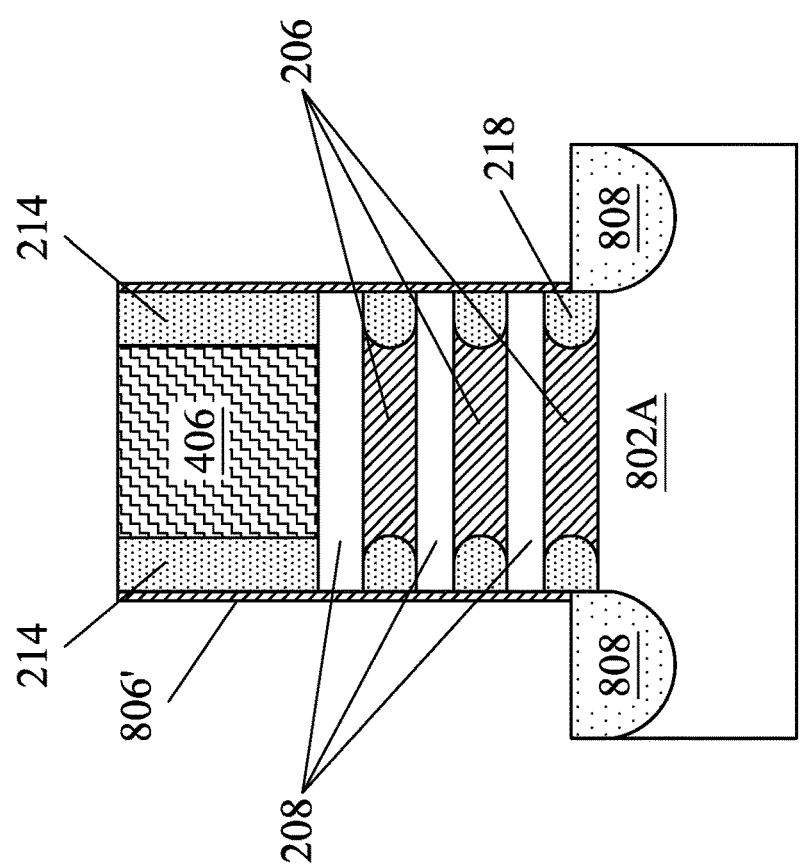
Figure 8K:
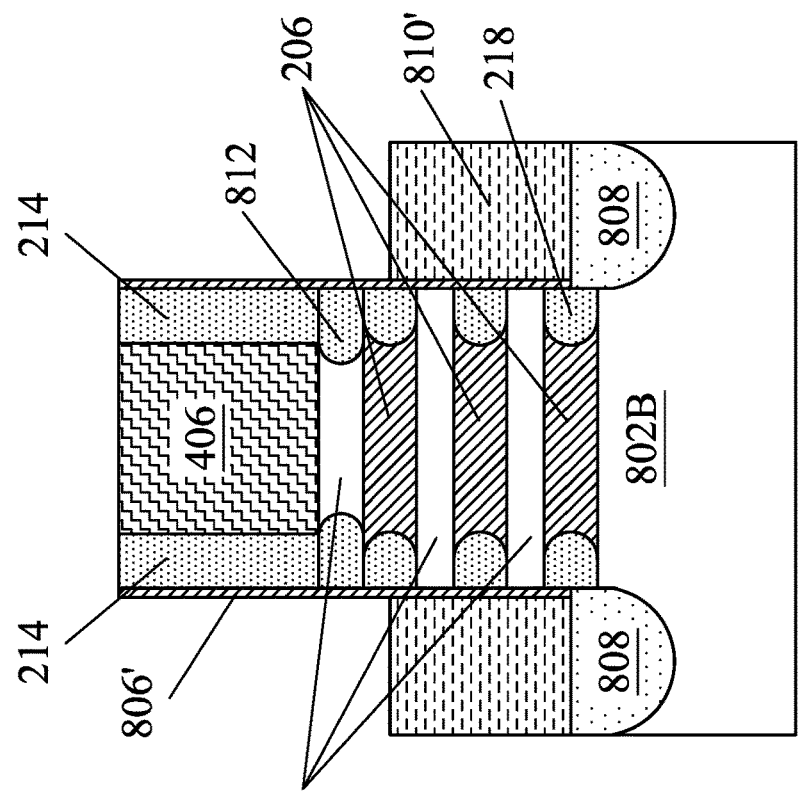
Figure 8J:
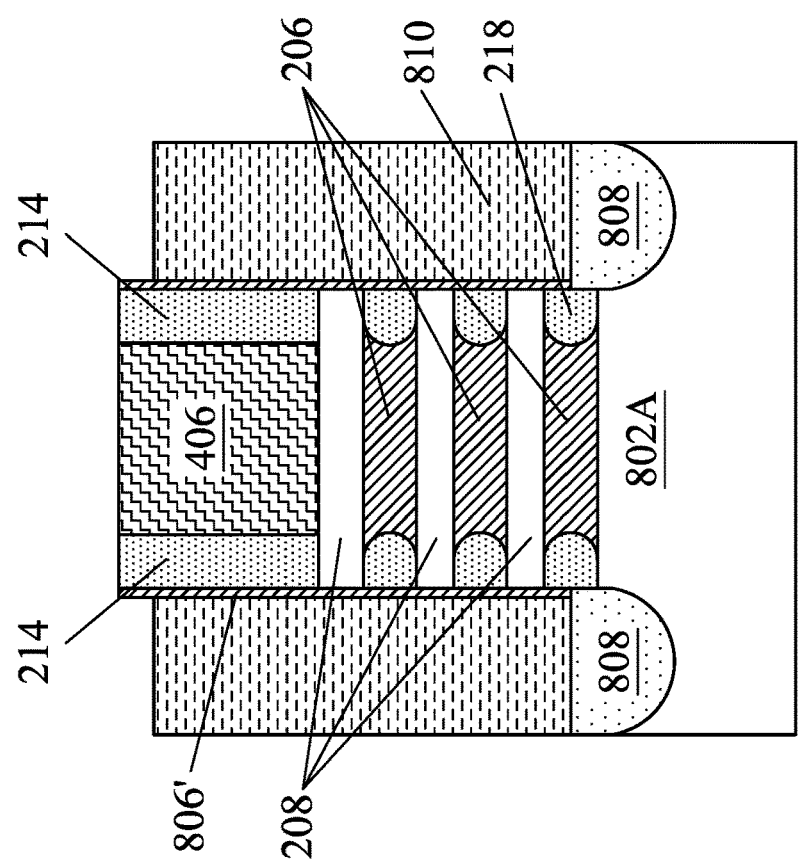
Figure 8O:
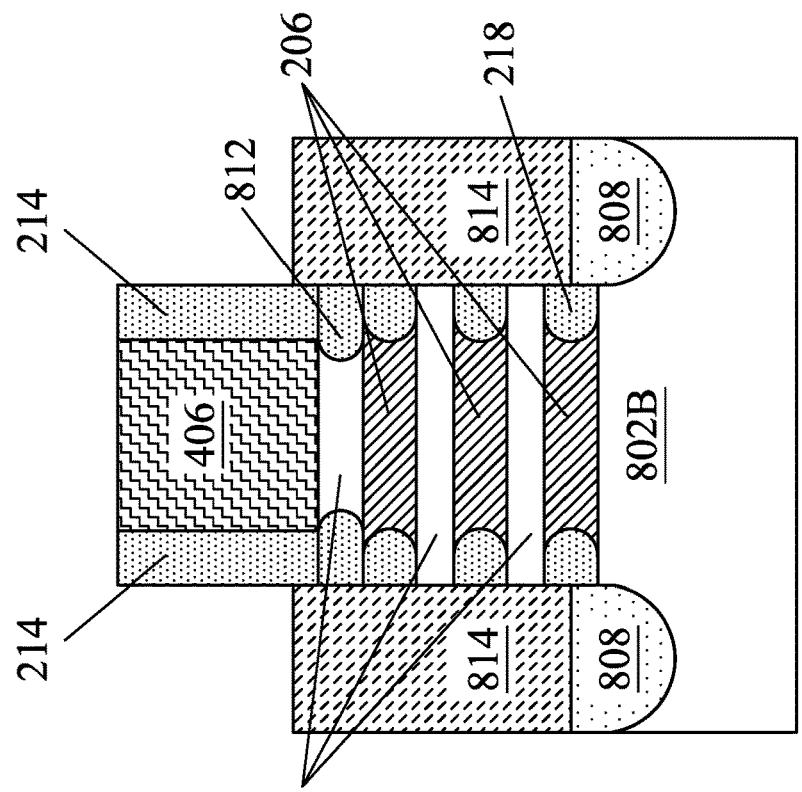
Figure 8N:
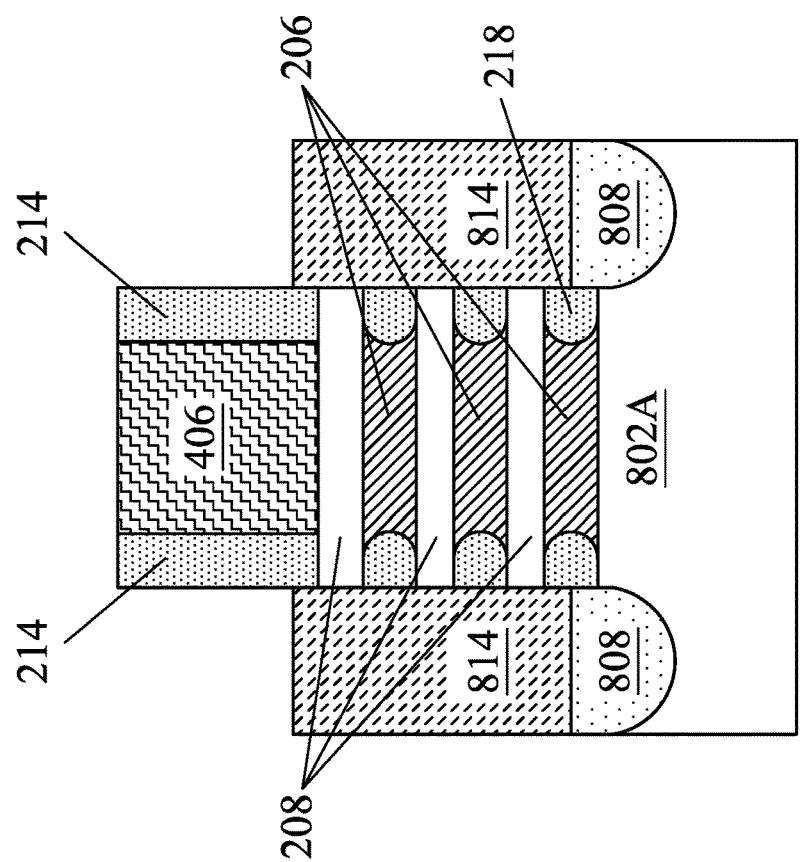
Figure 8Q:
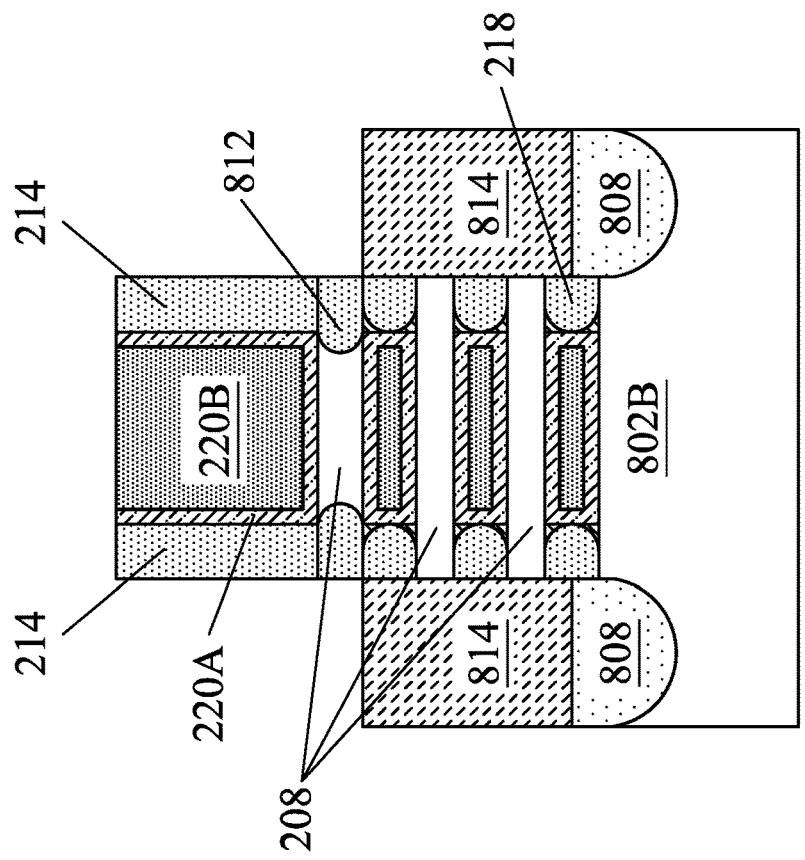

Turning to FIGS. 8A-8Q, illustrated is another method of forming devices having different channel configurations. FIGS. 8A, 8B, and 8C illustrate a multigate device 800 that is substantially similar to as discussed above with reference to the structure of FIGS. 4A, 4B, and 4C. Fins 802A, 802B are formed.

After placing the dummy gate structures 406 and surrounding spacers 214 over the fins 802A, 802B, source/drain recesses 804 are formed by etching the respective fins 802A, 802B adjacent the dummy gate structures 406. First source drain recess 804 is provided in fin 802A as illustrated in FIG. 8D; a second source drain recess 804 is provided in fin 802B as illustrated in FIG. 8E. The etching process can include a dry etching process, a wet etching process, other suitable etching process, or combinations thereof. In some embodiments, the etching process is a multi-step etch process. In some implementations, both the fin 802A and 802B are etched concurrently. The etching forms the recesses 804 that extend below the lower epitaxial layers (e.g., 206/208). In some embodiments, the recesses 804 include a laterally etching component, and thus, extend partially under dummy gate 406. In particular, the etching processes may laterally etch the semiconductor layers 206 reducing their length in x-direction.

After forming the recesses 804, a dielectric layer 806 is formed on the sidewalls of the recesses 804 as illustrated in FIGS. 8D and 8E. The dielectric layer 806 may fill space provided by the lateral etching of semiconductor layer 206 to extend under the dummy gate 406. In an embodiment, the dielectric layer 806 is a low-k dielectric material such as a dielectric material including oxygen, carbon, and/or nitrogen. The deposition of dielectric layer 806 may be performed by CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), other suitable methods, or combinations thereof.

As illustrated in FIGS. 8F and 8G, the dielectric layer 806 is etched back or trimmed to decrease its thickness and expose a bottom of the recesses 804, illustrated as dielectric layer 806'. A first portion of epitaxial material 808 are grown at the bottom of the recesses 804. The first portion of epitaxial material 808 may be an undoped semiconductor such as silicon. In some implementations, the first portion of epitaxial material 808 is grown such that it has an upper surface coplanar with a region of the bottom semiconductor layer 206.

Referring to FIGS. 8H and 8I, a masking element 810 is provided in the recesses 804 of the fins 802A, 802B. The masking element 810 may include a hard mask material such as an oxide material, aluminum oxide, photoresist, and/or other suitable materials. In some implementations, the masking element 810 is a composition that provides an etch selectivity to the dielectric layer 806, 806'. After deposition of the masking element 810 material, the masking element 810 may be etched back over the fin 802B to form etched back masking element 810' over the fin 802B. The etched back masking element 810' exposes at least a top semiconductor layer 208 under the dummy gate 406. The etching back process may include a suitable lithography patterning to protect the masking element 810 over the fin 802A.

Referring to FIGS. 8J and 8K, a second inner spacer 812 is formed on the second fin 802B. In some implementations, an etch back or trim process is performed on the exposed dielectric layer 806 exposing a top semiconductor layer 208 of the fin 802B. The top semiconductor layer 208 is then laterally recessed, removing a portion of the semiconductor layer 208 from a portion under the gate structure 406. Dielectric materials are then deposited (and subsequently etched back) to form the second inner spacer 812. The second inner spacer 812 may include a low-k dielectric film comprising oxygen, carbon, and/or nitrogen.

After forming the second inner spacer 812, the masking element 810 is removed from the substrate leaving the recesses 804 exposed as illustrated in FIGS. 8L and 8M. After removal of the masking element 810, a trimming or etch back process is performed on the dielectric layer 806 providing spacer elements 116 between semiconductor layers 208 and abutting the semiconductor layers 206. The second inner spacer element 812 is provided on a top semiconductor layer 206 of the fin 802B. In some implementations, the dielectric layer 806 is removed from an end of the semiconductor layers 208 exposing a semiconductor surface providing a seed for subsequent epitaxial growth. The trimming or etch back process may also provide an outer sidewall of the second spacer 812 that is coplanar with an end of the semiconductor layers 208 disposed below the second spacer 812 and/or the spacer elements 116.

FIGS. 8L and 8M illustrate a thickness t1 of the spacer elements 116. A thickness t2 is provided for the second spacer element 812. In some implementations, the thickness t1 is less than the thickness t2. In some implementations, t2−t1 is greater than approximately 0.5 nm. The thickness t2 may be selected such that the parasitic capacitance of the device is lowered and/or there is decreased leakage between the metal gate and the source/drain and/or source/drain contact based on performance desires for the device to formed on fin 802B.

FIGS. 8N and 8O illustrate epitaxial source/drain features 814 formed above the epitaxial feature 808. The epitaxial source/drain features 814 may be doped with suitable n-type dopants and/or p-type dopants. In some embodiments, for the n-type GAA transistors, epitaxial source/drain features 814 include silicon. Epitaxial source/drain features 814 for an n-type GAA transistor can be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, for the p-type GAA transistors, epitaxial source/drain features 814 include silicon germanium or germanium. Epitaxial source/drain features 814 can be doped with boron, other p-type dopant, or combinations thereof (for example, forming Si:Ge:B epitaxial source/drain features). In some embodiments, epitaxial source/drain features 814 include more than one epitaxial semiconductor layer, where the epitaxial semiconductor layers can include the same or different materials and/or dopant concentrations. In some embodiments, epitaxial source/drain features 814 are doped during deposition by adding impurities to a source material of the epitaxy process (i.e., in-situ). In some embodiments, epitaxial source/drain features are doped by an ion implantation process subsequent to a deposition process. In some embodiments, annealing processes (e.g., rapid thermal annealing (RTA) and/or laser annealing) are performed to activate dopants in epitaxial source/drain features 514. The epitaxial features 814 disposed on the fin 802A may be the same or different than the epitaxial features 814 disposed on the fin 802B. The height of the epitaxial features 814 formed on fin 802B may be less than the height of the epitaxial features 814 formed on the fin 802A. In some implementations, the height of the epitaxial features 814 on the fin 802B is less because of the lack of a seed area on the upper semiconductor layer 208 available for epitaxial growth.

Figure 8P:
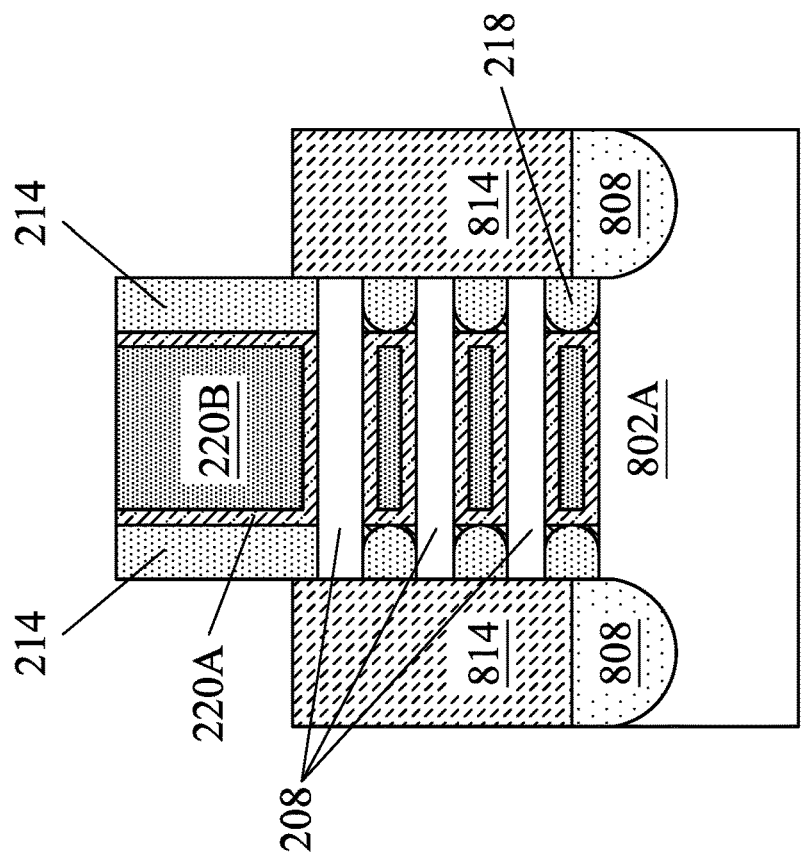

As illustrated in FIGS. 8P and 8Q, after formation of the source/drain features 814, an interlayer dielectric may be formed over the source/drain features and adjacent the dummy gate structure. The dummy gate structure 406 may be subsequently removed, followed by a channel release process etching the semiconductor layers 206 from the channel region. A gate structure 220 may then be formed including gate dielectric 220A and gate electrode 220B materials as discussed above. The gate structures 220 surround nanostructures provided by the released semiconductor layer 208. A gate structure 220 and the source/drain features 814 (and undoped epitaxial feature 808) formed on fin 802A form a device (GAA transistor) 800A; gate structure 220 and the source/drain features 814 (and undoped epitaxial feature 808) formed on fin 802B form a device (GAA transistor) 800B.

The channel region of the device 800A formed on fin 802A differs from the channel region of the device 800B formed on fin 802B. Because of the creation of the second inner spacers 812, the upper nanostructure (i.e., upper semiconductor layer 208) does not function as a channel region between source/drain features 814. Thus, the device 800B has in effect a channel configuration of a reduced number of nanostructures of sheets providing channel regions.

Figures 9A, 9B:
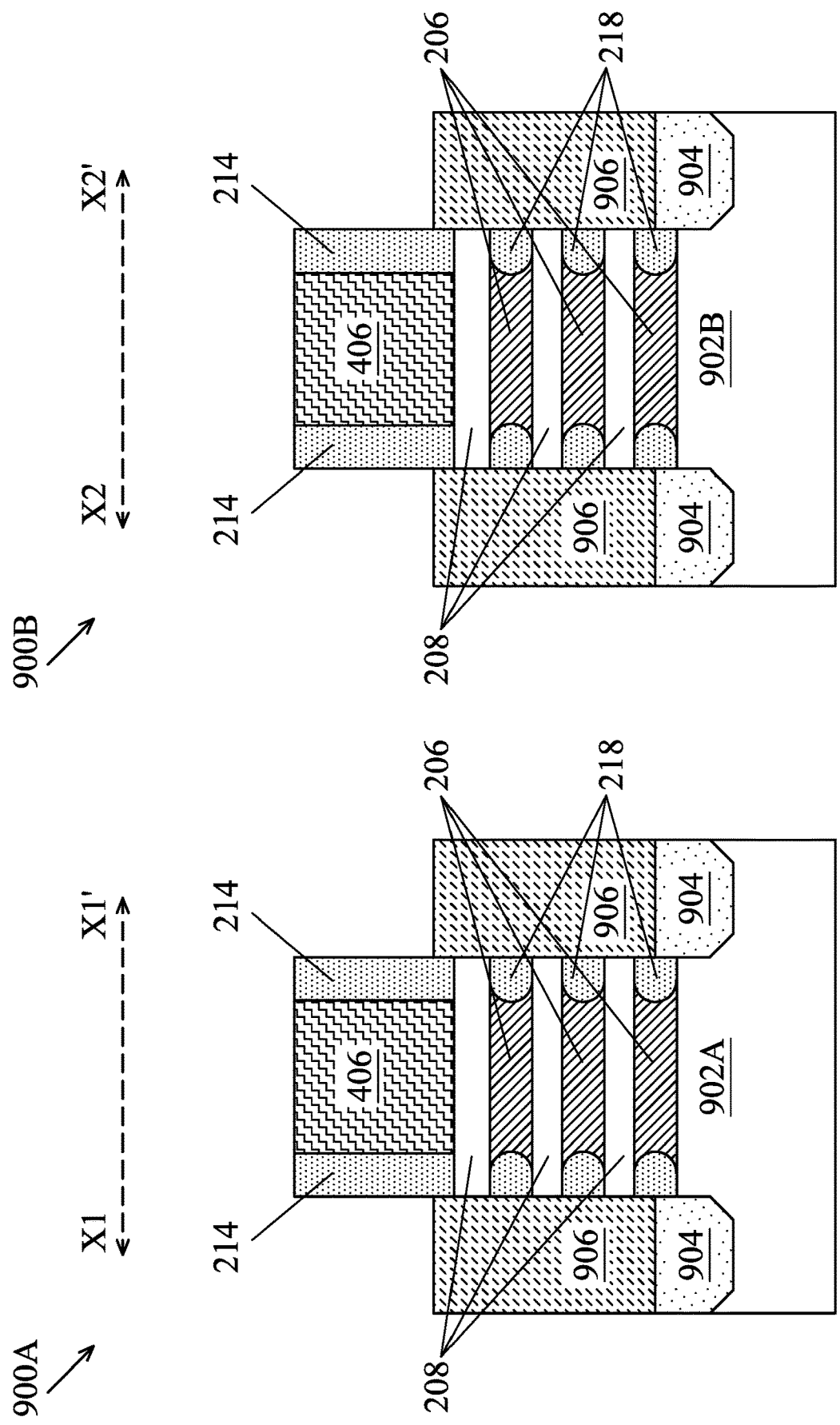

Turning now to FIGS. 9A-9H, illustrated is another method of forming devices with diffing channel configurations. Referring to FIGS. 9A and 9B illustrated is a device 900 having a first device 900A and a second device 900B at an interim point in fabrication. The devices 900A and 900B are substantially similar to as discussed above including a fin 902A and 902B substantially similar to fins 402A, 402B respectively. Epitaxial features are formed in recesses of the fins 902A, 902B that include a lower undoped portion 904 and an upper source/drain region 906. In some implementations, the lower undoped portions 904 include silicon or other semiconductor material. In some implementations, the upper source/drain regions 906 include suitably doped epitaxial material. The epitaxial source/drain features 906 may be doped with suitable n-type dopants and/or p-type dopants. In some embodiments, for the n-type GAA transistors, epitaxial source/drain features 906 include silicon. Epitaxial source/drain features 906 for an n-type GAA transistor can be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, for the p-type GAA transistors, epitaxial source/drain features 906 include silicon germanium or germanium. Epitaxial source/drain features 906 can be doped with boron, other p-type dopant, or combinations thereof (for example, forming Si:Ge:B epitaxial source/drain features). In some embodiments, epitaxial source/drain features 906 include more than one epitaxial semiconductor layer, where the epitaxial semiconductor layers can include the same or different materials and/or dopant concentrations. Various embodiments for forming said features 904/906 are discussed above. The epitaxial features 906 disposed on the fin 902A of the device 900A may be the same or different than the epitaxial features 906 disposed on the fin 902B of the device 900B. The channel region under a dummy gate structure 406 includes a plurality of semiconductor layers 208 (nanostructures), defining channel regions, and a plurality of interposing semiconductor layers 206, providing sacrificial layers.

As illustrated in FIGS. 9C and 9D, an interlayer dielectric 910 is formed over the epitaxial features 904, 904, 906A, 906B. The dummy gate structure 406 is removed and a channel release process is performed selectively removing semiconductor layers 206 to form opening 908. The channel release process releases the nanostructures of semiconductor layers 208 that provide the channel region as discussed below.

As illustrated in FIGS. 9E and 9F, for the second device 900B, a top semiconductor layer 208 or nanostructure in the opening 908 is removed in the opening 908. In some implementations, additional nanostructures or semiconductor layers 208 are also removed.

Figures 9G, 9H:
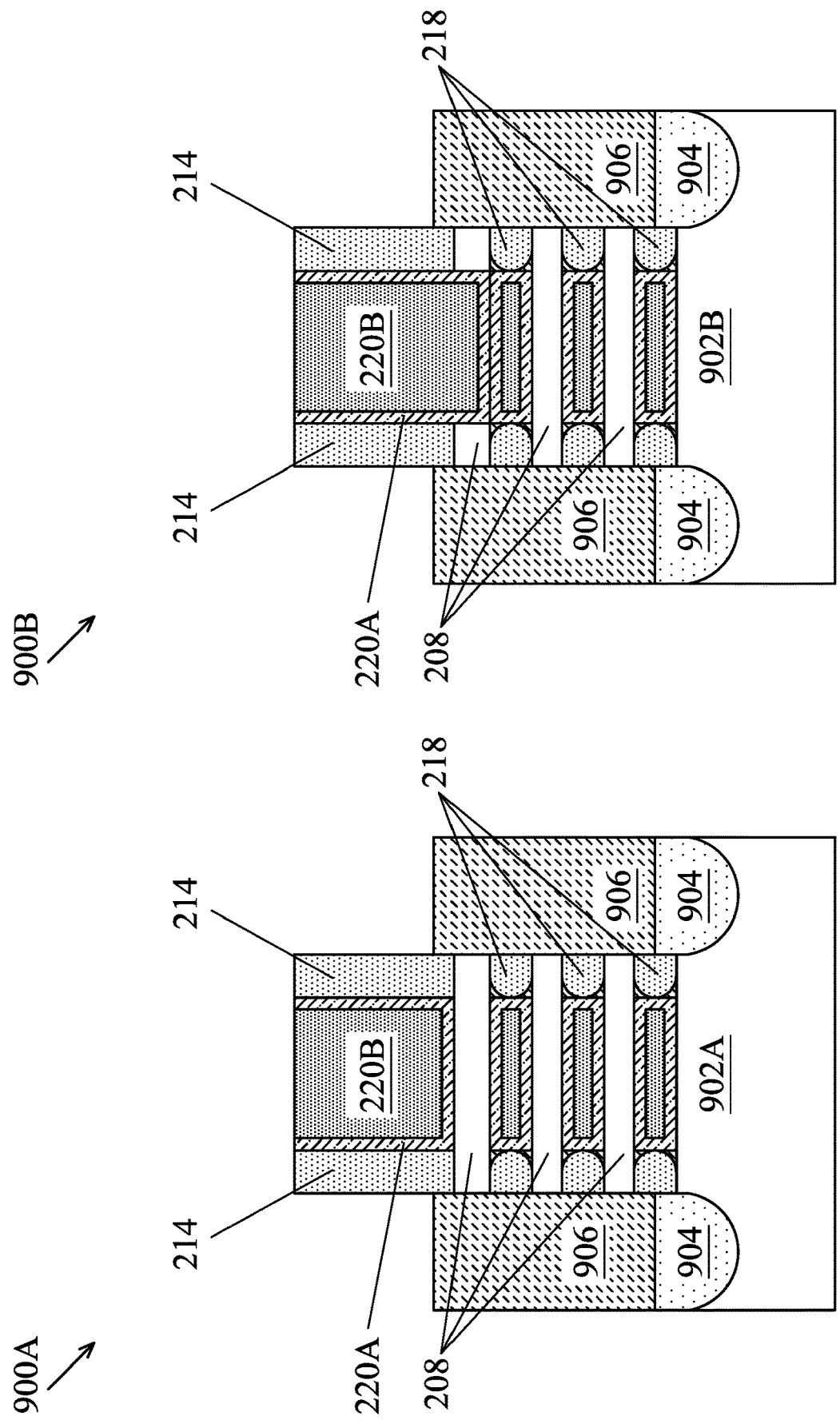

FIGS. 9G and 9H illustrate after the removal of one or more nanostructures of semiconductor layers 208 (e.g., channel regions or sheets) from the device 900B, a metal gate structure 220 is formed in the openings 908 of fin 902A and fin 902B. The metal gate structure 220 may include a metal gate electrode 220B and a gate dielectric layer 220A as discussed above. The gate structures 220 surround nanostructures provided by the released semiconductor layers 208. A gate structure 220 and the source/drain features 906 (and undoped epitaxial feature 904) formed on fin 902A form a device (GAA transistor) 900A; gate structure 220 and the source/drain features 906 (and undoped epitaxial feature 904) formed on fin 902B form a device (GAA transistor) 900B.

Thus, FIGS. 9A-9H illustrate providing a first device 900A and a second device 900B having a different channel configuration. In particular, a channel region or sheet of the GAA device 900B is removed to reduce the number of nanostructures (or sheets) providing channel regions for GAA device 900B in comparison with GAA device 900A. Benefits of this method may include forming the source/drain features at the same time (e.g., for each of devices 900A and 900B), though this is not required for all embodiments and/or the contact heights for landing upon the source/drain features may be at the same height between the two devices. The device 900B may exhibit additional capacitance between the source/drain features. An increased metal gate height may also affect the power and/or speed performance of the device 900B.

Referring now to FIGS. 10A-10F, illustrated is a method of modifying the configuration of the channel regions of a second device through backside processing prior to forming a metal gate structure of the device. The devices 1000A and 1000B may be formed providing similar structures as discussed above and are illustrated in FIGS. 10A and 10B. A fin 1002A and 1002B comprising a plurality of semiconductor layers 206, 208 extending above a substrate 202 substantially similar to as discussed above. After formation of a dummy gate structure 406, source/drain epitaxial features are formed. The source/drain epitaxial features as illustrate include a lower portion 904 of undoped epitaxial material (e.g., silicon) and an upper portion of source/drain material 906 (e.g., doped semiconductor material providing n-type or p-type conductivity), substantially similar to as discussed above. Spacers 214 are formed on the sidewalls of the dummy gate structure 406, and inner spacers 218 interpose the source/drain epitaxial features 904/906 and the semiconductor layers 206 (which are subsequently removed to provide openings for the gate structure). An interlayer dielectric 910 is formed on the substrate and includes a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Xerogel, Aerogel, amorphous fluorinated carbon, Parylene, BCB, polyimide, other low-k dielectric material, or combinations thereof. A capping layer 1006 such as silicon nitride may be formed over the interlayer dielectric 910.

Figure 10C:
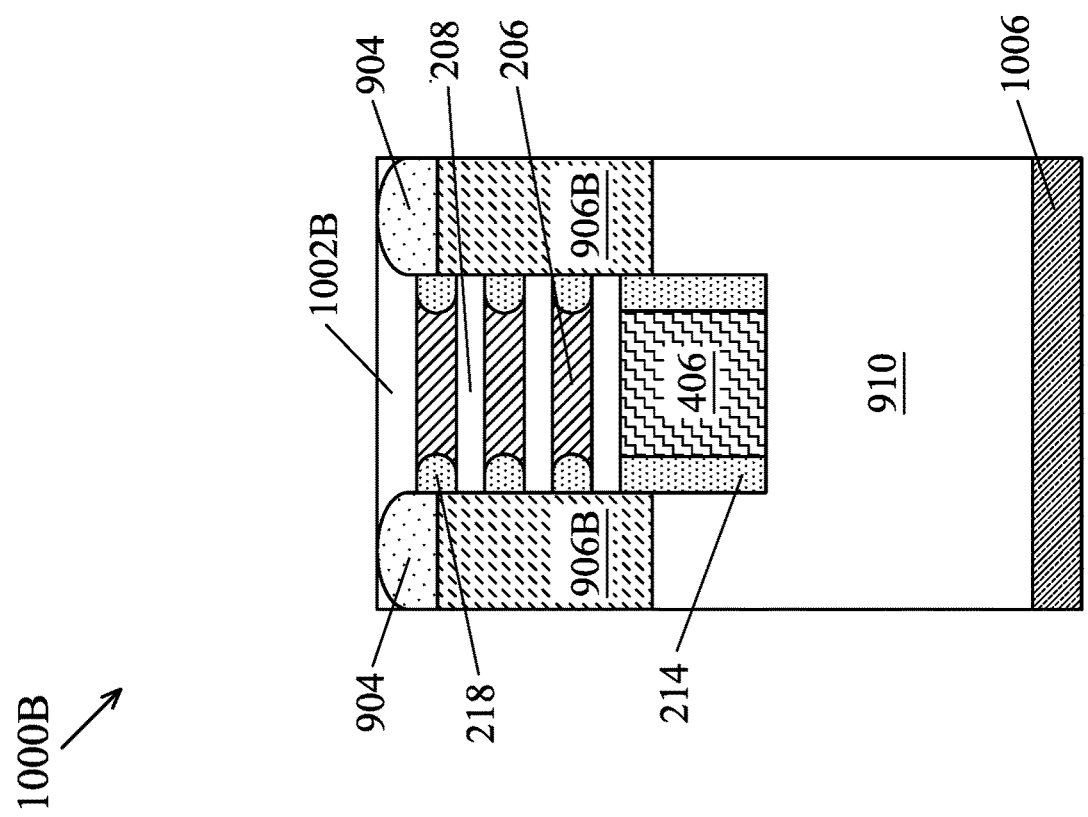
Figure 10D:
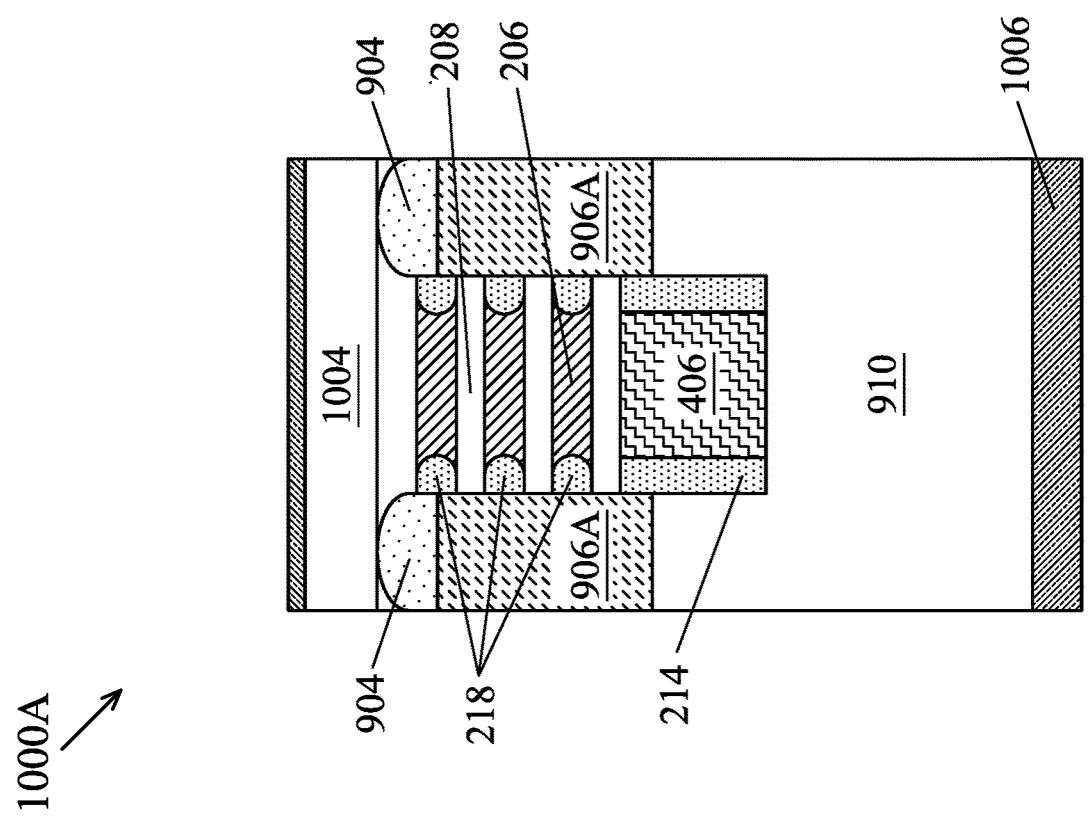

Referring to FIGS. 10C and 10D, the substrate 202 may be thinned such that epitaxial region 904 is exposed. A bottom hard mask layer 1004 is then formed on the backside of the substrate 202. The bottom hard mask layer may include an oxide layer and an overlying nitride layer. The bottom hard mask layer 1004 may be deposited by CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), other suitable methods, or combinations thereof. After deposition, the bottom hard mask layer 1004 may be patterned by removing the mask layer 1004 from the second device 1000B.

Figure 10E:
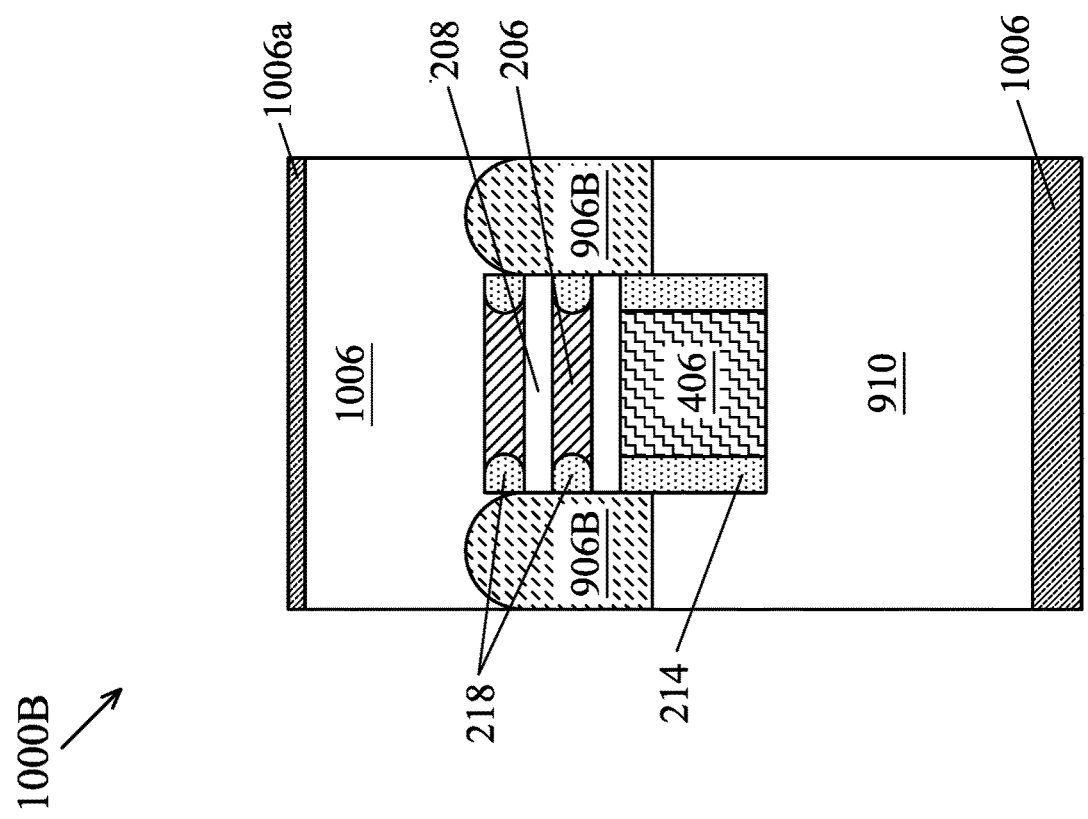
Figure 10F:
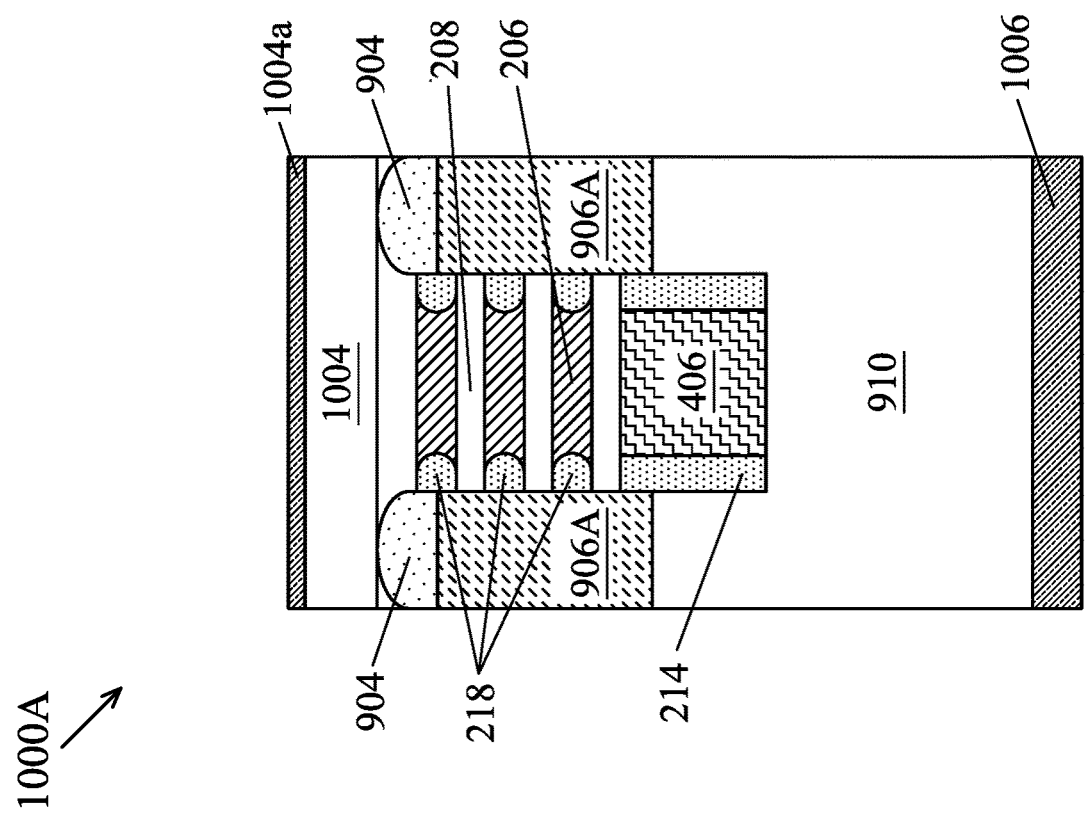

Referring now to FIGS. 10E and 10F, the thinned substrate 202 and a bottom (relative to the gate structure 406) nanostructure (or sheet) of semiconductor layer 208 may be removed from the device 1000B. The thinned substrate 202 and the bottom nanostructure (or sheet) of semiconductor layer 208 may be removed by suitable selective etching processes. In some embodiments, the coplanar epitaxial portion 904 is also removed for device 1000B. In a further implementation, a portion of the source/drain region 906 of the device 1000B may also be etched. While the illustrated example shows a single nanostructure or semiconductor layer 208 being removed, any number of nanostructures or semiconductor layers 208 may be removed depending on the desired channel configuration of the device 1000B.

After removal of the nanostructure of semiconductor layer 208 from the device 1000B, a dielectric layer 1006 is formed over the backside of the substrate including the device 1000B. The dielectric layer 1006 may be substantially similar to the dielectric layer 1004 discussed above. After deposition of the dielectric layer 1006, a planarization process may be performed followed by deposition of a capping layer 1006a (e.g., nitride) to provide a protection layer to the backside of device 1000. Further processing of the devices 1000A and 1000B may then be performing including on the frontside of the devices 1000A and 1000B. For example, the dummy gate structure may be removed, the nanostructures (or sheets) of semiconductor layers 208 may be released by the etching of semiconductor layers 206, and a metal gate structure may be formed surrounding the nanostructures 208 as discussed above.

A gate structure and the source/drain features 906 (and undoped epitaxial feature 904) formed on fin 1002A form a device (GAA transistor) 1000A; gate structure and the source/drain features 906 (and undoped epitaxial feature 904) formed on fin 1002B form a device (GAA transistor) 1000B.

The channel region of the device 1000A formed on fin 1002A differs from the channel region of the device 1000B formed on fin 1002B. Because of the removal of at least one nanostructure (semiconductor layer 208) providing a channel region, the device 1000B has a channel configuration of a reduced number of nanostructures or sheets providing channel regions.

The method illustrated by FIGS. 10A-10F provide for an embodiment of the method 100 of FIG. 1 that allow for an adjustable nanostructure (or sheet) number for one device in comparison with another, while the nanostructures and source/drain features are formed at the same time. In some implementations, this can save process steps, such as separately patterning the substrate for source/drain configuration between two devices. The method illustrated by FIGS. 10A-10F also provides for modifying the number of nanostructure (or sheet) for a second device prior to forming a metal gate structure.

Referring now to FIGS. 11A-11F, illustrated is a method of modifying the configuration of the channel regions (e.g., reducing the number of nanostructure (or sheets) providing a channel region) of a second device through backside processing after forming a metal gate structure wrapping the nanostructures or sheets of the device. The devices 1100A and 1100B may be formed providing similar structures as discussed above and are illustrated in FIGS. 11A and 11B. A fin 1102A and 1102B comprising a plurality of nanostructures provided by semiconductor layers 208 are formed on a substrate 202 substantially as discussed above. Metal gate structures 220 wrap the nanostructures or semiconductor layers 208 to form the GAA devices 1100A and 1100B. Source/drain features 904, 906 are disposed on opposing sides of the nanostructures (semiconductor layers 208) providing the channel regions. Spacers 214 are formed on the sidewalls of the gate structure 220, and inner spacers 218 interpose the source/drain epitaxial features and the gate structure 220. A hard mask layer 1104, such as an oxide or nitride dielectric, is formed over the metal gate structures 220. An interlayer dielectric 910 provides a dielectric material including, for example, silicon oxide, silicon nitride, silicon oxynitride, TEOS formed oxide, PSG, BPSG, low-k dielectric material, other suitable dielectric material, or combinations thereof adjacent the gate structure 220. Exemplary low-k dielectric materials for the interlayer dielectric 910 include FSG, carbon doped silicon oxide, Xerogel, Aerogel, amorphous fluorinated carbon, Parylene, BCB, polyimide, other low-k dielectric material, or combinations thereof. The interlayer dielectric layer 910 is a layer of a multi-layer interconnect structure 1106. The MLI feature 1106 electrically couples various devices (for example, p-type GAA transistors and/or n-type GAA transistors of multigate device 1100, transistors, resistors, capacitors, and/or inductors) and/or components (for example, gate structures and/or epitaxial source/drain features of p-type GAA transistors and/or n-type GAA transistors), such that the various devices and/or components can operate as specified by design requirements. The MLI feature 1106 includes a combination of dielectric layers (e.g., 910, 1106D) and electrically conductive layers (e.g., metal layers 1106A, 1106B, 1106C) configured to form various interconnect structures. The conductive layers are configured to form vertical interconnect features, such as device-level contacts (e.g., 1106A) and/or vias (e.g., 1106B), and/or horizontal interconnect features, such as conductive lines (e.g., 1106C). Vertical interconnect features typically connect horizontal interconnect features in different layers (or different planes) of the MLI feature. During operation, the interconnect features are configured to route signals between the devices and/or the components and/or distribute signals (for example, clock signals, voltage signals, and/or ground signals) to the devices and/or the components. A passivation layer 1108 may provide an upper layer protecting the underlying devices 1100A, 1100B.

Figure 11A:
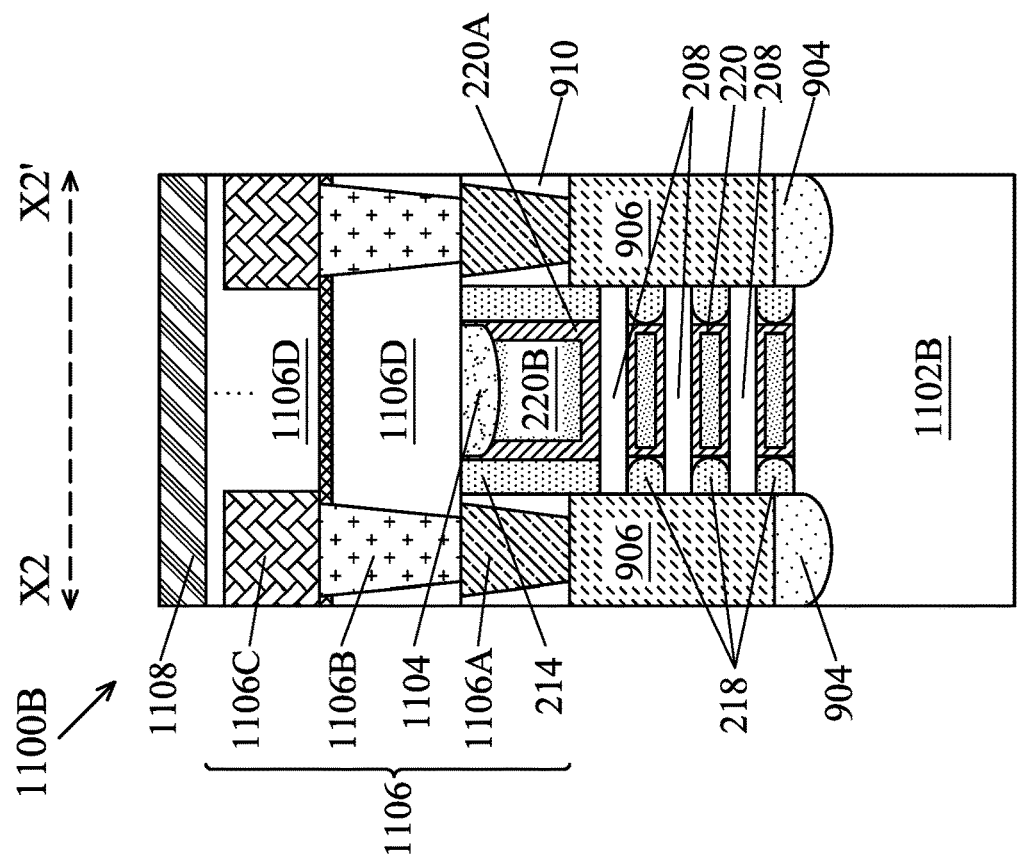
Figure 11B:
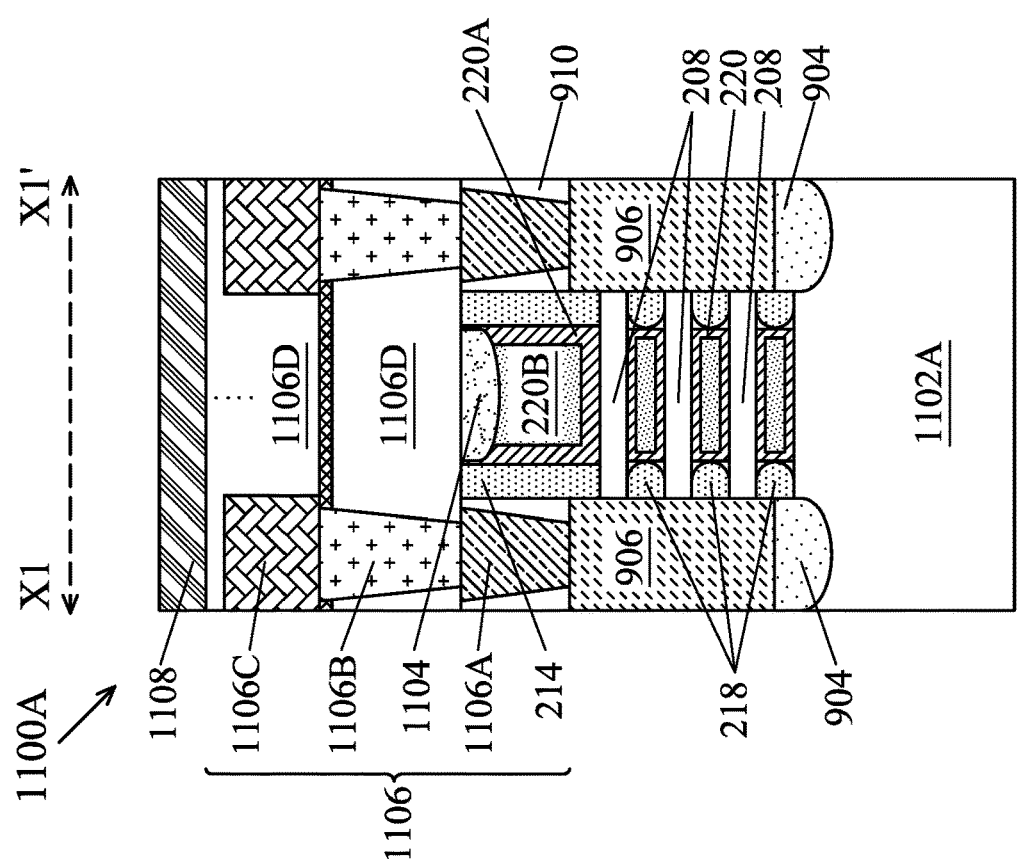
Figures 11C, 11D:
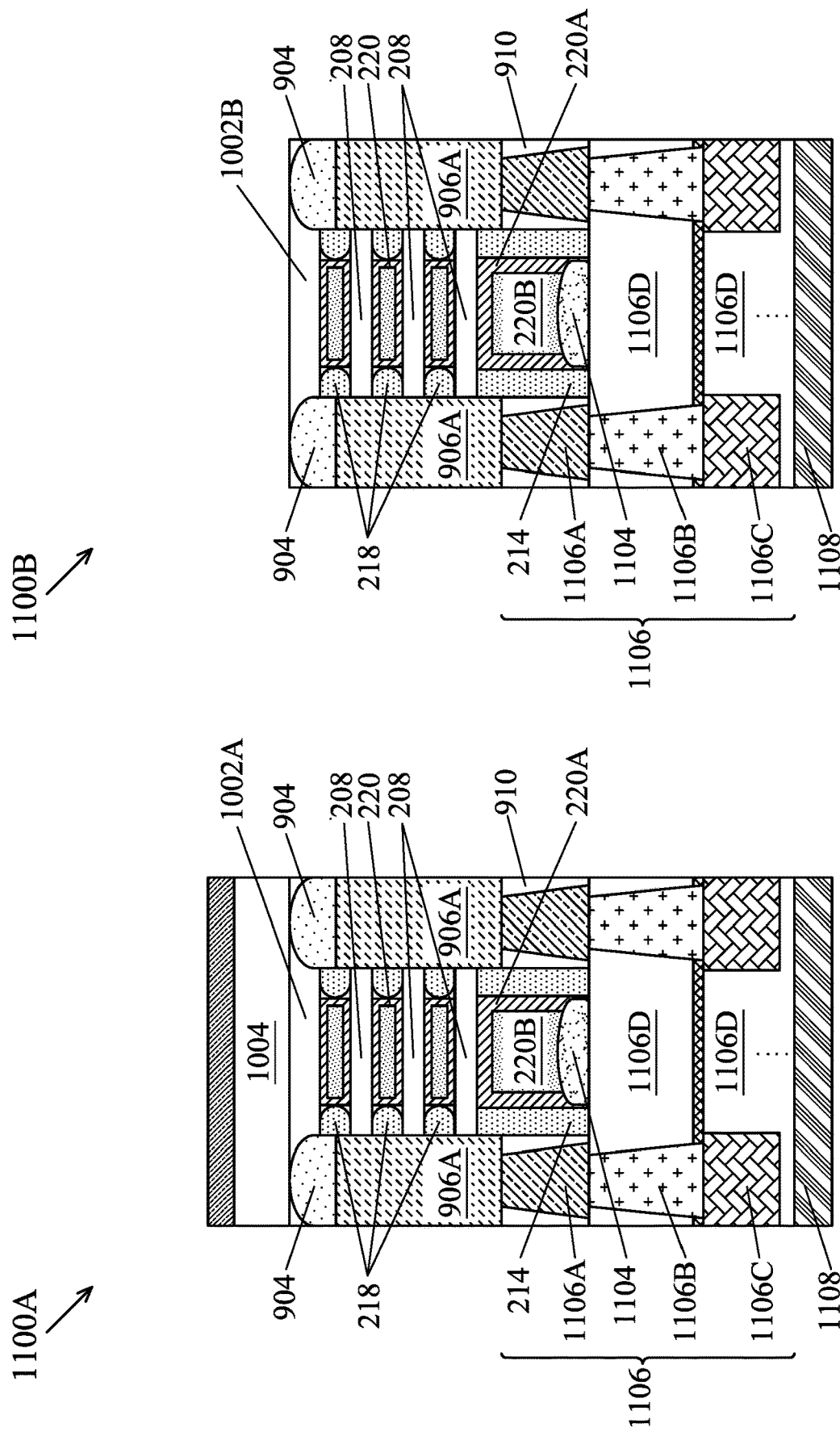

Referring to FIGS. 11C and 11D, the device may be flipped and the substrate 202 may be thinned such that a lower portion of the epitaxial feature 904 of the source/drain region is exposed. A bottom hard mask layer 1004 is then formed on the backside of the substrate 202. The bottom hard mask layer may include an oxide layer and an overlying nitride layer. The bottom hard mask layer 1004 may be deposited by CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), other suitable methods, or combinations thereof. After deposition, in some implementations, the bottom hard mask layer 1004 is patterned such that it is removed from the second device 1100B.

Referring now to FIGS. 11E and 11F, the thinned substrate 202 may be removed from the device 1100B by suitable selective etching processes. In some embodiments, the coplanar epitaxial region 904 is also removed in the device 1100B from the backside. In a further implementation, a portion of the source/drain region 906 of the device 1100B may also be etched as illustrated in FIG. 11F, annotated as 906B'. The removal of the substrate 202 exposes a portion of the metal gate 220. In some implementations, a selective etching process to remove the substrate 202 from the device 1100B uses an etch stop of the gate structure 220 (e.g., gate dielectric 220A and/or metal electrode 220B) and/or the inner spacer 218.

After removal of the substrate 202 from the device 1100B and a portion of the source/drain features 906 (and undoped epitaxial material 904), a dielectric layer 1006 is formed over the backside of the substrate including the device 1000B. The dielectric layer 1006 may be substantially similar to the layer 1004 discussed above. After deposition of the dielectric layer 1006, a planarization process may be performed followed by deposition of a capping layer 1006a (e.g., nitride) to provide a protection layer to the backside of device 1100B. Further processing of the devices 1100A and 1100B may be performed such as further processing providing additional backside interconnects. In other embodiments, processing of the device 1100A and 1100B is substantially complete the interconnections being provided by the MLI 1106.

Thus, the gate structure 220 and the source/drain features 906 (and undoped epitaxial feature 904) formed on fin 1102A form a device (GAA transistor) 1100A; gate structure 220 and the source/drain features 906 (and undoped epitaxial feature 904) formed on fin 1102B form a device (GAA transistor) 1100B.

The channel region of the device 1100A differs from the channel region of the device 1100B. Because of the removal of at least one nanostructure (semiconductor layer 208) providing a channel region, the device 1100B has a channel configuration of a reduced number of nanostructures or sheets providing channel regions.

The method illustrated by FIGS. 11A-11F provides for an embodiment of the method 100 of FIG. 1 that allow for an adjustable nanostructure (or sheet) number for one device in comparison with another, while the nanostructures, source/drain features, and/or gate structures are formed at the same time. In some implementations, this can save process steps, such as separately patterning the substrate for source/drain configuration between two devices.

Referring now to FIGS. 12A and 12B, devices 1200A and 1200B illustrate a method substantially similar to as discussed above with reference to FIGS. 11A-11F. However, when configuring the channel by removing substrate 202 and/or source/drain epitaxial region 906, 904 similar to as discussed above in the device 1100B as illustrated in FIG. 11F above, when fabricating the device 1200B, a portion of the metal gate structure 220 and/or a nanostructure (or sheet) of semiconductor layer 208 is also removed, thus further decreasing the channel area of the second device 1200B in comparison with the device 1200A. The removal of additional channel areas can provide for lower the metal gate capacitance.

Thus, the gate structure 220 and the source/drain features 906 (and undoped epitaxial feature 904) form device (GAA transistor) 1200A; gate structure 220 and the source/drain features 906 (and undoped epitaxial feature 904) form a device (GAA transistor) 1200B. The channel region of the device 1200A differs from the channel region of the device 1200B. Because of the removal of at least one nanostructure (semiconductor layer 208) providing a channel region, the device 1200B has a channel configuration of a reduced number of nanostructures or sheets providing channel regions.

Figures 13C, 13D:
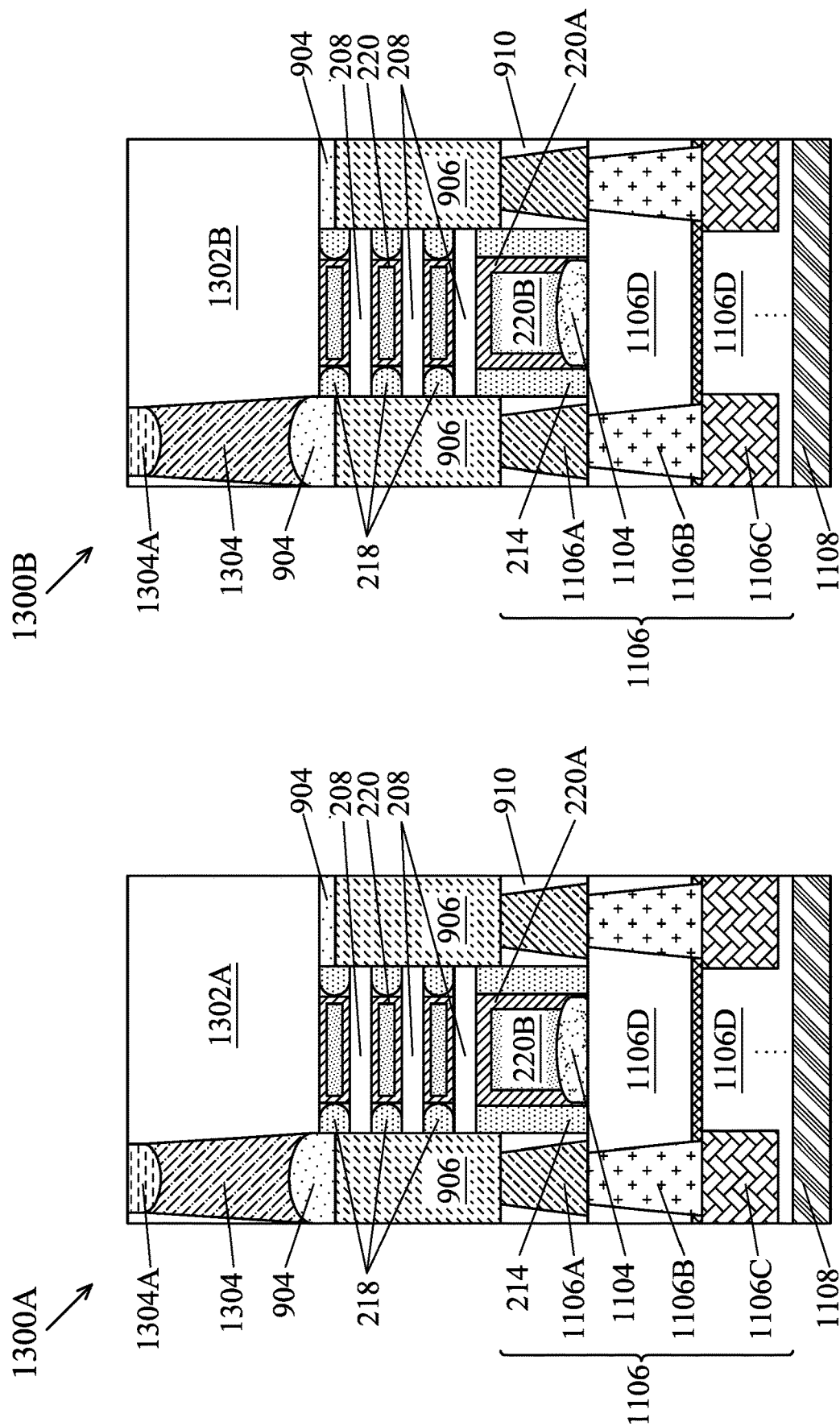
FIGS. 13A-13N are fragmentary diagrammatic views of another multigate device, in portion or entirety, at various fabrication stages according to various aspects of the present disclosure including another method of configuring a lower channel region through backside processing including providing a backside contact.
Figure 13E:
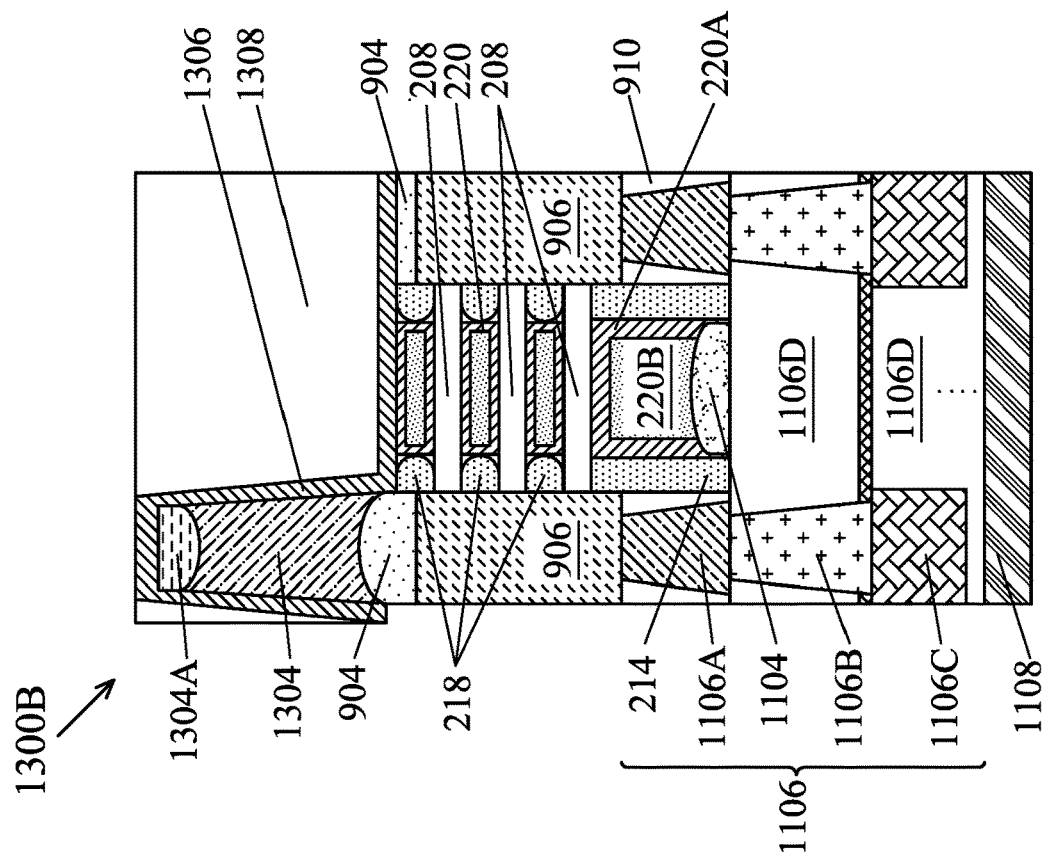
Figure 13F:
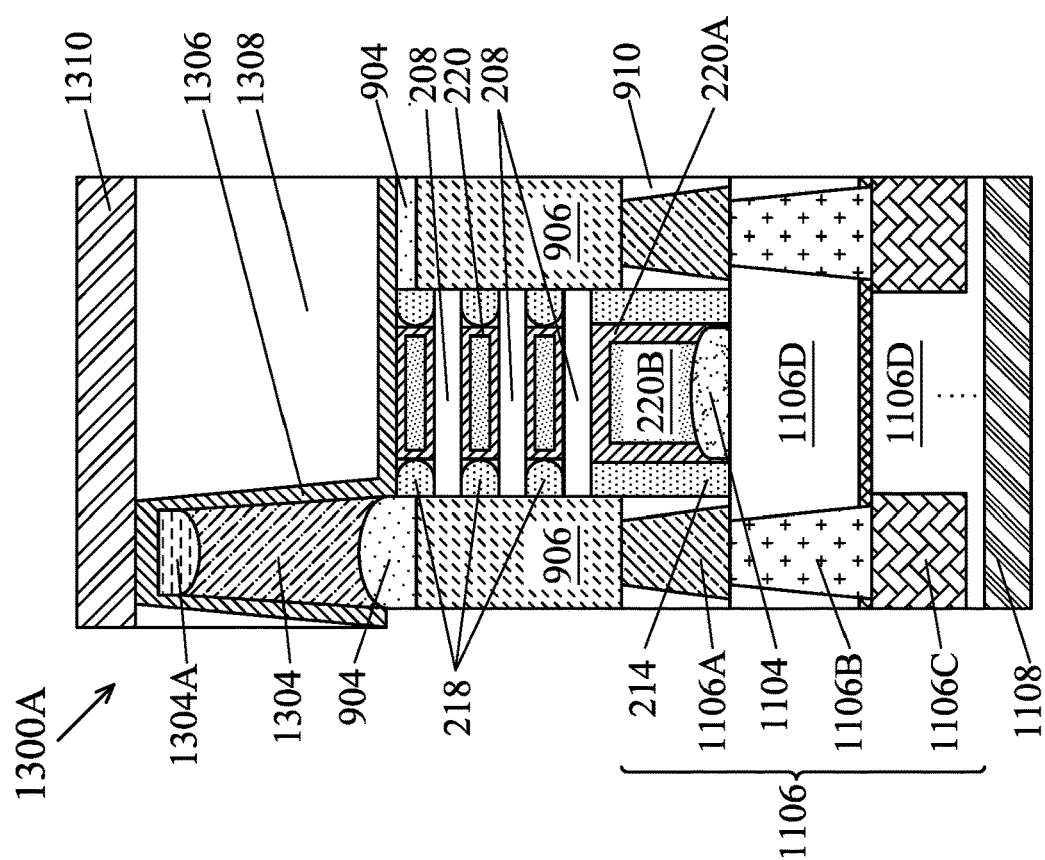
Figure 13H:
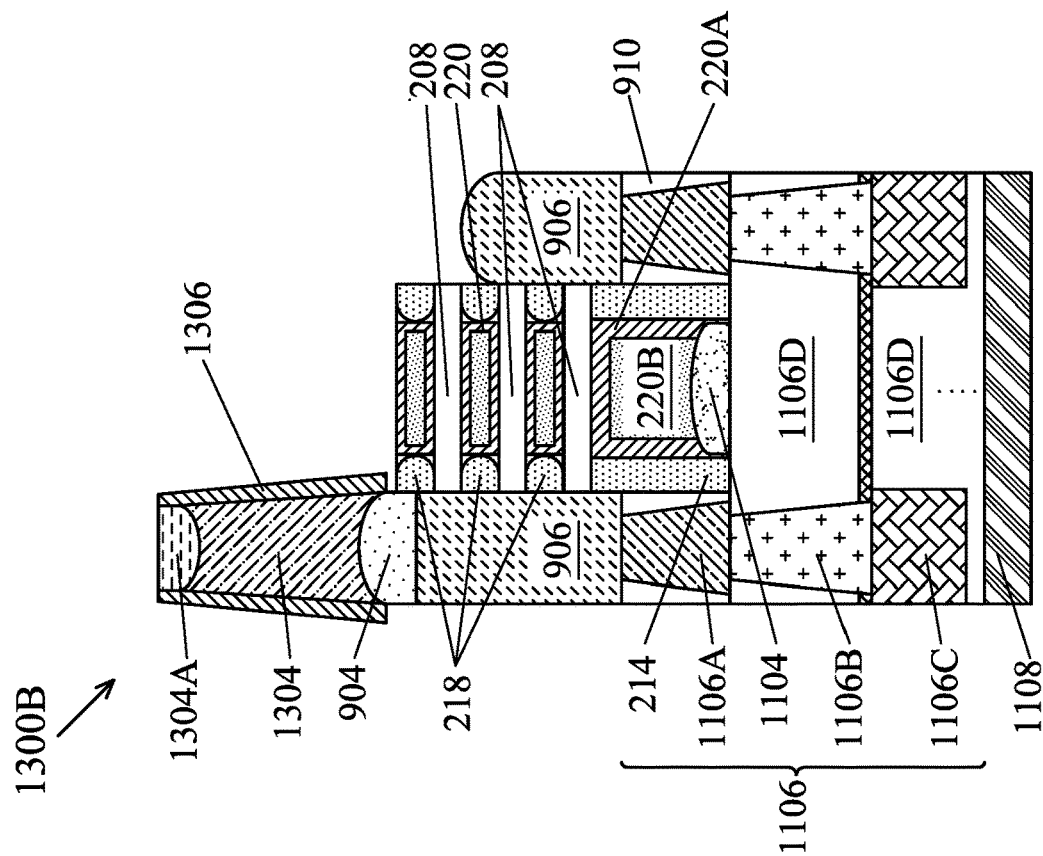
Figure 13G:
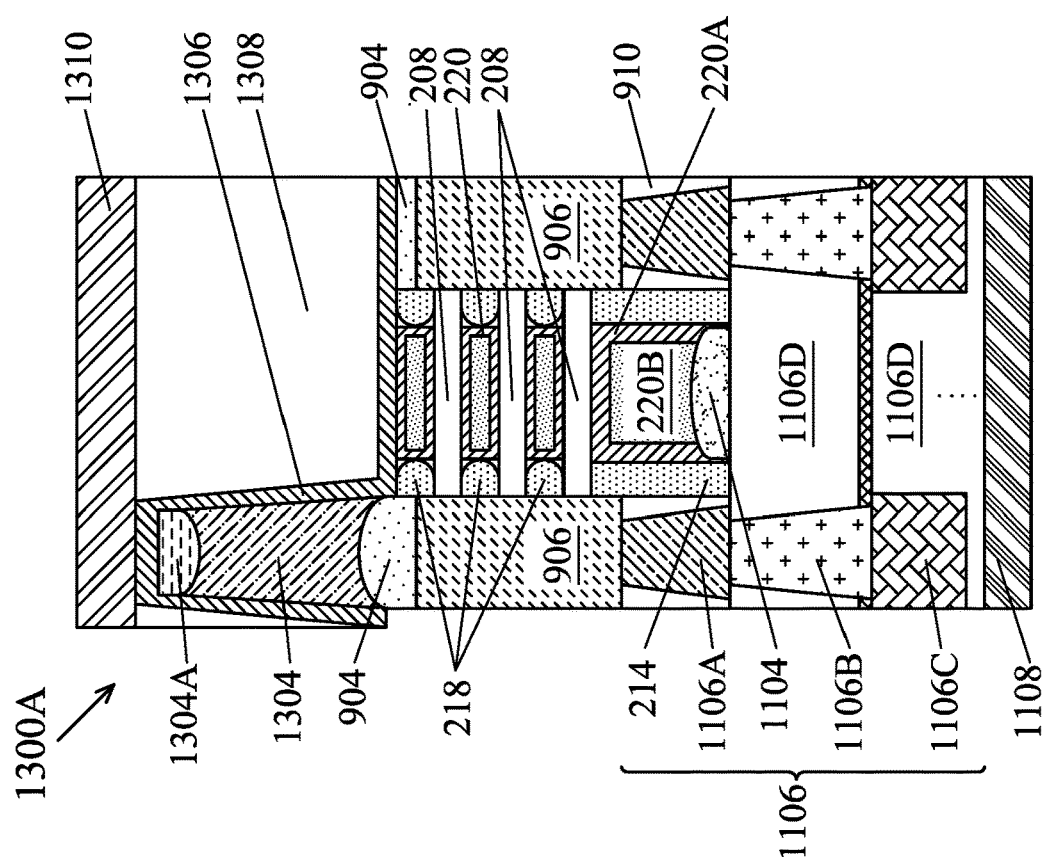
Figure 13J:
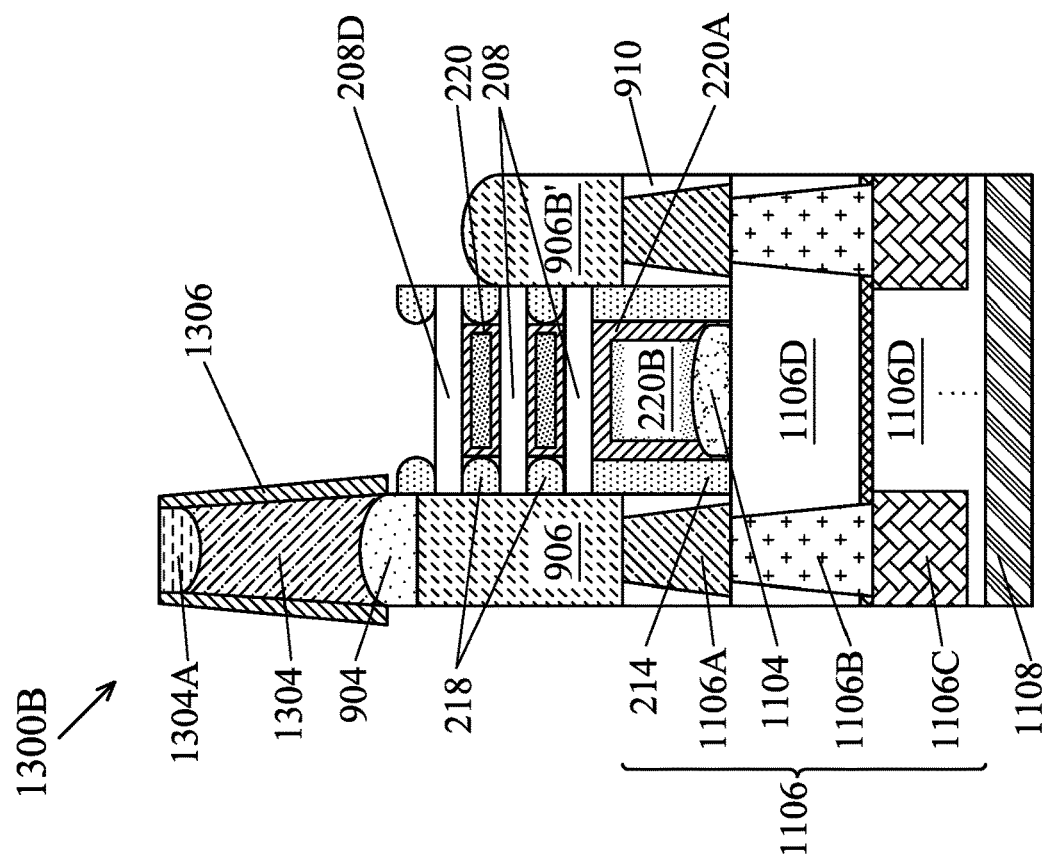
Figure 13I:
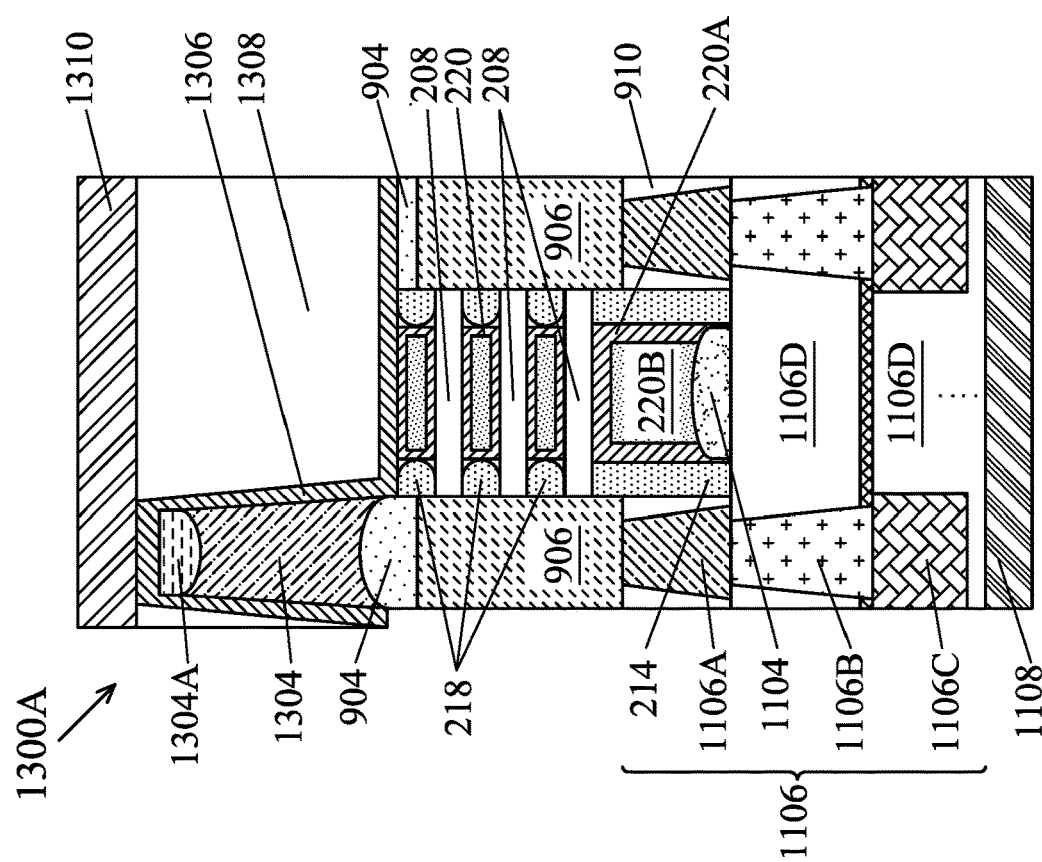
Figures 13M, 13N:
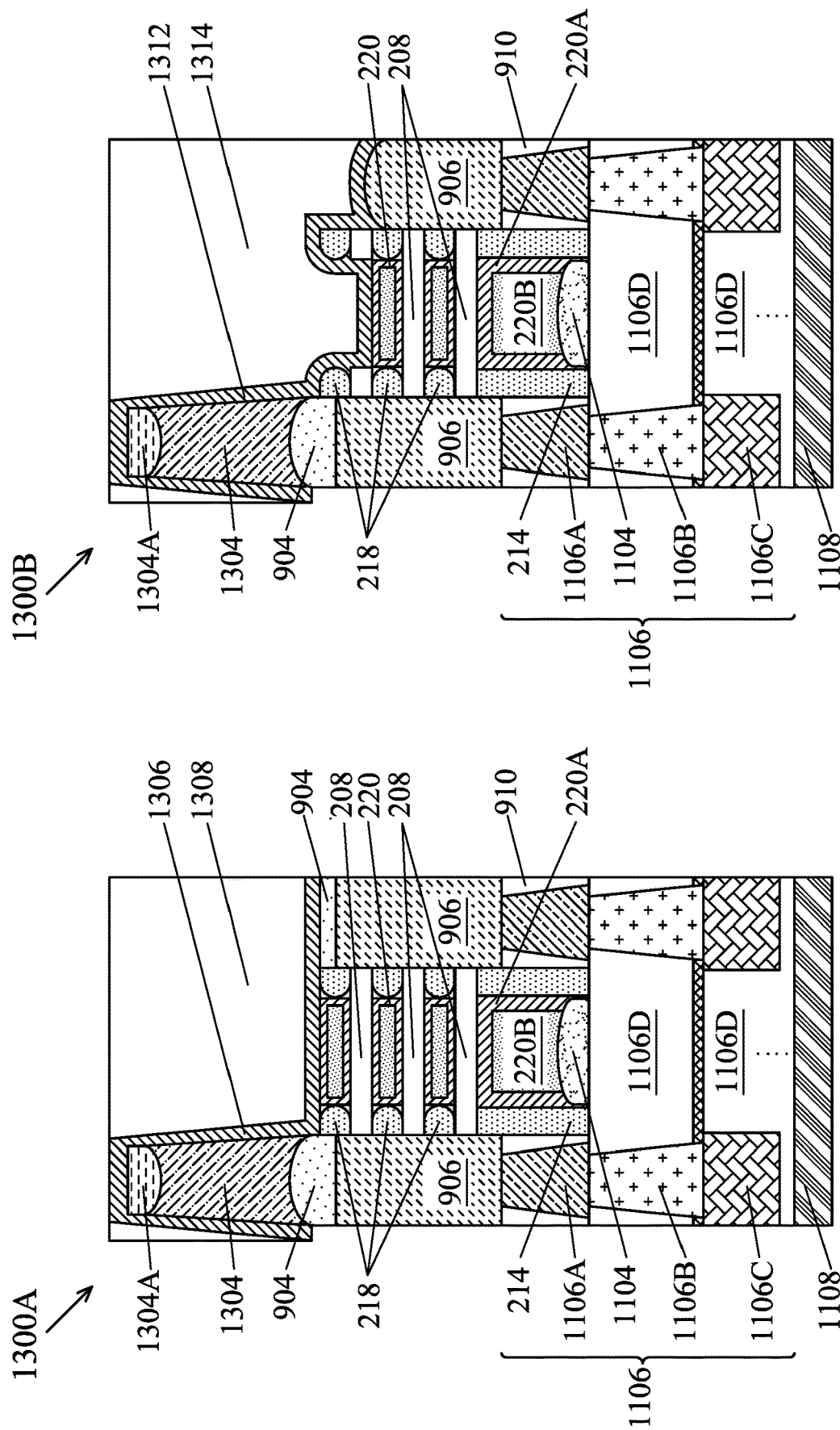

Referring now to FIGS. 13A-13N, illustrated is an embodiment of a method 100 of FIG. 1 that provides for modifying the configuration of the nanostructures that provide channel regions of a second device through backside processing after forming a metal gate structure wrapping the nanostructures providing channel regions of the device. The devices 1300A and 1300B may be formed providing similar structures as discussed above and are illustrated in FIGS. 13A and 13B. A fin 1302A and 1302B are formed on a substrate 202 and comprise a plurality of semiconductor layers 208 providing nanostructures (or sheets) that define channel regions substantially as discussed above. Metal gate structures 220 wrap the semiconductor layers 208 and source/drain features 904, 906 are disposed on opposing sides of the nanostructures of semiconductor layers 208. Spacers 214 are formed on the sidewalls of the metal gate structure 220, and inner spacers 218 interpose the source/drain epitaxial features and the gate structure 220. A hard mask layer 1104, such as an oxide or nitride dielectric, is formed over the metal gate structures 220. An interlayer dielectric 910, the MLI feature 1106 and the passivation layer 1108 may be substantially similar to as discussed above with reference to the device 1100A and 1100B.

The devices 1300A and 1300B also each include a dummy contact feature 1304 extending below one of the epitaxial regions 904 in a source/drain region. In some implementation, the dummy contact feature 1304 is provided on a source side of each of the devices 1300A and 1300B. The dummy contact feature 1304 may include material (e.g., epitaxially grown semiconductor material) that is subsequently removed and replaced with a metal contact during backside processing. In some implementations, the dummy contact feature 1304 is formed during the recessing of the fins 1302A and 1302B in the source/drain region. The sacrificial material may first be grown on a deep recess, upon which the source/drain epitaxial material is grown.

Referring to FIGS. 13C and 13D, the device may be flipped for backside processes. The substrate 202 may be thinned such that the dummy contact feature 1304 is exposed. In some implementations, the dummy contact feature 1304 is slightly recessed and filled with a dielectric material such as SiN provided as 1304a.

Referring now to FIGS. 13E and 13F, the thinned substrate 202 may be removed from the device 1300A and 1300B by suitable selective etching processes. For example, the substrate 202 may be selectively etched retaining the dummy contact feature 1304. In some embodiments, a protection layer 1306 is disposed on the dummy contact feature 1304 and exposed portion of the device 1300A and 1300B (e.g., metal gate 220, inner spacers 218, and source/drain features 904 (e.g., drain-side)). An oxide layer 1308 may then deposited. In some embodiments, after deposition the oxide layer 1308 is planarized. A hard mask layer such as silicon nitride or photoresist is patterned to provide a hard mask element 1310 over the device 1300A. The deposition process for the protection layer 1306 and/or the oxide layer 1308 may include CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof.

Referring to FIGS. 13G and 13H, while the hard mask element 1310 protects the first device 1300A, the oxide layer 1308 is removed from the second device 1300B. In some embodiments, the protection layer 1306 is also removed from portions of the second device 1300B in whole or in part. For example, in some implementations, the protection layer 1306 is maintained on the sidewalls of the dummy contact feature 1304. After removal of the oxide layer 1308 and/or protection layer 1306, the configuration of the channel region of the device 1300B is modified. In an embodiment, as illustrated in FIG. 13H, the epitaxial features 904 is removed from the device 1300B. In an embodiment, the drain side of the source/drain features 906 are also partially removed. For example, the epitaxial features 906 may be etched back such that the epitaxial feature 906 is not laterally coplanar with a metal gate 220 portion and/or a nanostructure provided by semiconductor layer 208 as illustrated in FIG. 13H. The device 1300A maintains its channel configuration as illustrated in FIG. 13G.

Referring to an alternative configuration of FIGS. 13I and 13J, the etching back of the undoped feature 904 and partial etch back of source/drain feature 906 of the device 1300B is similarly performed as discussed above. However, providing further reduction of the channel region of the device 1300B, a portion of the metal gate 220 is also removed in the same or separate etching processes. In some embodiments, the exposed semiconductor layer 208, denoted 208D, may also be removed further reducing the nanostructures for providing a channel region in the device 1300B.

After removal of the undoped epitaxial feature 904, a portion of the source/drain feature 906, a portion of the metal gate 220, and/or a nanostructure provided by semiconductor layer 208, dielectric layers 1312 and 1314 are formed over the backside of the substrate including the device 1300B. The dielectric layers 1312 and 1314 may be substantially similar to layers 1306 and 1308 discussed above. In an embodiment, the dielectric layer 1312 is a nitride composition; in an embodiment, the dielectric layer 1314 is an oxide composition. After deposition of the dielectric layer 1314, a planarization process may be performed.

Further processing of the devices 1300A and 1300B may be performed such as further processing such as replacement of the dummy contact structure 1304 with a conductive contact structure (e.g., metal) and/or further interconnect layers (e.g., metal lines) on the backside of the devices 1300A and 1300B. In some implementations, the metallization layers on the backside of the devices 1300A and 1300B provide for a power rail.

Thus, the gate structure 220 and the source/drain features 906 (and undoped epitaxial feature 904) form device (GAA transistor) 1300A; gate structure 220 and the source/drain features 906 (and undoped epitaxial feature 904) form a device (GAA transistor) 1300B. The channel region of the device 1300A differs from the channel region of the device 1300B. Because of the configuration of the source/drain and its interface with nanostructures providing channel regions, removal of metal gate portions, and/or removal of at least one nanostructure (semiconductor layer 208) providing a channel region, the device 1300B has a channel configuration of a reduced number of nanostructures or sheets providing channel regions. Thus, the method of FIGS. 13A-13N provide for methods of configuring the channel region of the device 1300B to reduce the nanostructures (or sheets) providing channel regions in a second device in comparison with a first device on the substrate.

The methods and structures discussed herein provide several examples of configuring devices on a same substrate to have a different channel region configuration. The channel region configuration may differ by providing a different number of nanostructures (or sheets) within which a channel region for the second device is formed. The reduction in the effective channel region can be provided by forming less nanostructures for a second device, physical removal of the nanostructures from a second device, oxidation of the nanostructures, configuration of the source/drain region to not interface a nanostructure thus, removing the nanostructure from a viable path of electrons or holes (e.g., channel region), configuration of a doped region of the source/drain feature to not interface a nanostructure thus, removing the nanostructure from a viable path of electrons or holes (e.g., channel region). The devices having different channel configuration may be formed upon adjacent fins, or be formed on disparate portions of the same substrate.

The present disclosure provides for many different embodiments. An exemplary method includes providing a first fin structure and a second fin structure each extending from a substrate. A first gate-all-around (GAA) transistor is formed on the first fin structure; the first GAA transistor has a channel region within a first plurality of nanostructures. A second GAA transistor is formed on the second fin structure; the second GAA transistor has a second channel region configuration. The second GAA transistor has a channel region within a second plurality of nanostructures. The second plurality of nanostructures is less than the first plurality of nanostructures.

In a further embodiment, the method includes forming the second GAA transistor includes removing at least one nanostructure disposed on the second fin structure to provide the second plurality of nanostructures. In an embodiment, removing the at least one nanostructure is performed before a metal gate structure of the second GAA transistor is formed. In another embodiment, removing the at least one nanostructure is performed after a metal gate structure of the second GAA transistor is formed. In an embodiment, removing the at least one nanostructure is performed from a backside of the substrate. In some embodiments, the method may include forming a source/drain feature of the second GAA transistor and etching back the source/drain feature, wherein the etched back source/drain feature interfaces the second plurality of nanostructures. In an embodiment, forming the source/drain feature of the second GAA transistor includes forming the source/drain feature interfacing another nanostructure. The etching back the source/drain feature may remove an interface with the another nano structure.

In an embodiment of the broader method, a dummy gate structure is formed over the second fin structure. The second fin structure comprises a third plurality of nanostructures when the dummy gate structure is formed. The dummy gate structure is then removed form an opening. And at least one nanostructure of the third plurality of nanostructures is etched from in the opening. After etching the at least one nanostructure, the second plurality of nanostructures remains on the second fin structure. In an embodiment of the method, providing the first fin structure and the second fin structure includes epitaxially growing a stack of alternating layers of a first semiconductor layer and a second semiconductor layer on the substrate in a first region and a second region, removing a top layer of the first semiconductor layer in the second region, growing an additional second semiconductor layer on the second region, and after growing the additional semiconductor layer, patterning the stack of alternating layers to form the first fin structure in the first region and the second fin structure in the second region.

In another of the broader embodiments discussed herein, a method is provided that includes forming an alternating stack of layers having a first composition and layers having a second composition. A first fin is formed of the alternating stack and a second fin is formed of the alternating stack. A dummy gate structure is then formed over the second fin and a dummy gate structure over the first fin. A first recess is etched in the first fin adjacent the dummy gate structure. A second recess is etched in the second fin adjacent the dummy gate structure. The method further includes forming a first epitaxial feature in the first recess, the first epitaxial feature interfaces each layer of the alternating stack of layers, and forming a second epitaxial feature in the second recess, the second epitaxial feature interfaces a portion of the alternating stack of layers. At least one layer of the stack of alternative stack of layers lacks an interface with the second epitaxial feature.

In a further embodiment, the method includes the first recess extending to a first depth and the second recess extending to a second depth, the second depth is less than the first depth. In an embodiment, the method includes concurrently growing an epitaxial material in the first recess and an epitaxial material in the second recess. In some implementations, the method may further include oxidizing a top layer of the alternating stack of layers of the second fin, such that the at least one layer interfaces the oxidized top layer. In an embodiment, the method includes forming a dielectric material in the second recess prior to forming the second epitaxial feature. In another embodiment, forming the dielectric material includes filling the second recess with the dielectric material, and subsequently etching back the dielectric material. In an embodiment, forming the second epitaxial feature includes growing the second epitaxial feature on the etched back dielectric material.

In another of the broader embodiments, a semiconductor device is provided that includes a first gate all-around (GAA) device and a second GAA device. The first GAA includes a first plurality of semiconductor nanostructures interposed by a first gate structure. The second GAA device includes a second plurality of semiconductor nanostructures interposed by a second gate structure. The second plurality of semiconductor nanostructures is less than the first plurality of nanostructures. Thus, in some implementations, the second GAA device has a decreased channel region from that of the first GAA device.

In an embodiment of the device, the second GAA device includes another nanostructure disposed over the second plurality of semiconductor nanostructures and under a portion of the second gate structure. A dielectric inner spacer extends under the portion of the second gate structure. In an embodiment, a first source/drain region of the first GAA device has a first depth and a second source/drain region of the second GAA device has a second depth less than the first depth. In an implementation, the first gate structure has a first height above a top semiconductor nanostructure of the first plurality of semiconductor nanostructures. The second gate structure may have a second height above a top semiconductor nanostructure of the second plurality of semiconductor nanostructures where the second height is greater than the first height.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
epitaxially growing a stack of alternating layers of a first semiconductor layer and a second semiconductor layer on a substrate wherein the stack extends from a first region to a second region, wherein at least two of the first semiconductor layers of the stack of alternating layers extend from a first region of the substrate to the second region of the substrate, and wherein the epitaxially growing provides the at least two of the first semiconductor layers have a constant thickness from the first region to the second region;
patterning the stack of alternating layers to form a first fin structure extending from the substrate in the first region and a second fin structure each extending from the substrate in the second region;
forming a first gate-all-around (GAA) transistor on the first fin structure, wherein the first GAA transistor has a channel region within a first plurality of nanostructures, wherein the first plurality of nanostructures includes the at least two of the first semiconductor layers; and
forming a second GAA transistor on the second fin structure, wherein the second GAA transistor has a second channel region configuration, wherein the second GAA transistor has a channel region within a second plurality of nanostructures, wherein the second plurality of nanostructures includes the at least two of the first semiconductor layers, and wherein the second plurality of nanostructures is less than the first plurality of nanostructures.

2. The method of claim 1, wherein the forming the second GAA transistor includes removing at least one nanostructure disposed on the second fin structure to provide the second plurality of nanostructures, wherein the at least one nanostructure is one of the first semiconductor layers of the stack disposed in the second region.

3. The method of claim 2, wherein the removing the at least one nanostructure is performed before a metal gate structure of the second GAA transistor is formed.

4. The method of claim 2, wherein the removing the at least one nanostructure is performed after a metal gate structure of the second GAA transistor is formed.

5. The method of claim 2, wherein the removing the at least one nanostructure is performed from a backside of the substrate, wherein the stack of alternating layers is epitaxially grown on a frontside of the substrate.

6. The method of claim 1, further comprising:
forming a source/drain feature of the second GAA transistor;
etching back the source/drain feature, wherein the etched back source/drain feature interfaces the second plurality of nanostructures.

7. The method of claim 6, wherein the forming the source/drain feature of the second GAA transistor includes forming the source/drain feature interfacing another nanostructure and wherein the etching back the source/drain feature removes an interface with the another nanostructure.

8. The method of claim 1, further comprising:
forming a dummy gate structure over the second fin structure, wherein the second fin structure comprises a third plurality of nanostructures when the dummy gate structure is formed;
removing the dummy gate structure to form an opening; and
etching at least one nanostructure of the third plurality of nanostructures in the opening, wherein after the etching the at least one nanostructure, the second plurality of nanostructures remains on the second fin structure.

9. The method of claim 1, wherein the epitaxially growing a stack of alternating layers includes
removing a top layer of the first semiconductor layer in the second region;
growing an additional second semiconductor layer on the second region;
after growing the additional second semiconductor layer, patterning the stack of alternating layers.

10. A method comprising:
forming a stack of alternating layers having a first composition and layers having a second composition over a substrate;
forming a first fin of the stack and a second fin of the stack;
providing a dummy gate structure over the second fin and a dummy gate structure over the first fin;
etching a first recess in the first fin adjacent the dummy gate structure, wherein the first recess extends through the stack and into the substrate;
etching a second recess in the second fin adjacent the dummy gate structure, wherein the second recess has a bottom surface within the stack of alternating layers, thereby forming the first recess of a greater depth than the second recess;
forming a first epitaxial feature in the first recess, wherein the first epitaxial feature interfaces each layer of the stack of alternating layers; and
forming a second epitaxial feature in the second recess, wherein the second epitaxial feature interfaces a portion of the stack of alternating layers, wherein at least one layer of the stack of stack of alternating layers lacks an interface with the second epitaxial feature.

11. The method of claim 10, concurrently growing an epitaxial material in the first recess and an epitaxial material in the second recess.

12. The method of claim 10, wherein the bottom surface of the second recess is the first composition.

13. The method of claim 10, wherein the forming the second epitaxial feature in the second recess includes growing a lower region of undoped epitaxial material on the bottom surface.

14. The method of claim 13, wherein the forming the second epitaxial feature in the second recess includes growing an upper region on the lower region, wherein the upper region is a doped epitaxial material.

15. The method of claim 10, wherein the forming the first epitaxial feature in the first recess includes growing a lower region of undoped material on a surface of the substrate.

16. The method of claim 10, wherein the etching the second recess provides the bottom surface within the stack of alternating layers, at least one layer of the stack of alternating layers being disposed below the bottom surface.

17. A method of fabricating a semiconductor device comprising:
forming a stack of alternating layers having a first composition and a second composition over a semiconductor substrate;
removing an uppermost layer of the first composition from the stack of alternating layers in a second region of the semiconductor substrate while maintaining the uppermost layer of the first composition on the stack of alternating layers in a first region of the semiconductor substrate;
after removing the uppermost layer, growing an epitaxial layer of the second composition over the stack in the second region;
after growing the epitaxial layer, etching the stack of alternating layers to form a first fin structure in the first region and a second fin structure in the second region;
forming a first gate all-around (GAA) device over the first region of the semiconductor substrate, wherein the forming the first GAA device includes:
releasing a first plurality of semiconductor nanostructures, wherein an uppermost semiconductor nanostructure of the first plurality of semiconductor nanostructures is formed from the uppermost layer of the first composition of the stack of alternating layers; and
forming a first gate structure around the released first plurality of semiconductor nanostructures; and
forming a second GAA device, wherein the forming the second GAA device includes:
releasing a second plurality of semiconductor nanostructures; and
forming a second gate structure around the released second plurality of semiconductor nanostructures, wherein the second plurality of semiconductor nanostructures is less than the first plurality of semiconductor nanostructures.

18. The method of claim 17, wherein the releasing the first plurality of semiconductor nanostructures and releasing the second plurality of semiconductor nanostructures includes removing the layers of the second composition.

19. The method of claim 17, wherein the growing the epitaxial layer of the second composition over the stack in the second region also grows the epitaxial layer of the second composition over the stack in the first region.

20. The method of claim 19, further comprising:
removing the grown epitaxial layer of the second composition from the stack in the first region to expose a top surface of the uppermost layer of the first composition.

* * * * *